United States Patent
Hsieh et al.

(10) Patent No.: US 11,705,472 B2
(45) Date of Patent: Jul. 18, 2023

(54) BIOSENSOR AND METHOD OF DISTINGUISHING A LIGHT

(71) Applicant: VisEra Technologies Company Limited, Hsin-Chu (TW)

(72) Inventors: Hsin-Yi Hsieh, Taoyuan (TW); Chin-Chuan Hsieh, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 811 days.

(21) Appl. No.: 16/598,576

(22) Filed: Oct. 10, 2019

(65) Prior Publication Data

US 2021/0111216 A1  Apr. 15, 2021

(51) Int. Cl.
*H01L 27/146* (2006.01)
*G01N 21/62* (2006.01)
*G01N 21/64* (2006.01)

(52) U.S. Cl.
CPC ....... *H01L 27/14645* (2013.01); *G01N 21/62* (2013.01); *G01N 21/6454* (2013.01); *G01N 21/6486* (2013.01); *H01L 27/14621* (2013.01); *H01L 27/14629* (2013.01)

(58) Field of Classification Search
CPC ......... H01L 27/14645; H01L 27/14621; H01L 27/14629; G01N 21/62; G01N 21/6454; G01N 21/6486; G01N 21/76; G01N 21/01; G01N 21/6402
See application file for complete search history.

(56) References Cited

U.S. PATENT DOCUMENTS

| | | | |
|---|---|---|---|
| 5,157,262 A | 10/1992 | Marsoner et al. | |
| 5,606,633 A | 2/1997 | Groger et al. | |
| 8,026,559 B2 * | 9/2011 | Chen | G01N 21/6454 257/443 |
| 8,637,436 B2 | 1/2014 | Hassibi | |
| 2004/0234417 A1 * | 11/2004 | Schienle | G01N 33/54373 422/82.08 |
| 2009/0111207 A1 | 4/2009 | Choumane et al. | |

(Continued)

FOREIGN PATENT DOCUMENTS

| | | |
|---|---|---|
| CN | 107533005 A | 1/2018 |
| EP | 3460456 A1 | 3/2019 |

(Continued)

OTHER PUBLICATIONS

Nelson et al., "Handheld Fluorometera for Lab-on-a-Chip Applications," IEEE Transactions on Biomedical Circuits and Systems, vol. 3, No. 2, Apr. 2009.

(Continued)

*Primary Examiner* — Richard A Hansell, Jr.
(74) *Attorney, Agent, or Firm* — Muncy, Geissler, Olds & Lowe, P.C.

(57) ABSTRACT

A biosensor is provided. The biosensor includes a substrate, a first photodiode, a second photodiode, an angle-sensitive filter, and an immobilization layer. The first photodiode and the second photodiode are disposed in the substrate and define a first pixel and a second pixel, respectively. The first pixel and the second pixel receive a light. The angle-sensitive filter is disposed on the substrate. The immobilization layer is disposed on the angle-sensitive filter.

18 Claims, 53 Drawing Sheets

(56) References Cited

U.S. PATENT DOCUMENTS

| | | | |
|---|---|---|---|
| 2010/0055666 A1 | 3/2010 | Wimberger-Friedl et al. | |
| 2010/0108865 A1 | 5/2010 | Cho et al. | |
| 2010/0122904 A1 | 5/2010 | Hassibi et al. | |
| 2011/0032398 A1* | 2/2011 | Lenchenkov | H01L 27/14621 |
| | | | 257/E31.127 |
| 2011/0118128 A1* | 5/2011 | Garcia Tello | G01N 33/54373 |
| | | | 506/13 |
| 2014/0295577 A1 | 10/2014 | Matsuzawa et al. | |
| 2015/0141268 A1 | 5/2015 | Rothberg et al. | |
| 2016/0299073 A1 | 10/2016 | Tu et al. | |
| 2016/0341656 A1* | 11/2016 | Liu | B01L 3/50 |
| 2016/0356715 A1* | 12/2016 | Zhong | B01L 3/502707 |
| 2017/0023476 A1 | 1/2017 | Altug et al. | |
| 2018/0155782 A1 | 6/2018 | Zhong | |
| 2018/0335554 A1* | 11/2018 | Ockenfuss | G02B 5/26 |
| 2019/0003971 A1* | 1/2019 | Cao | G01N 33/54373 |
| 2019/0025511 A1 | 1/2019 | Rothberg et al. | |
| 2019/0377109 A1* | 12/2019 | Frey | H01L 27/14621 |
| 2020/0096450 A1 | 3/2020 | Zhong et al. | |
| 2021/0066375 A1* | 3/2021 | Kim | G02B 3/0006 |

FOREIGN PATENT DOCUMENTS

| | | |
|---|---|---|
| JP | 2002-202303 A | 7/2002 |
| JP | 2002-350347 A | 12/2002 |
| JP | 2004361256 A | 12/2004 |
| JP | 2005504293 A | 2/2005 |
| JP | 2006-030162 A | 2/2006 |
| JP | 2008-003061 A | 1/2008 |
| JP | 2009204486 A | 9/2009 |
| JP | 2009-222583 A | 10/2009 |
| JP | 2010-186818 A | 8/2010 |
| JP | 2010-284152 A | 12/2010 |
| JP | 2013-088378 A | 5/2013 |
| JP | 2013-092393 A | 5/2013 |
| JP | 2013-175494 A | 9/2013 |
| JP | 2015-162679 A | 9/2015 |
| JP | 2016-537998 A | 12/2016 |
| JP | 2017502310 A | 1/2017 |
| JP | 2017-183388 A | 10/2017 |
| JP | 2018-517127 A | 6/2018 |
| WO | WO-03027676 A1 | 4/2003 |
| WO | WO2013/080473 A1 | 6/2013 |
| WO | WO-2018/175341 A1 | 9/2018 |

OTHER PUBLICATIONS

European Search Report dated May 6, 2020 in EP Application No. 19210706.8.

Office Action dated Dec. 15, 2020 in JP Application No. 2020-032993 (8 pages).

Office Action issued in corresponding JP application No. 2020-040760 dated Dec. 15, 2020.

Office Action issued in corresponding TW application No. 109113770 dated Jan. 6, 2021.

Search Report issued in corresponding EP application No. 19210713.4 dated Jun. 19, 2020.

* cited by examiner

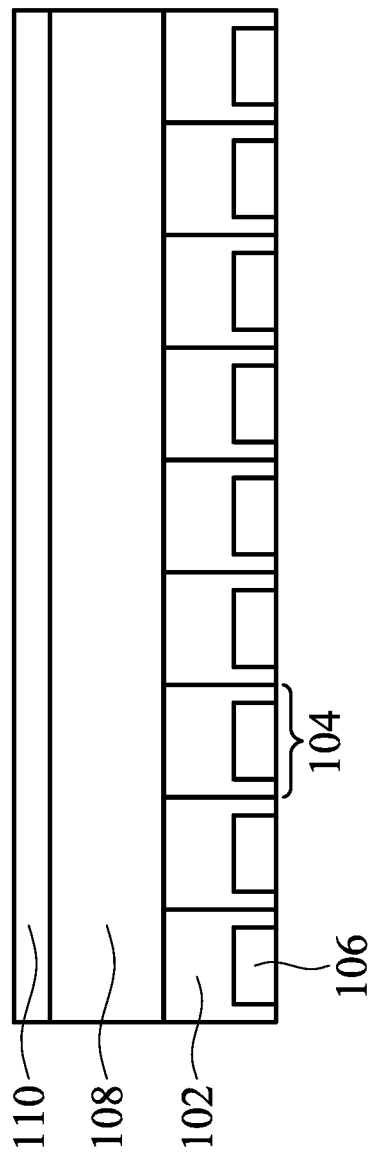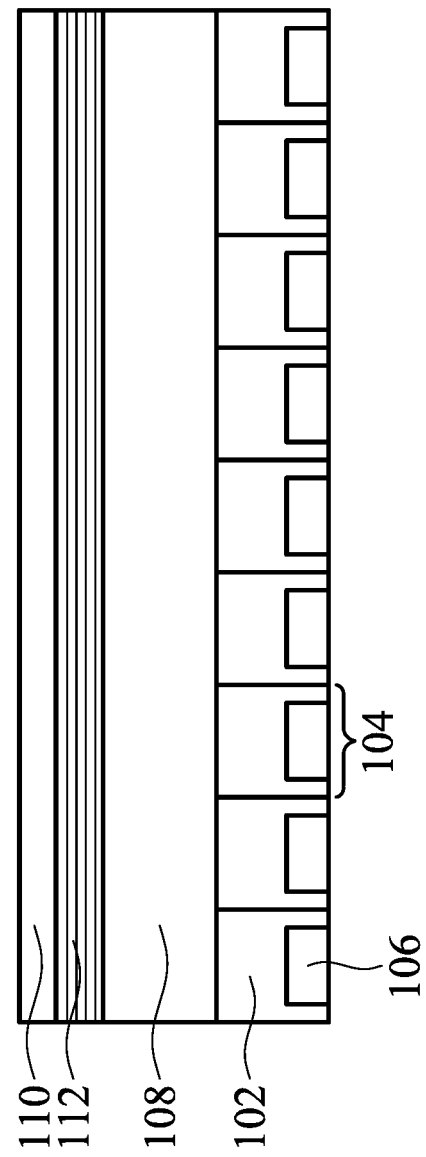

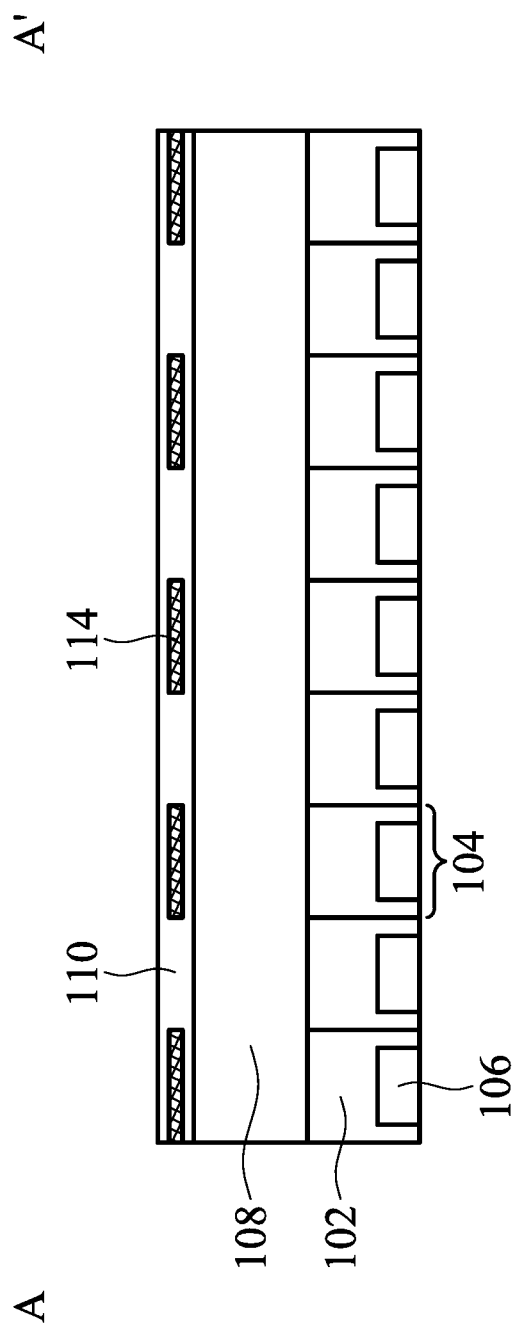

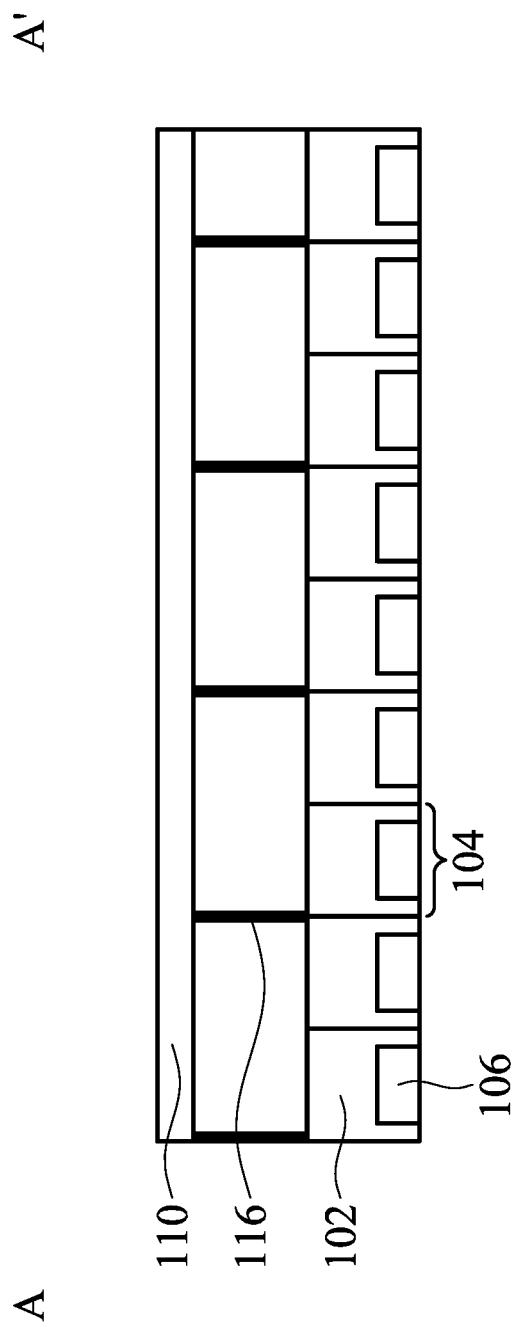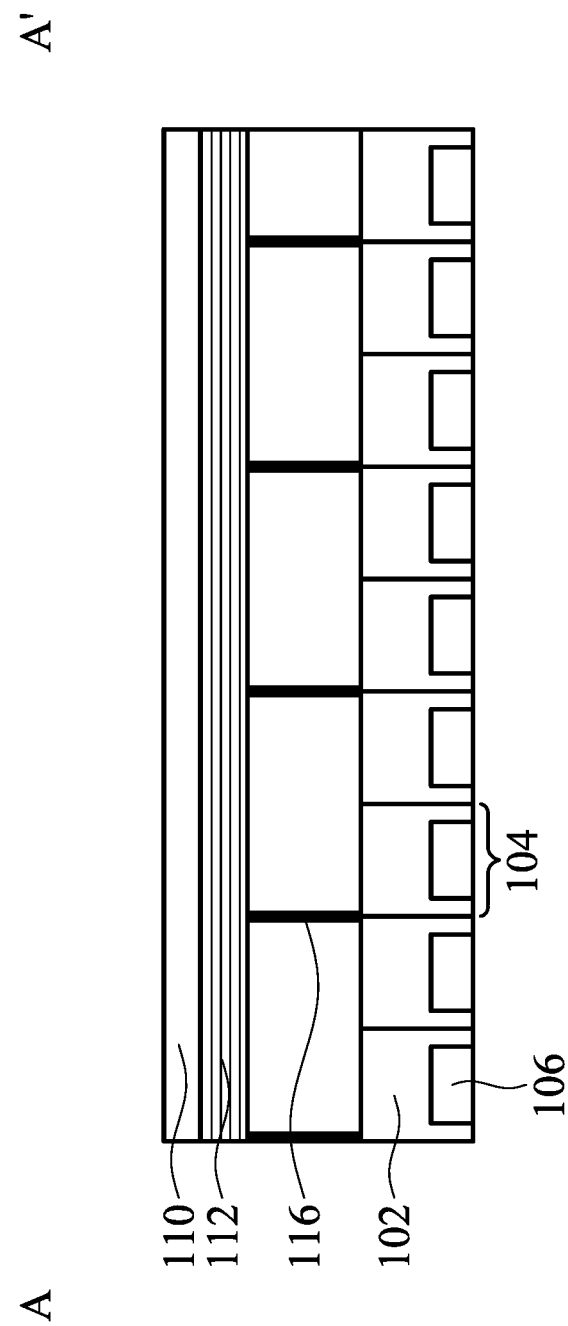

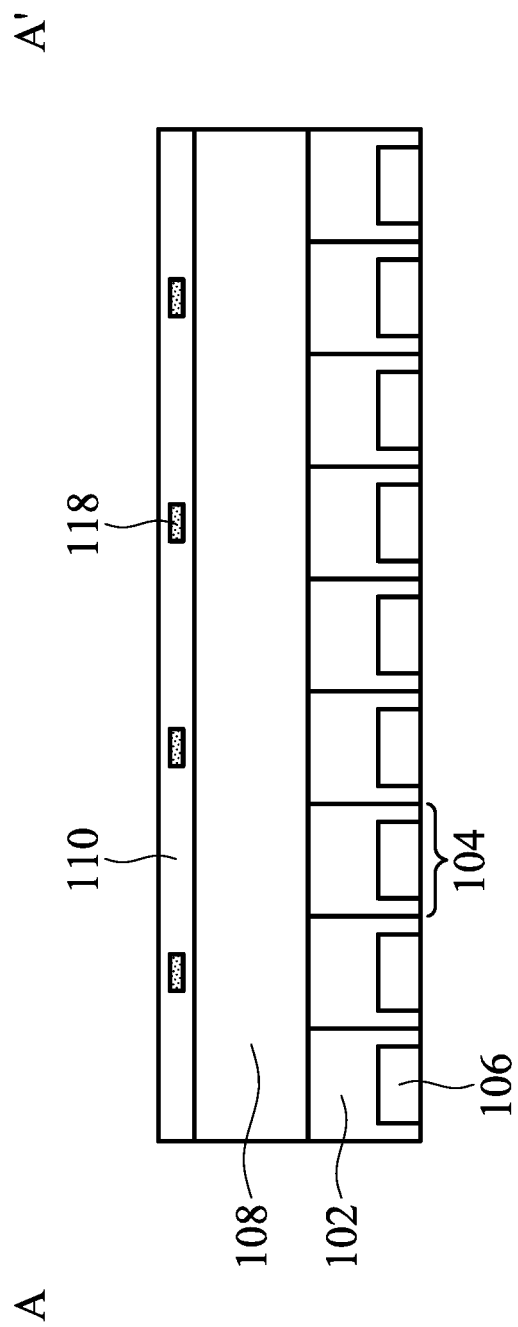
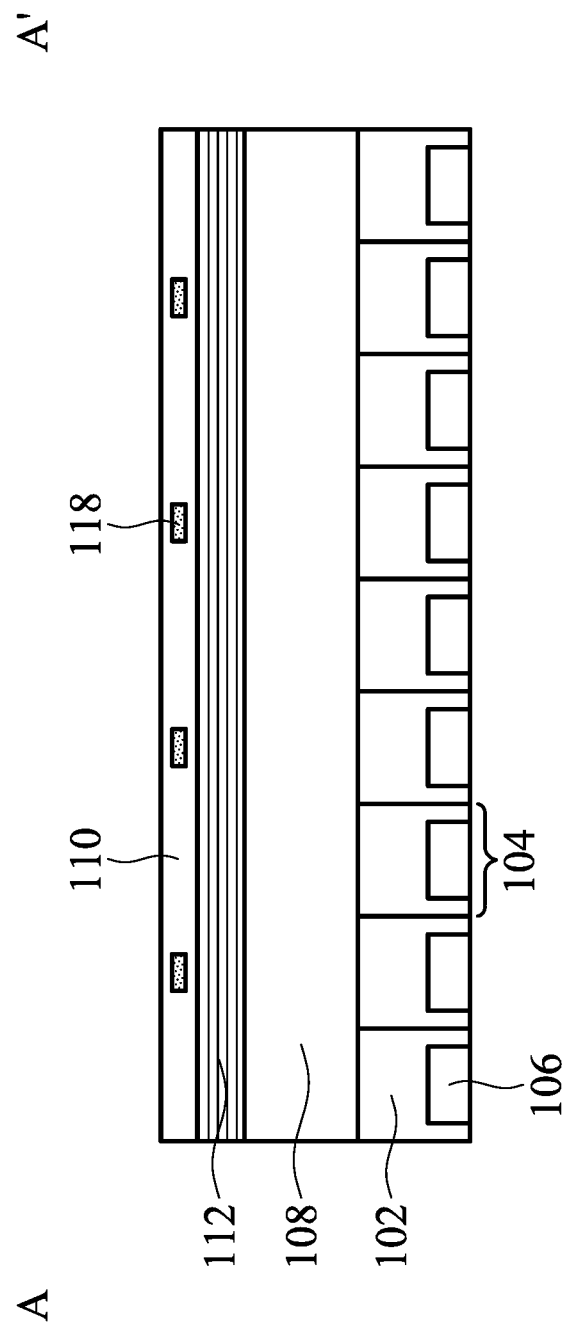

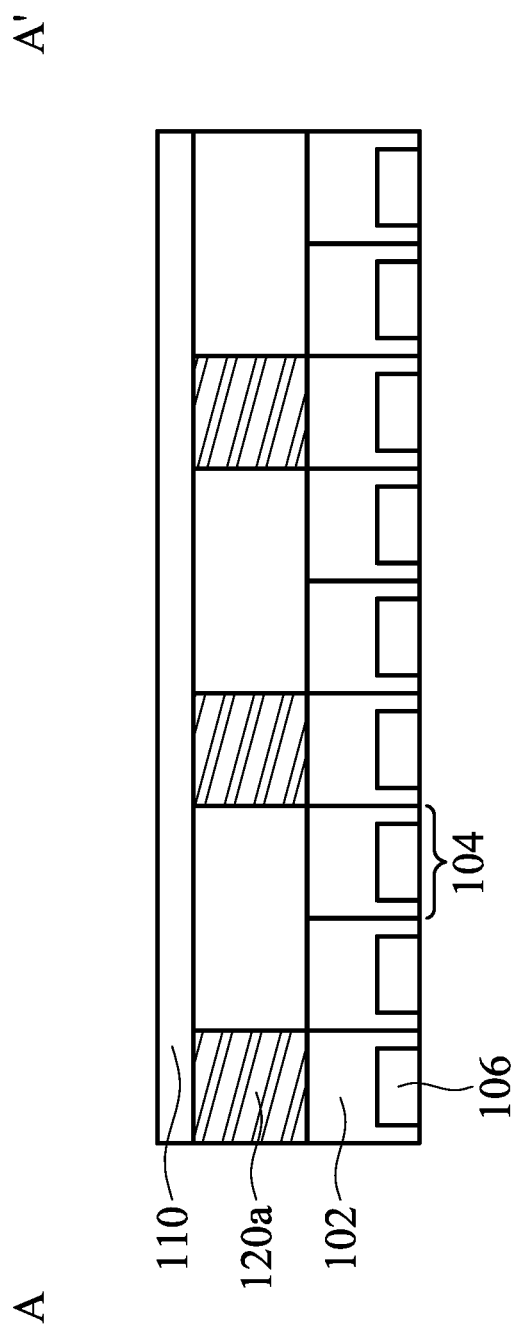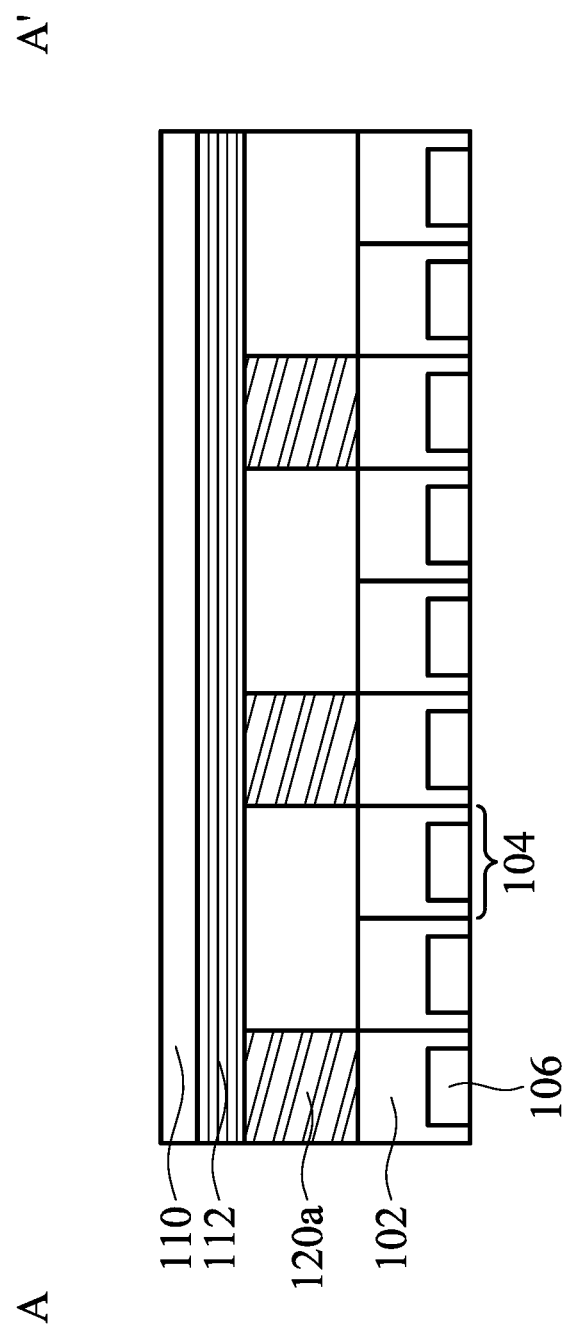

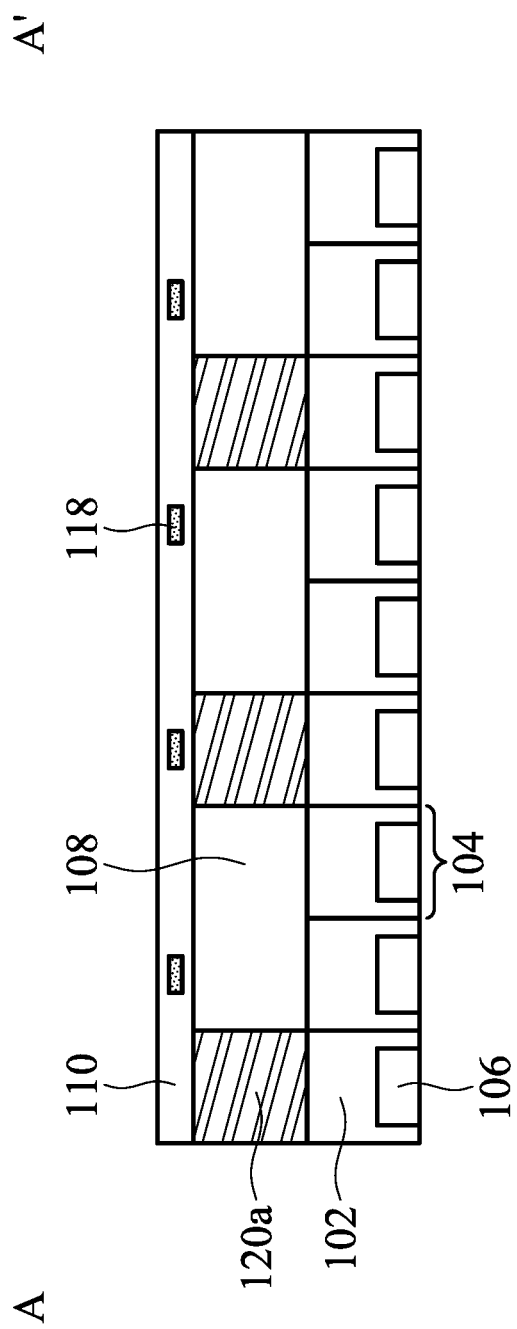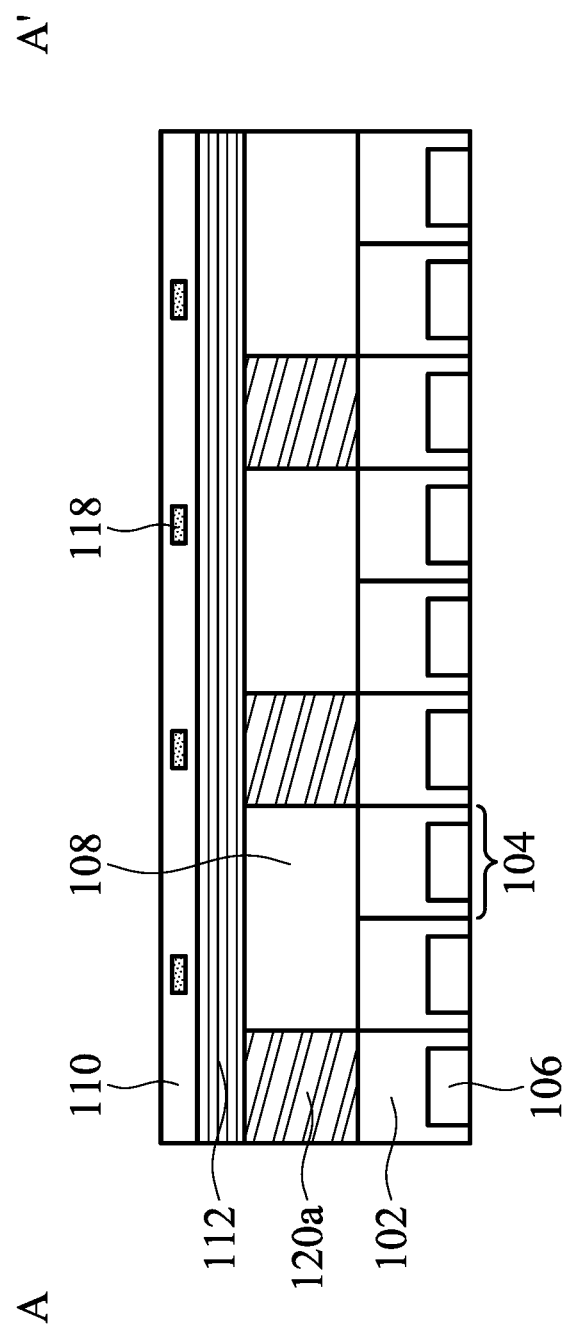

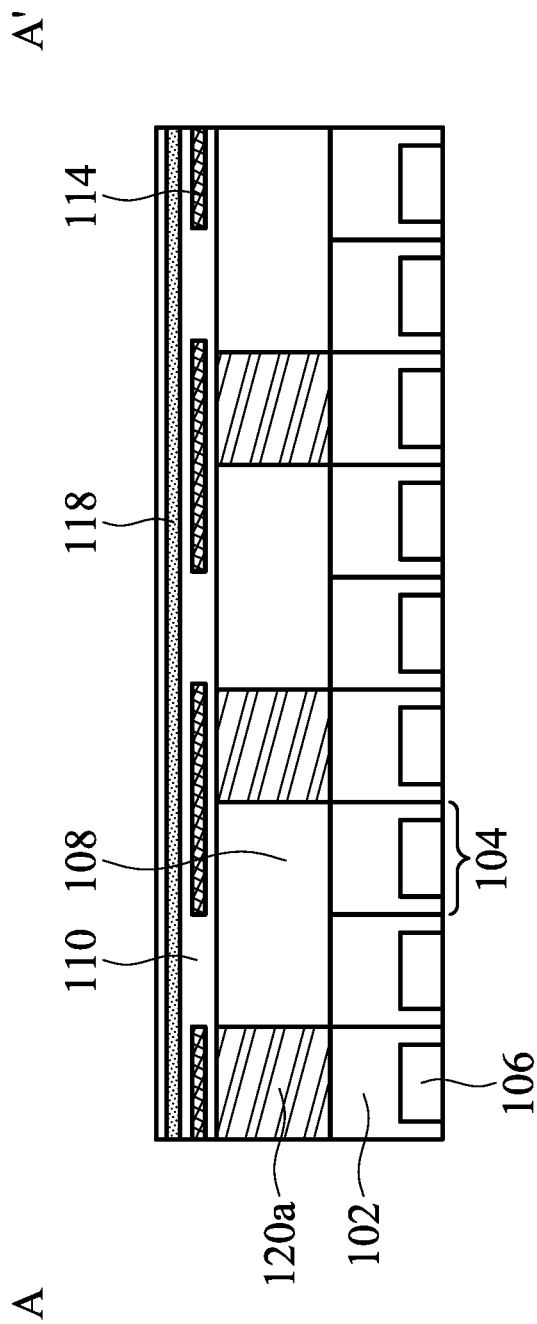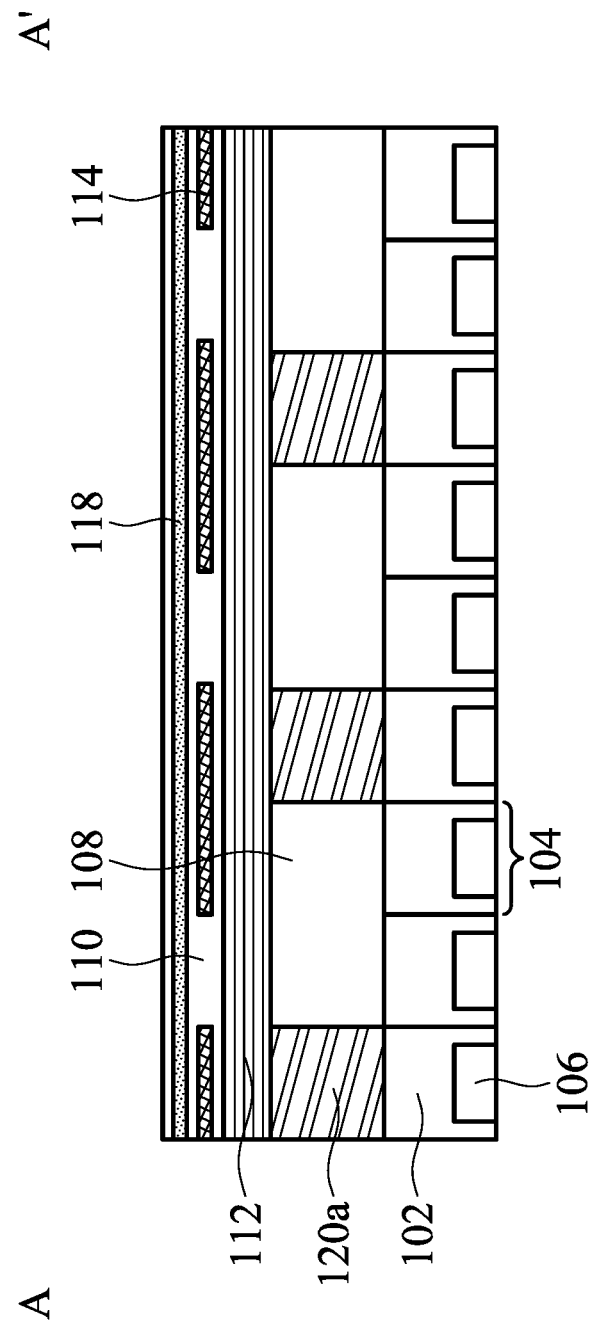

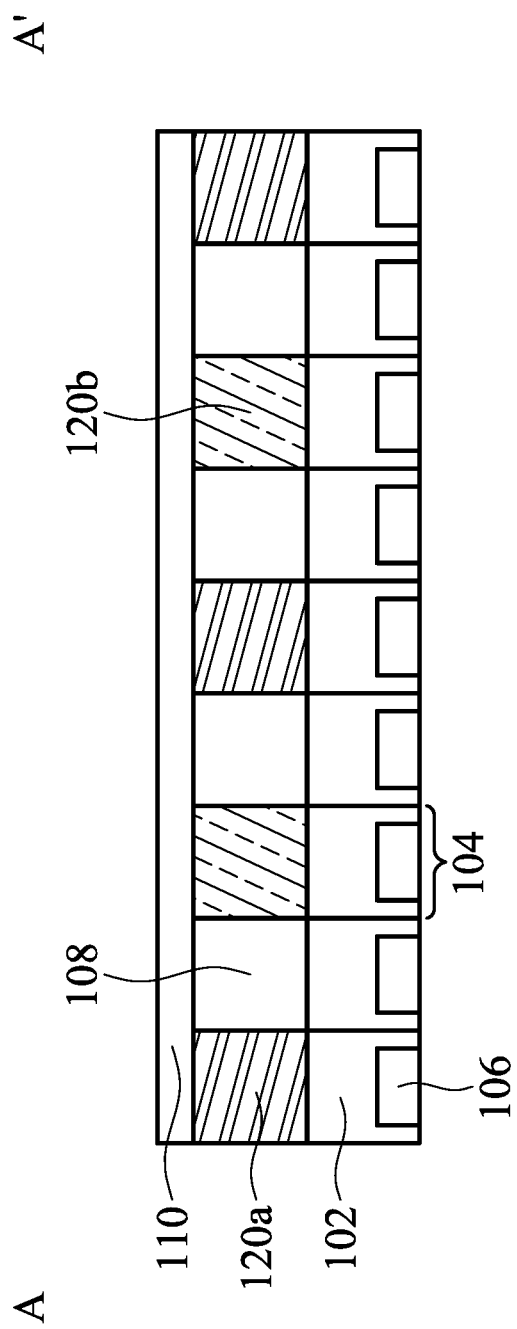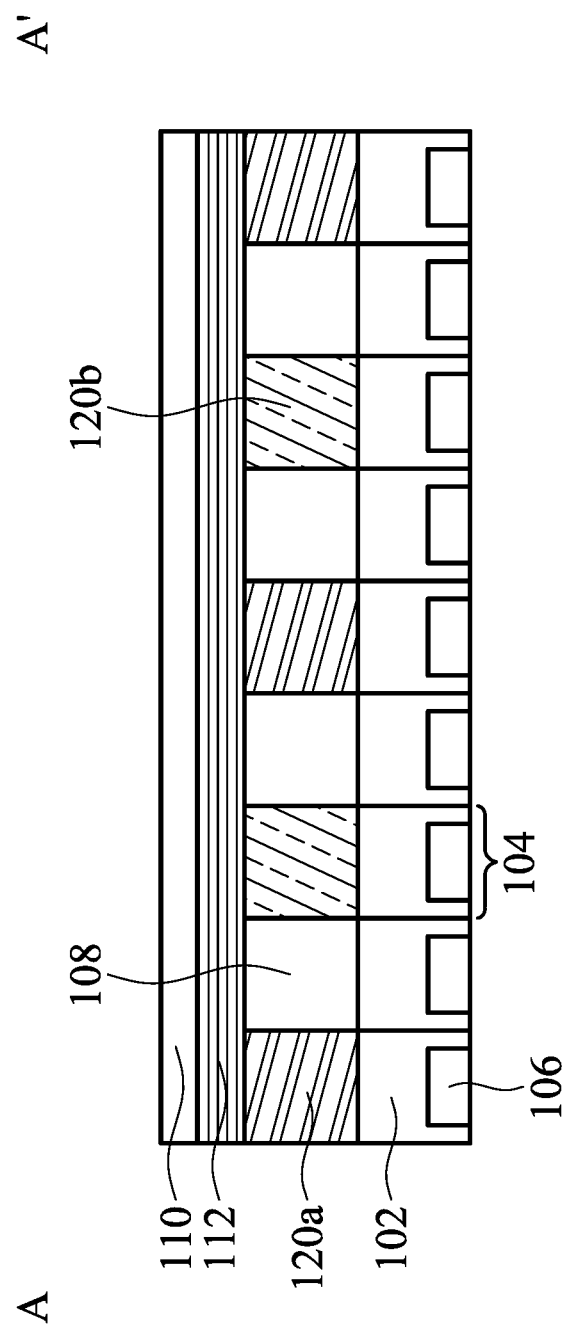

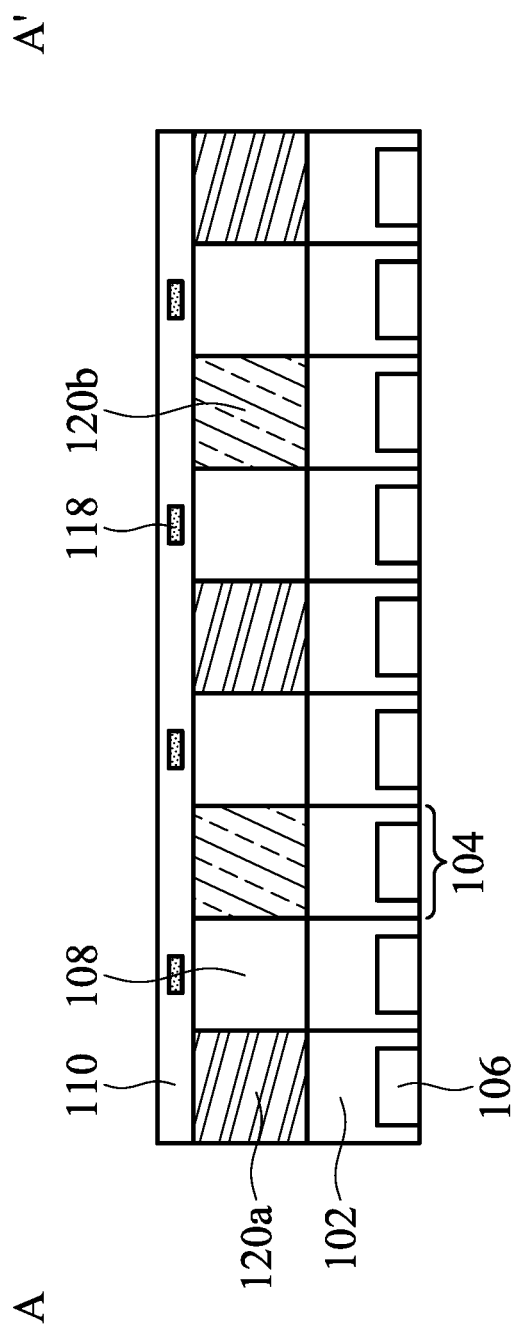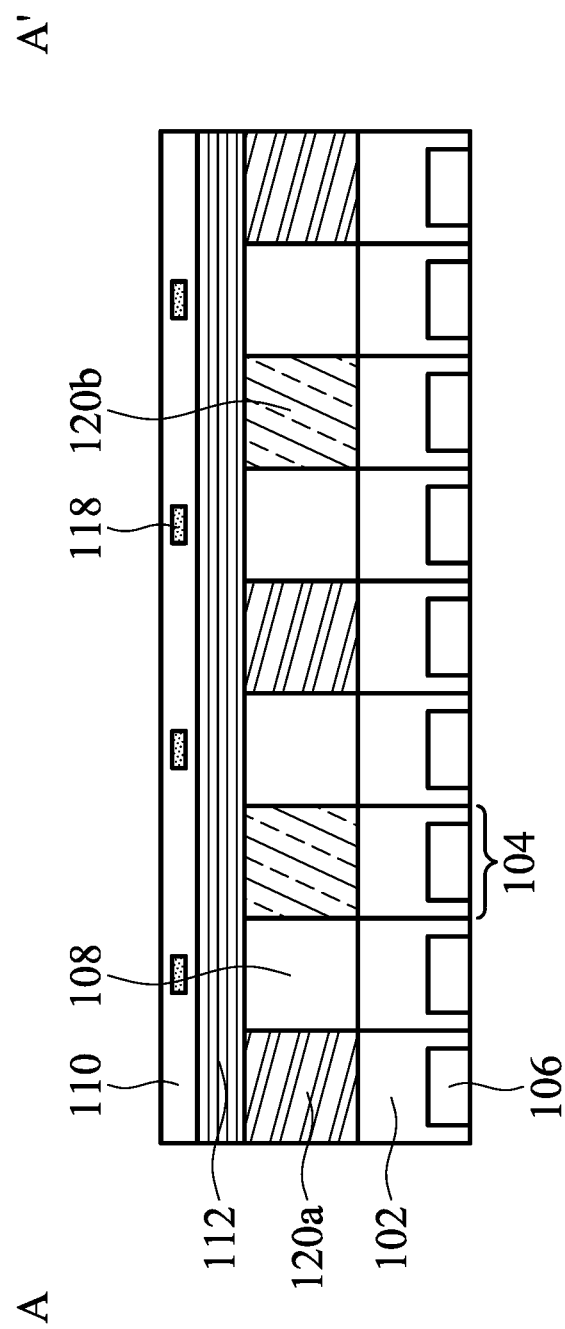

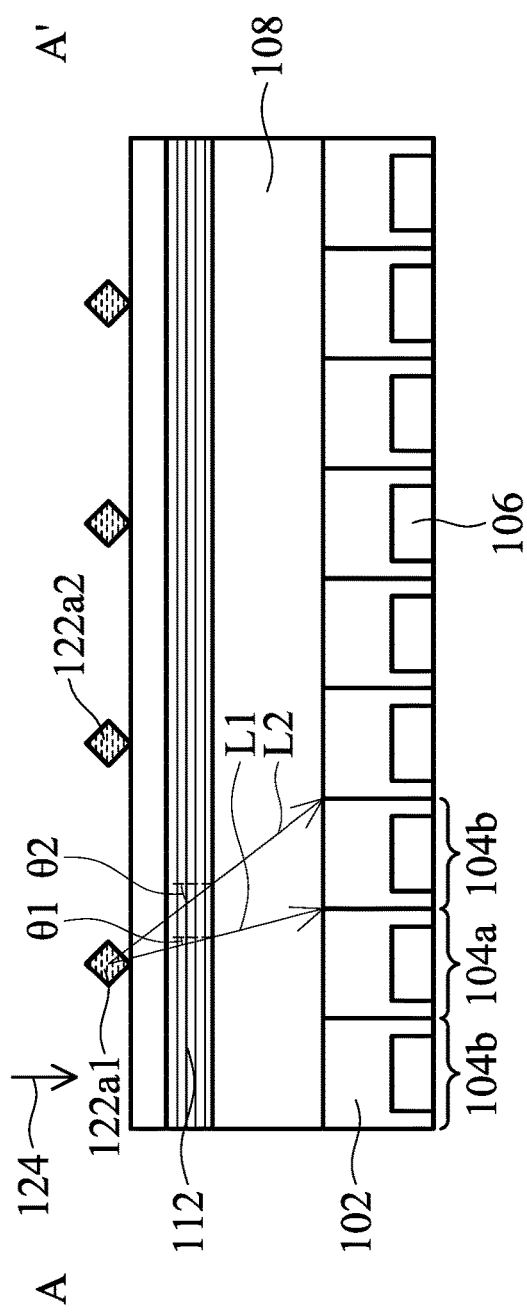

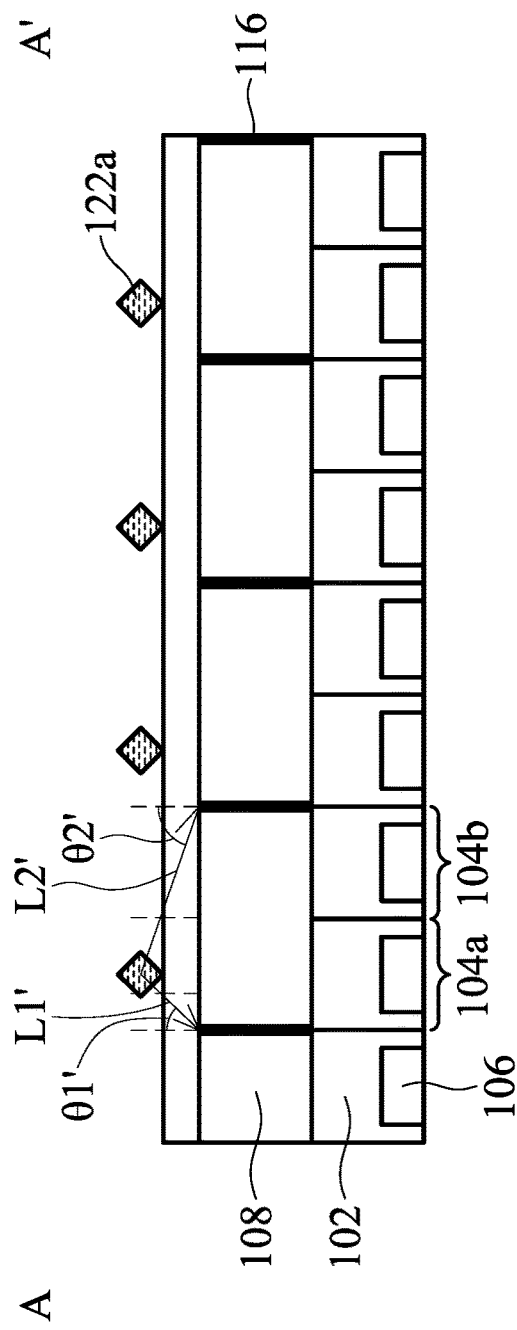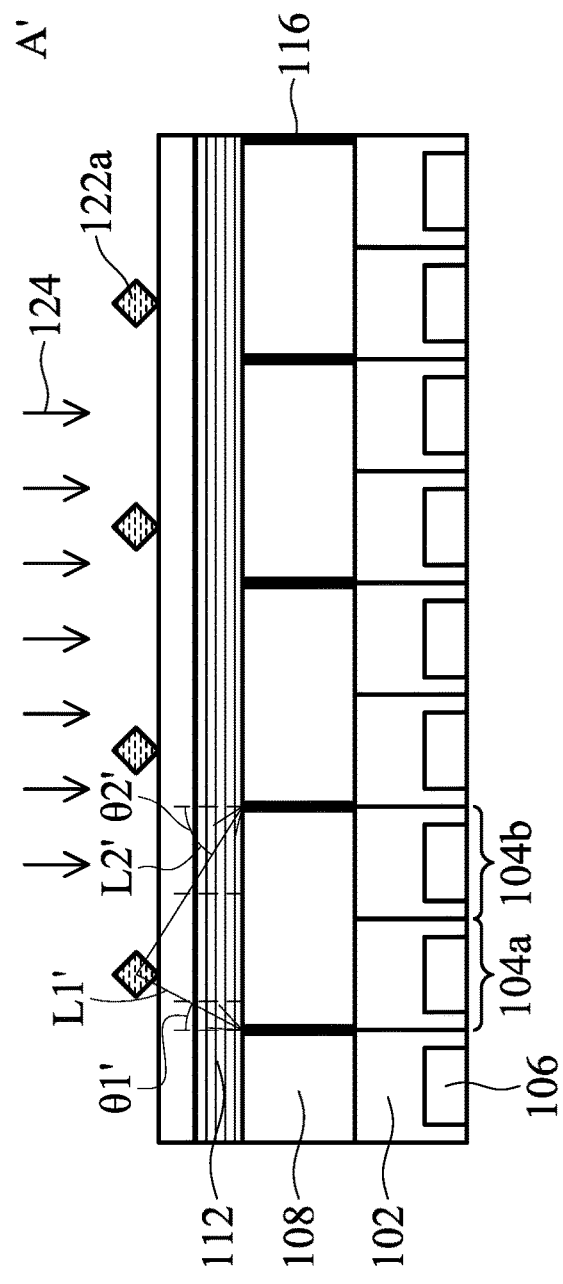

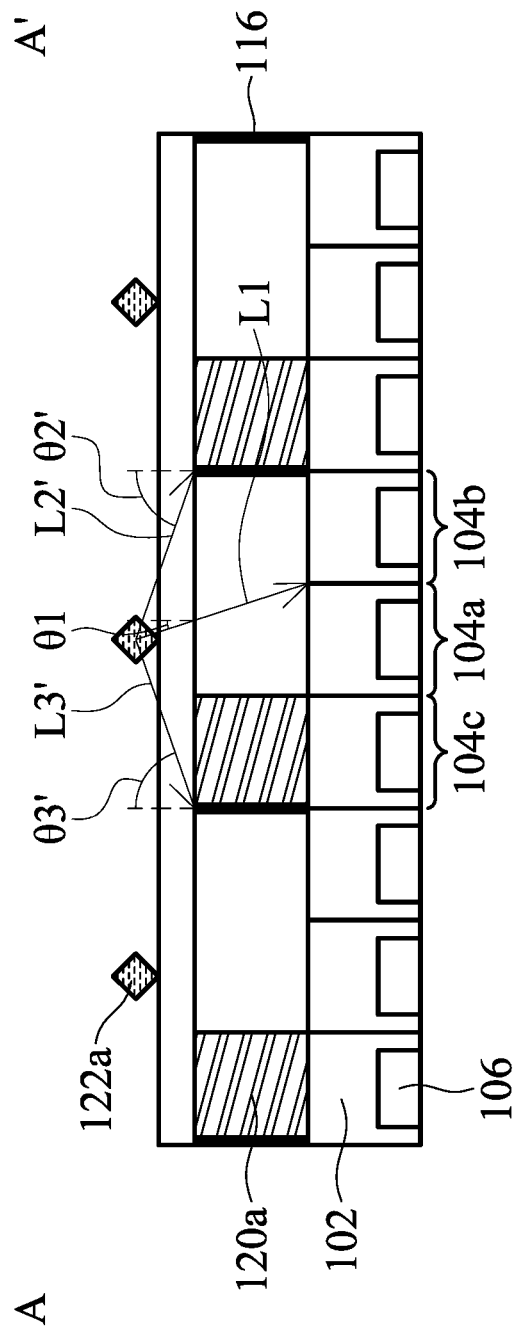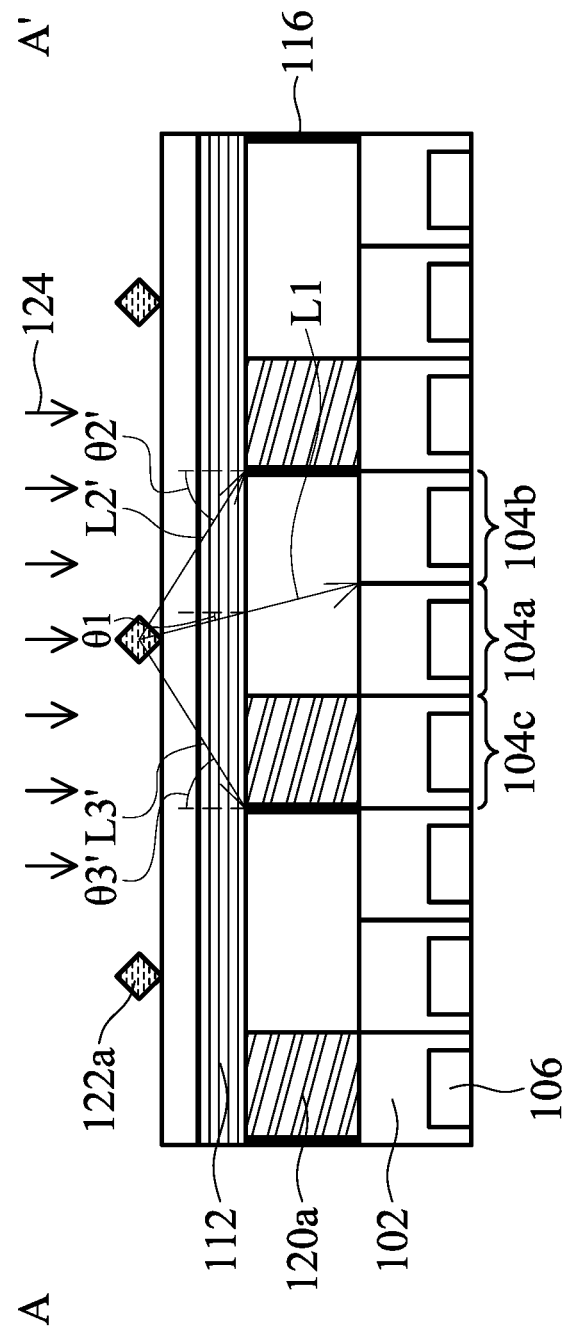

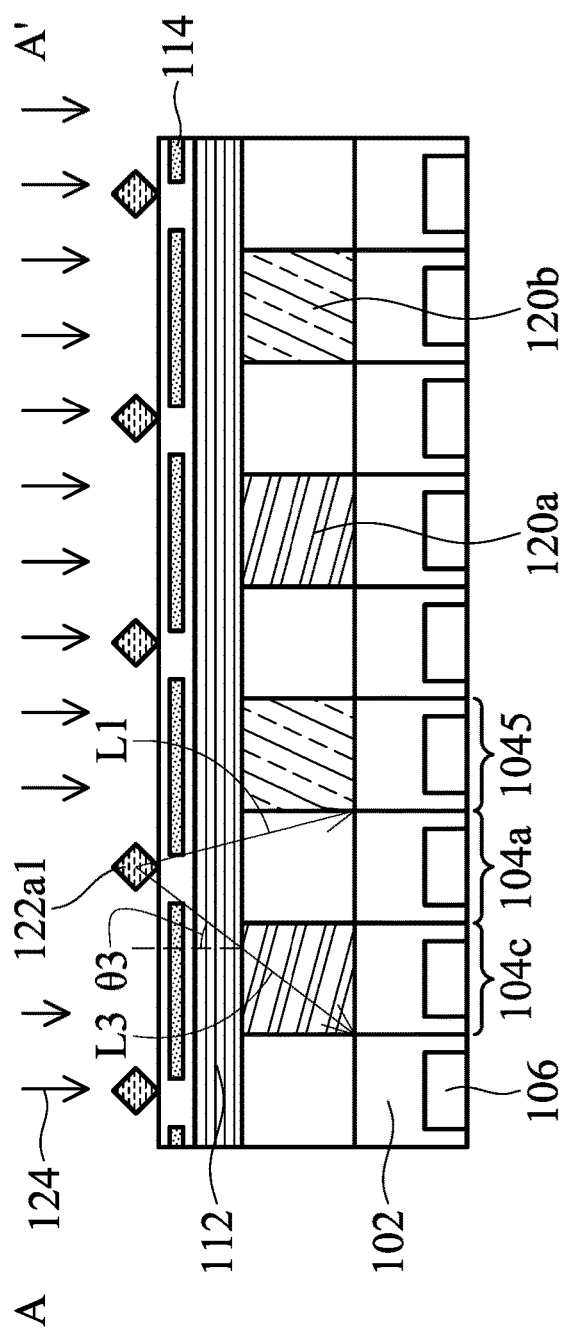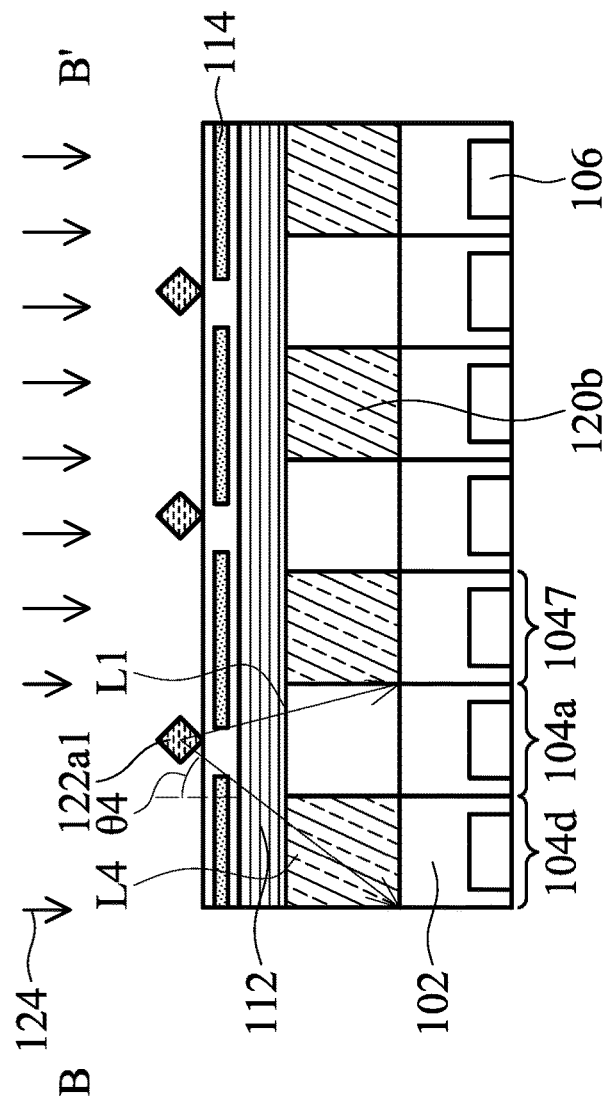

BIOSENSOR AND METHOD OF DISTINGUISHING A LIGHT

CROSS REFERENCE TO RELATED APPLICATIONS

This application is related to the following co-pending commonly assigned patent application: U.S. Ser. No. 16/598,627, filed on Oct. 10, 2019 and entitled "BIOSENSOR AND METHOD OF FORMING THE SAME", the entirety of which is incorporated by reference herein.

BACKGROUND OF THE INVENTION

Field of the Invention

The present disclosure relates to a biosensor, and in particular it relates to a biosensor that uses spectrum-shifted layer for light detection.

Description of the Related Art

Recently, CMOS image sensors also have been used for biological or biochemical detection. For such an application, a biological or biochemical sample may be placed on a photodiode, and light emitted by the biological or biochemical sample may be directed to the photodiode. The color and intensity of fluorescence or chemiluminescence of the sample may be detected and distinguished by the photodiode. The color and intensity may be used to identify the interaction or properties of the biological or biochemical sample.

General methods to identify the color and intensity of light are stacking an organic color filter and/or dielectric interference filter on the photodiodes for color isolation. Although the organic color filter is not angle-sensitive, few colors are applicable and design flexibility in the transmittance spectrum is low. Therefore, dielectric interference filter and other angle-sensitive filters are getting popular to achieve the need for various color identification application.

When light irradiates an angle-sensitive filter at an angle of more than 0 degrees, the transmittance spectrum of the filter wavelength will shift. This phenomenon is called a spectrum shift. Then, the light received by a detector with a large incident angle under the angle-sensitive filter is not the same as the detector with a small incident angle. Therefore, the property of spectrum shift is considered a drawback in such fields as CMOS image sensors and the applications for cell behavior observation, DNA sequencing, quantitative polymerase chain reaction and DNA/protein microarray.

Although existing image sensors with optics integration have been adequate for their intended purposes, they have not been satisfactory in every respect. For example, a lot of effort has been made to reduce the spectrum shift phenomenon by including light angle directing components on the angle-sensitive filter, which results in a complicated and expensive fabrication process. Therefore, a novel biosensor is still needed.

BRIEF SUMMARY OF THE INVENTION

The biosensors provided by the embodiments of the present disclosure utilize the property of spectrum shift caused by the angle-sensitive filter, which is considered a drawback in the prior art, to distinguish between different lights. Therefore, the embodiments of the present disclosure successfully deal with the property of spectrum shift in a novel way.

In some embodiments, a biosensor is provided. The biosensor includes a substrate, a first photodiode and a second photodiode, an angle-sensitive filter, and an immobilization layer. The first photodiode and the second photodiode are disposed in the substrate and defining a first pixel and a second pixel, respectively, wherein the first pixel and the second pixel receive a light. The angle-sensitive filter is disposed on the substrate. The immobilization layer is disposed on the angle-sensitive filter.

In some embodiments, a method of distinguishing a light is provided. The method includes: placing an analyte on the aforementioned biosensor; making the analyte emit the light; obtaining a first signal intensity of the first portion of the light and a second signal intensity of the second portion of the light; and distinguishing the light according to the first signal intensity and the second signal intensity.

In some embodiments, a method of distinguishing a light is provided. The method includes: placing an analyte on the aforementioned biosensor, wherein the biosensor further includes a first color filter disposed adjacent to the angle-sensitive filter and corresponding to one of the pixels and the first color filter is irradiated by a third portion of the light; making the analyte emit the light; obtaining a first signal intensity of the first portion of the light, a second signal intensity of the second portion of the light and a third signal intensity of the third portion of the light; and distinguishing the light according to the first signal intensity, the second signal intensity and the third signal intensity.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein:

FIGS. 2A-2J illustrate cross-sectional views of the biosensor of FIG. 1 in accordance with some embodiments of the present disclosure;

FIGS. 4A-4J illustrate cross-sectional views of the biosensor of FIG. 3 in accordance with some embodiments of the present disclosure;

FIGS. 6A-6J illustrate cross-sectional views of the biosensor of FIG. 5 in accordance with some embodiments of the present disclosure;

FIG. 7B illustrate a cross-sectional view of the biosensor of FIG. 7A in accordance with some embodiments of the present disclosure;

FIG. 7C illustrates a cross-sectional view of the biosensor of FIG. 7A in accordance with other embodiments of the present disclosure;

FIGS. 7K-7L illustrate cross-sectional views of the biosensor of FIG. 7J in accordance with some embodiments of the present disclosure;

FIGS. 9G-9H illustrate cross-sectional views of the biosensor of FIG. 9F in accordance with some embodiments of the present disclosure;

FIGS. 11I-11K illustrate cross-sectional views of the biosensor of FIG. 11E in accordance with other embodiments of the present disclosure;

DETAILED DESCRIPTION OF THE INVENTION

Figure 1:
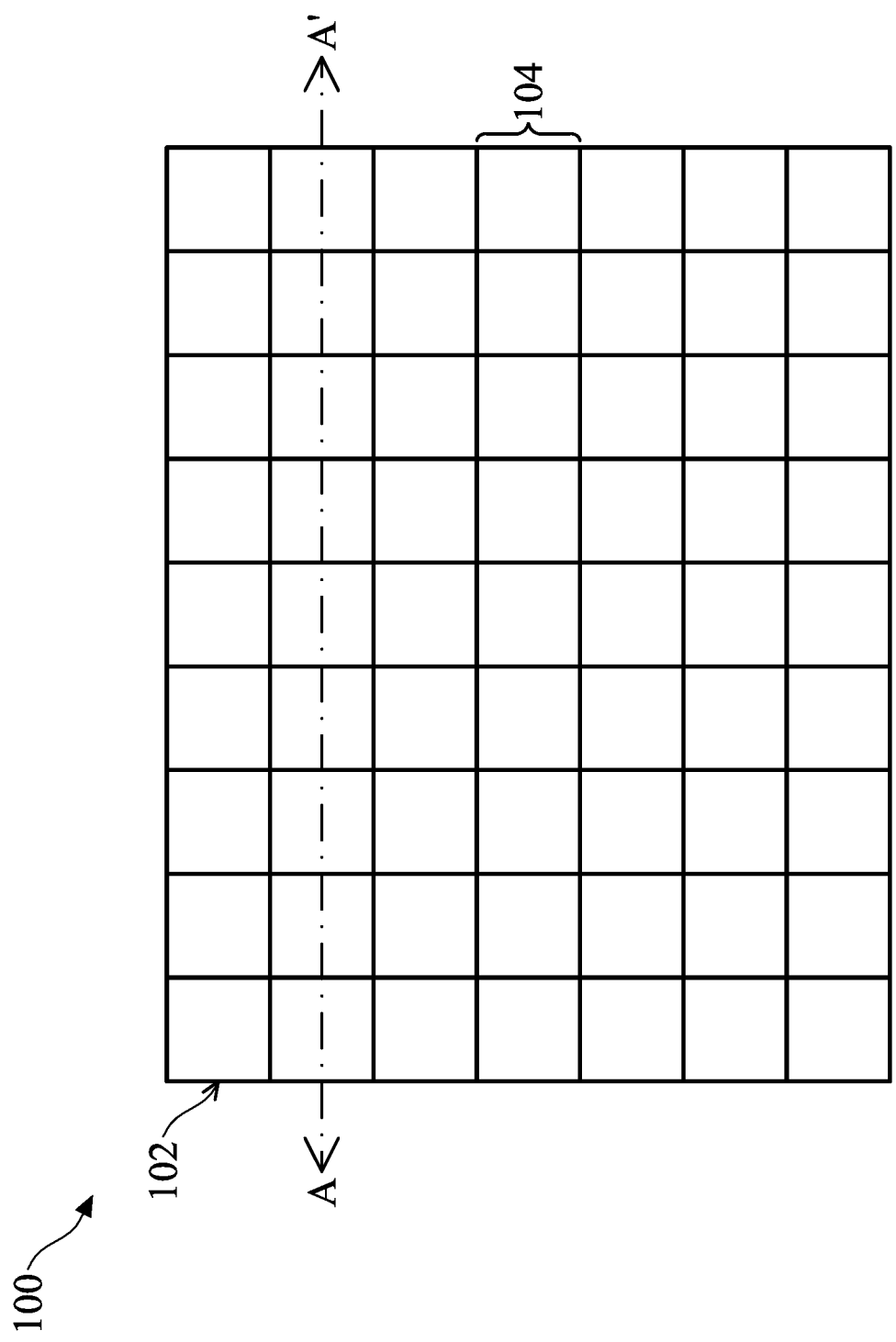
FIG. 1 illustrates a top view of a biosensor in accordance with some embodiments of the present disclosure.

The biosensor of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed as referring to the orientation as described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

The biosensors provided by the embodiments of the present disclosure utilize the property of spectrum shift caused by the angle-sensitive filter, which is considered a drawback in prior art, to distinguish different lights. Therefore, the embodiments of the present disclosure successfully deal with the property of spectrum shift in a novel way.

This description of the exemplary embodiments is intended to be read in connection with the accompanying drawings, which are to be considered part of the entire written description. The drawings are not drawn to scale. In addition, structures and devices are shown schematically in order to simplify the drawings.

FIG. 1 illustrates a top view of a biosensor 100 in accordance with some embodiments of the present disclosure, and FIGS. 2A-2J illustrate cross-sectional views of the biosensor 100 of FIG. 1 along line A-A' in accordance with some embodiments of the present disclosure. Referring to FIG. 1, the biosensor 100 includes a substrate 102 and pixels 104.

In some embodiments of the present disclosure, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable material, or a combination thereof.

In some embodiments, the substrate 102 includes a semiconductor-on-insulator (SOI) substrate. The SOI substrate may be fabricated using a separation by implantation of oxygen (SIMOX) process, a wafer bonding process, another applicable method, or a combination thereof. In some embodiments, the substrate 102 is an un-doped substrate.

As illustrated in FIG. 2A, the biosensor 100 includes photodiodes 106, an angle-sensitive filter 108 and an immobilization layer 110. The photodiodes 106 are disposed in the substrate 102, and the photodiodes 106 define pixels 104. The pixels 104 receive a light. The angle-sensitive filter 108 is disposed on the substrate 102. The immobilization layer 110 is disposed on the angle-sensitive filter 108. The angle-sensitive filter 108 can be a shortpass filter, a bandpass filter, a longpass filter or a multiple bandpass filter. The angle-sensitive filter 108 can be a dielectric interference filter with alternating deposition of dielectric materials with high and low refractive indices. If the refractive index is greater than about 1.7 at visible light wavelength, the refractive index is considered a high refractive index. The dielectric materials with a high refractive index may include $Nb_2O_5$, $Ta_2O_5$, $TiO_2$, $Si_3N_4$, $Al_2O_3$, SiH, or a combination thereof. If the refractive index is smaller than about 1.7 at visible light wavelength, the refractive index is considered a low refractive index. The dielectric materials with a low refractive index may include $SiO_2$ $Al_2O_3$, organic polymer, air or a combination thereof. Alternatively, the angle-sensitive filter 108 can be a plasmonic filter or a dielectric metasurface structure.

Referring to FIG. 2B, in some embodiments, the biosensor 100 may include an excitation light rejection filter 112 disposed on the angle-sensitive filter 108. To be specific, the excitation light rejection filter 112 is disposed between the angle-sensitive filter 108 and the immobilization layer 110. The excitation light rejection filter 112 is an interference filter embedded with metal layers and abbreviated as metal multifilm. Since the metal layers are included in the interference filter, a thickness of the metal multifilm 112 may be thinner than the general dielectric interference filter without metal layers embedded. The thickness of metal multifilm may be from 0.1 μm to 2 μm and have a compatible optical density (OD) with the general dielectric interference filter. The metal layers may include Ag, Au, Al, Cu or a combination thereof.

Referring to FIGS. 2C and 2D, in some embodiments, the biosensor 100 may include an aperture structure 114. The aperture structure 114 is embedded in the immobilization layer 110. The aperture structure 114 includes an opening so that the light can be controlled to irradiate certain areas of the substrate 102, and cross-talk can be avoided. The opening corresponds to one pixel 104. In some embodiments, the opening may not be located directly above the center of one pixel. It should be appreciated that the opening is located according to actual needs. The aperture structure 114 may include an opaque material. The opaque material may include Ag, Al, Au, Cu, Nb, Ni, Ti, W, an alloy thereof or a hybrid material thereof.

Referring to FIGS. 2E and 2F, in some embodiments, the biosensor 100 may include a shielding layer 116 disposed on the substrate 102. The shielding layer 116 surrounds the angle-sensitive filter 108 to isolate different areas of the angle-sensitive filter 108. For example, the shielding layer 116 isolates the angle-sensitive filter 108 every two adjacent pixels 104. The shielding layer 116 may include a material with a high reflective index. If the shielding layer can reflect a light greater than about 50%, the material or structure of the shielding layer is considered to have a high reflective index. The material of the shielding layer 116 may include Ag, Al, Au, Cu, Nb, Ni, Ti, W, $Ta_2O_5$, $Nb_2O_5$, $Al_2O_3$, $TiO_2$, SiH, $Si_3N_4$, air, vacuum, an alloy thereof or a hybrid material thereof.

Referring to FIGS. 2G and 2H, in some embodiments, the biosensor 100 may include a waveguide 118. The waveguide 118 is embedded in the immobilization layer 110. The waveguide 118 corresponds to one pixel 104. In some embodiments, the waveguide 118 may not be located directly above the center of one pixel. It should be appreciated that the waveguide is located according to actual needs. In these embodiments, the waveguide 118 is linear so that the light can be controlled to irradiate biosamples in sequence and sequentially generate emission light to the certain areas of substrate 102, and cross-talk can be avoided. The waveguide 118 includes a material with a high refractive index. If the refractive index is greater than about 1.5 at visible light wavelength, the refractive index is considered a high refractive index. The material with a high refractive index may include $Al_2O_3$, $Ta_2O_5$, $Nb_2O_5$, $TiO_2$, $Si_3N_4$, or polymer.

Figure 2I:
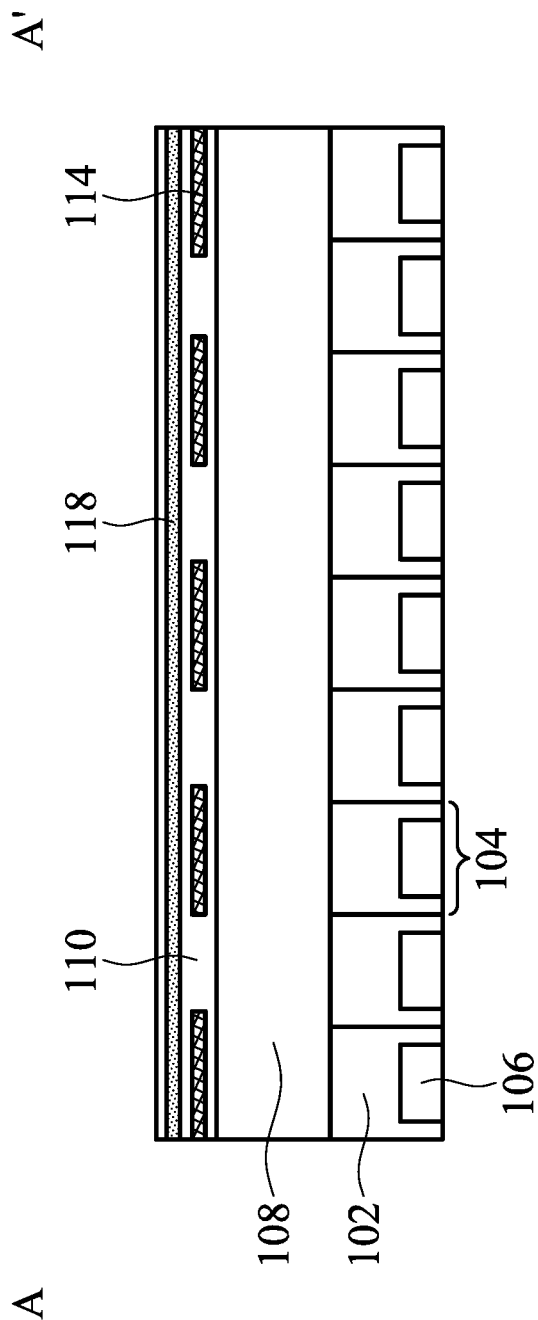
Figure 2J:
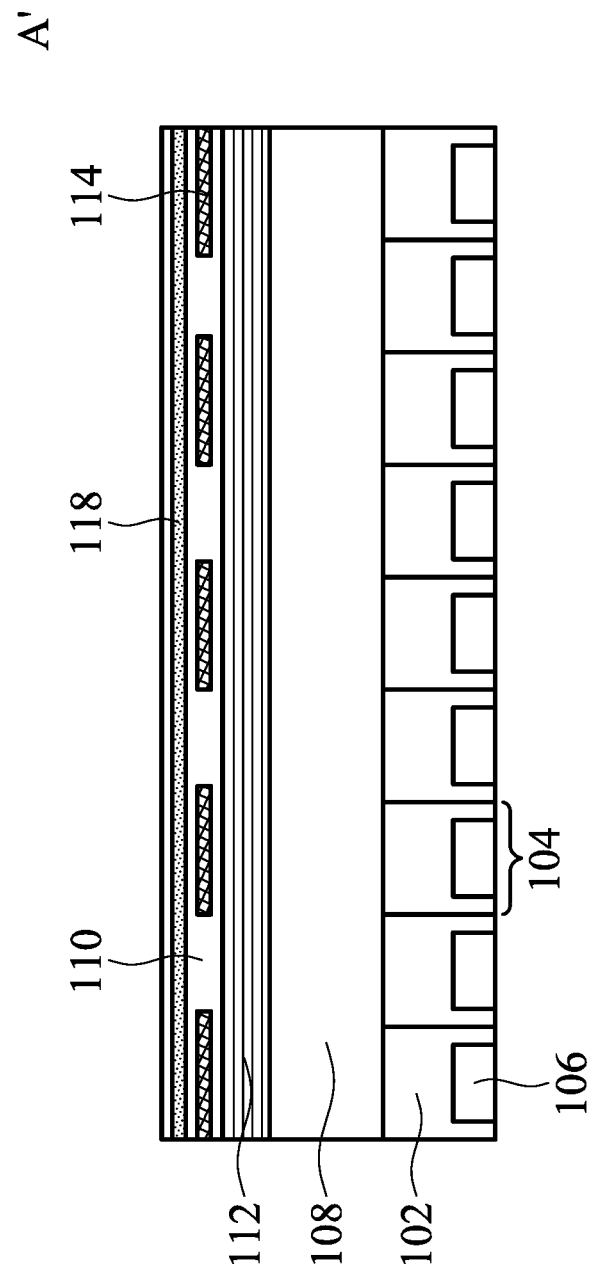

Referring to FIGS. 2I and 2J, in some embodiments, the waveguide 118 may be disposed on the aperture structure 114. To be specific, the aperture structure 114 and the waveguide 118 are embedded in the immobilization layer 110. In these embodiments, the waveguide 118 is a continuous layer, but the aperture structure 114 confines the pathway of emission light. Therefore cross-talk can be also avoided.

Figure 3:
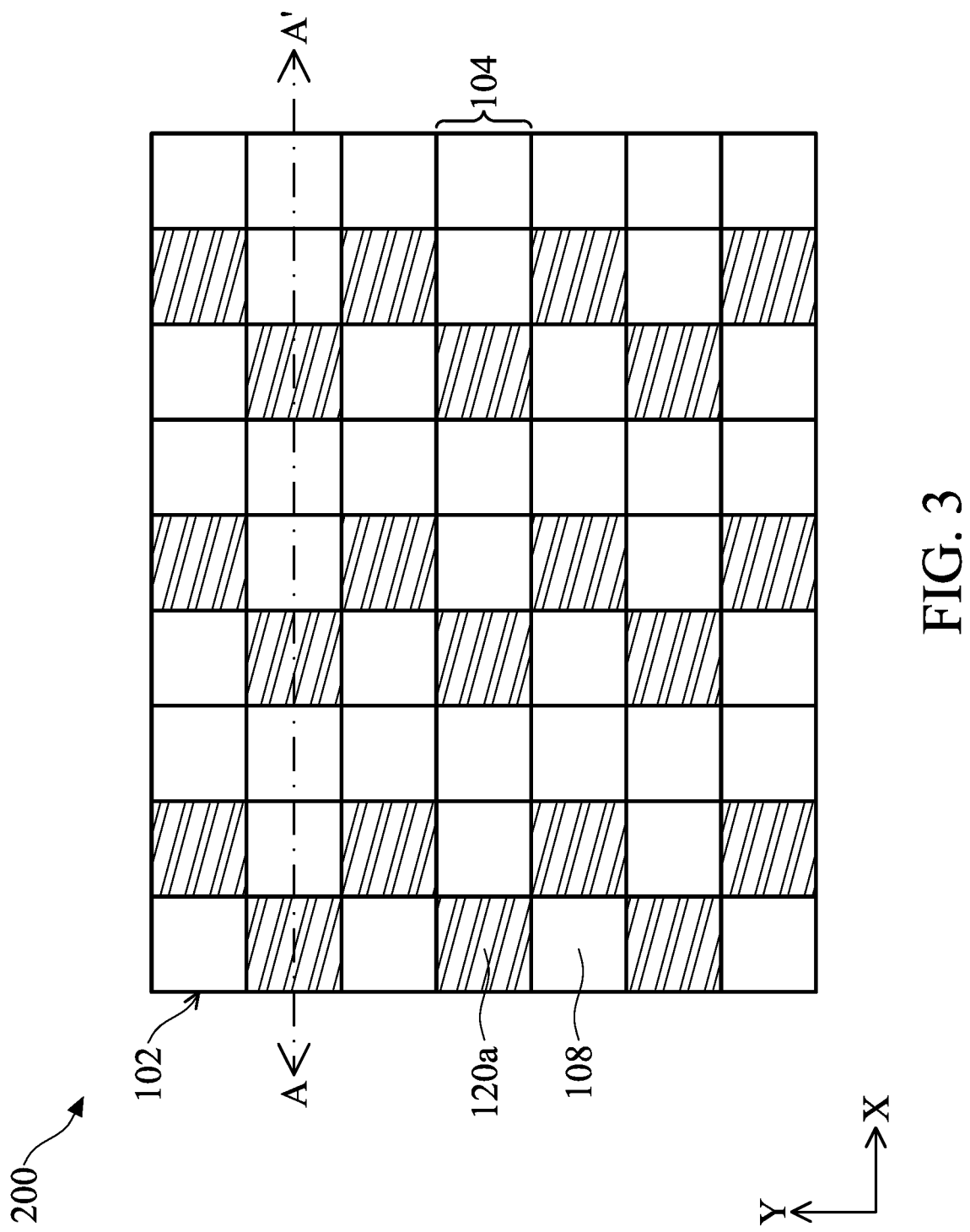
FIG. 3 illustrates a top view of a biosensor in accordance with some embodiments of the present disclosure.

FIG. 3 illustrates a top view of a biosensor 200 in accordance with some embodiments of the present disclosure. FIGS. 4A-4J illustrate cross-sectional views of the biosensor 200 of FIG. 3 along line A-A' in accordance with some embodiments of the present disclosure.

Referring to FIG. 3, one of the differences between the biosensor 200 and biosensor 100 is that the biosensor 200 further includes a first color filter 120a disposed on the substrate 102. To be specific, the first color filter 120a is disposed adjacent to the angle-sensitive filter 108 and corresponds to one pixel 104. For example, two first color filters 120a are separated by the angle-sensitive filter 108 that covers two pixels 104 in a direction X. Two first color filters 120a are separated by the angle-sensitive filter 108 that covers one pixel 104 in a direction Y perpendicular to the direction X. The coverage area of the angle-sensitive filter 108 is equal to or larger than that of the first color filter 120a. In other words, an area of a projection of angle-sensitive filter 108 is equal to or larger than that of a projection of the first color filter 120a.

Referring to FIGS. 4A and 4B, one of the differences between FIGS. 4A-4B and FIGS. 2A-2B is that the first color filter 120a is disposed on the substrate 102.

Figure 4C:
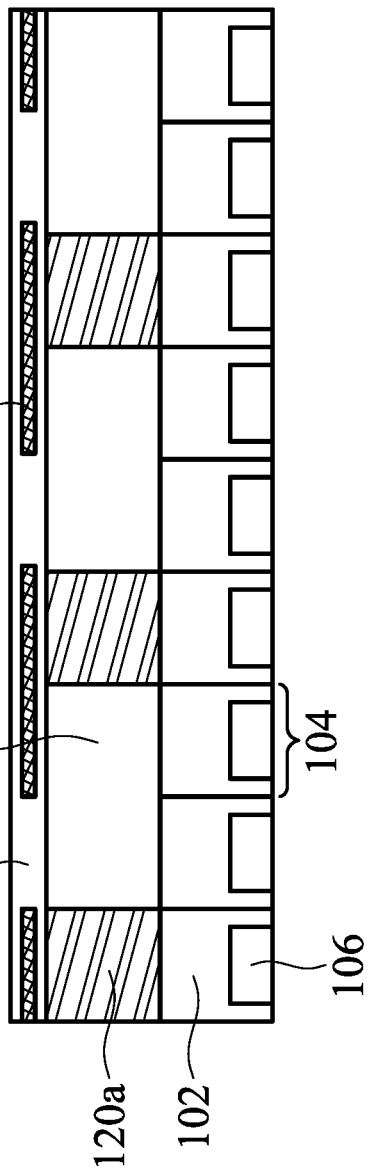
Figure 4D:
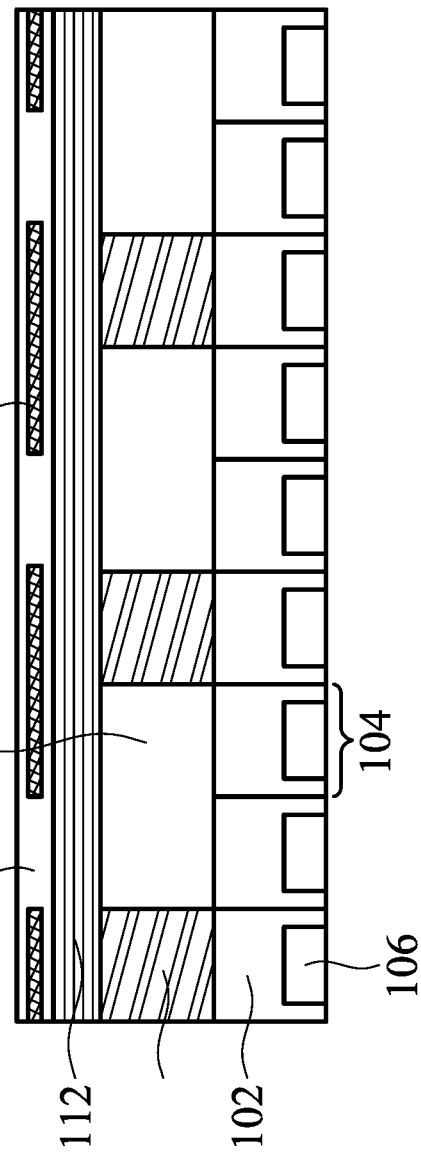
Figure 4E:
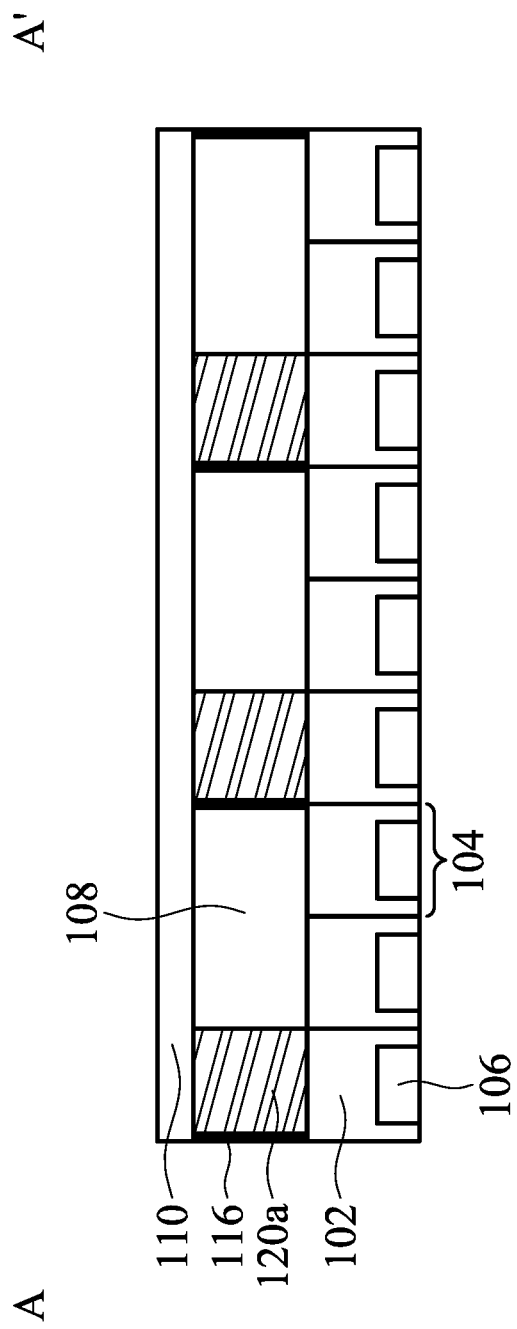
Figure 4F:
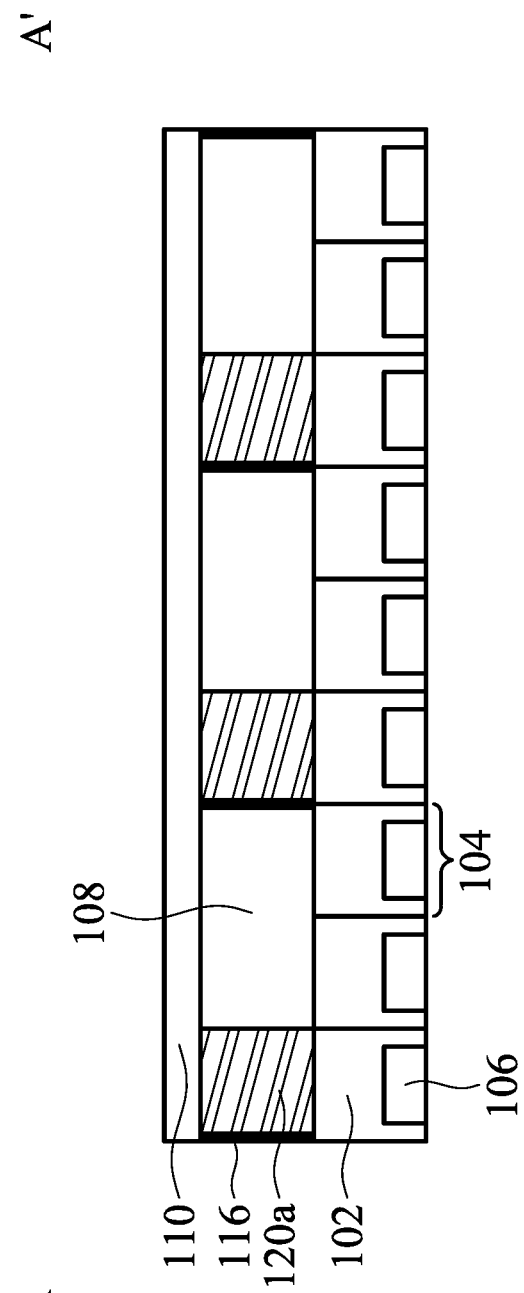

Referring to FIGS. 4C and 4D, one of the differences between FIGS. 4C-4D and FIGS. 2C-2D is that the first color filter 120a is disposed on the substrate 102. The opening of the aperture structure 114 corresponds to a pixel 104 that is covered by the angle-sensitive filter 108. Referring to FIGS. 4E and 4F, one of the differences between FIGS. 4E-4F and FIGS. 2E-2F is that the first color filter 120a is disposed on the substrate 102. The shielding layer 116 surrounds one first color filter 120a and one angle-sensitive filter 108 that corresponds to two adjacent pixels 104.

Referring to FIGS. 4G and 4H, one of the differences between FIGS. 4G-4H and FIGS. 2G-2H is that the first color filter 120a is disposed on the substrate 102.

Referring to FIGS. 4I and 4J, one of the differences between FIGS. 4I-4J and FIGS. 2I-2J is that the first color filter 120a is disposed on the substrate 102.

Figure 5:
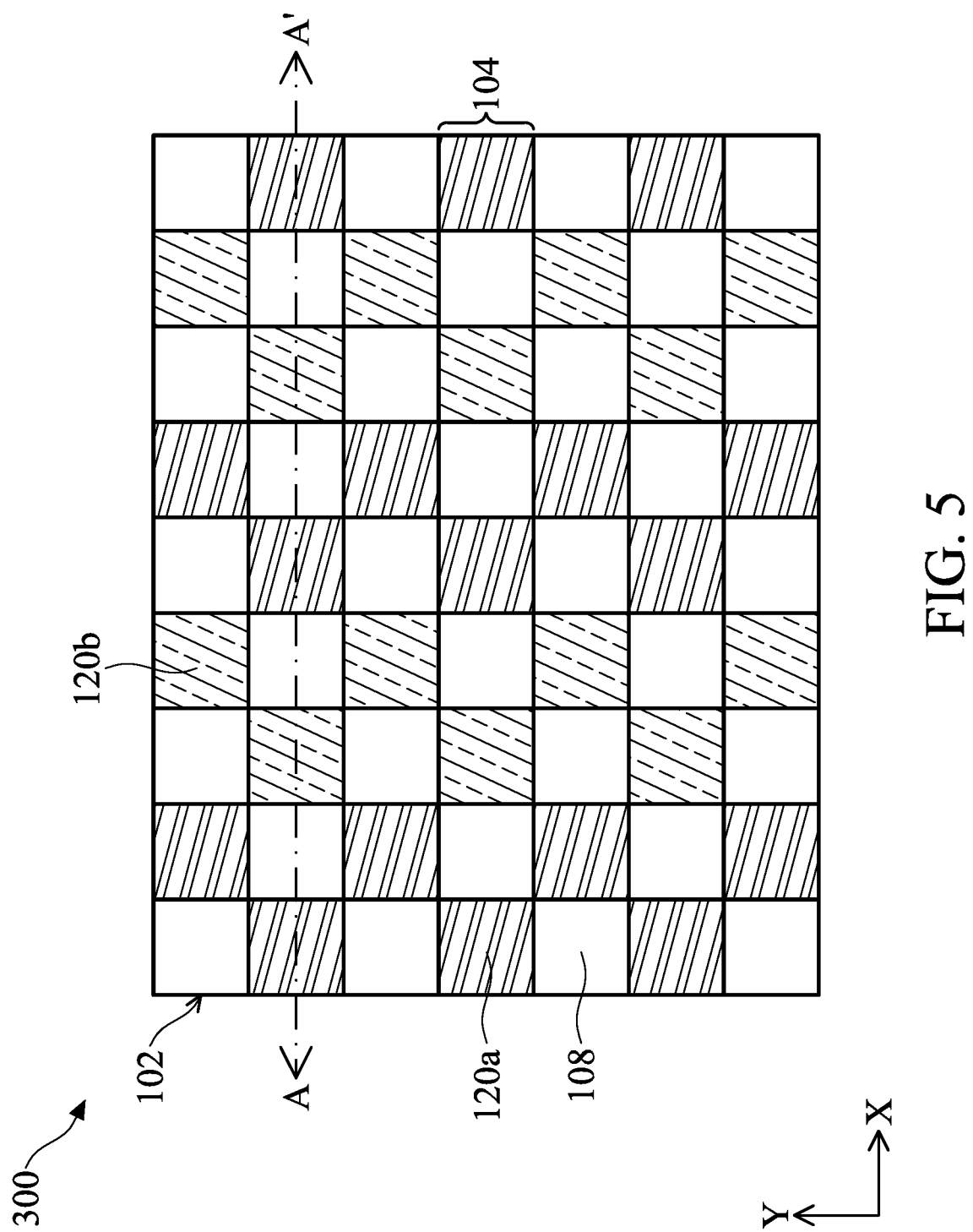
FIG. 5 illustrates a top view of a biosensor in accordance with some embodiments of the present disclosure.

FIG. 5 illustrates a top view of a biosensor 300 in accordance with some embodiments of the present disclosure. FIGS. 6A-6J illustrate cross-sectional views of the biosensor 300 of FIG. 5 along line A-A' in accordance with some embodiments of the present disclosure.

The difference between the biosensor 300 and biosensor 200 is that the biosensor 300 includes a second color filter 120b disposed on the substrate 102. To be specific, the second color filter 120b is disposed adjacent to the angle-sensitive filter 108 and corresponds to one of the pixels 104. For example, the angle-sensitive filter 108 is sandwiched by the first color filter 120a and the second color filter 120b in the direction X. the angle-sensitive filter 108 is sandwiched by two first color filters 120a or two second color filters 120b in the direction Y. The coverage area of the angle-sensitive filter 108 is equal to or larger than that of the first color filter 120a or the second color filter 120b. In other words, an area of a projection of angle-sensitive filter 108 is equal to or larger than that of a projection of the first color filter 120a or the second color filter 120b.

Referring to FIGS. 6A and 6B, one of the differences between FIGS. 6A-6B and FIGS. 4A-4B is that the second color filter 120b is disposed on the substrate 102.

Figure 6C:
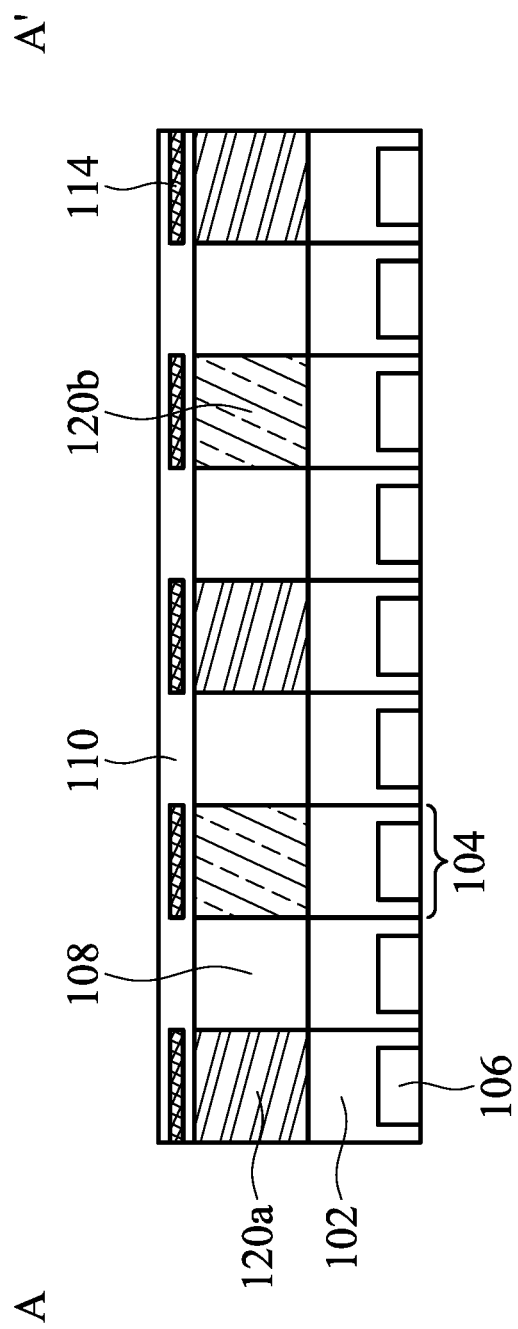
Figure 6D:
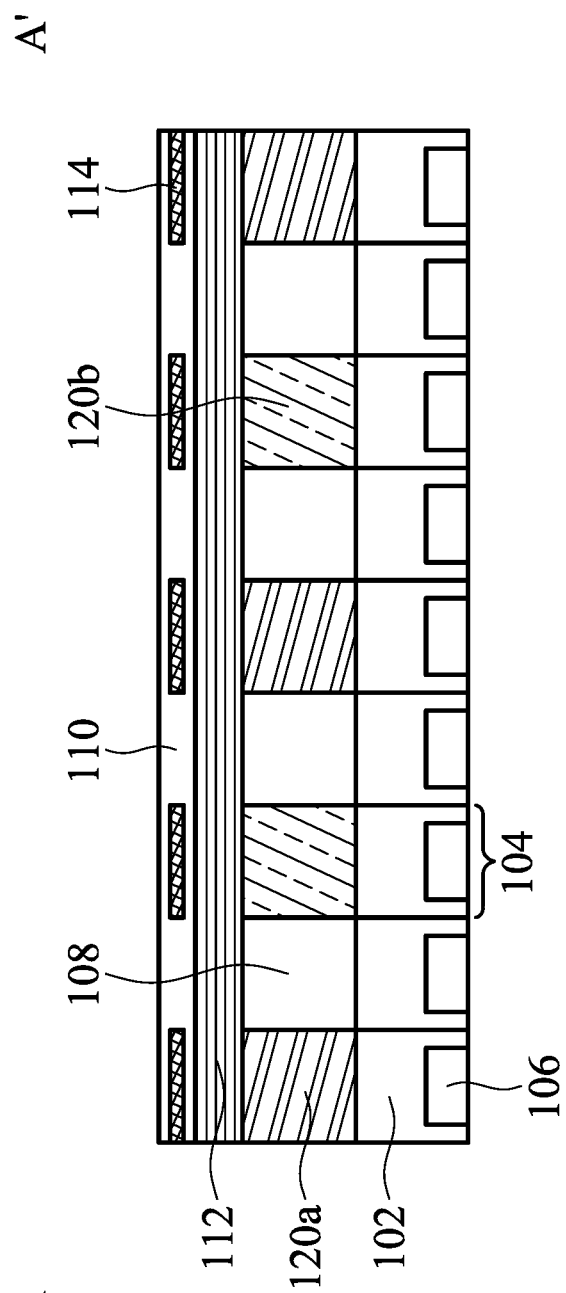
Figure 6E:
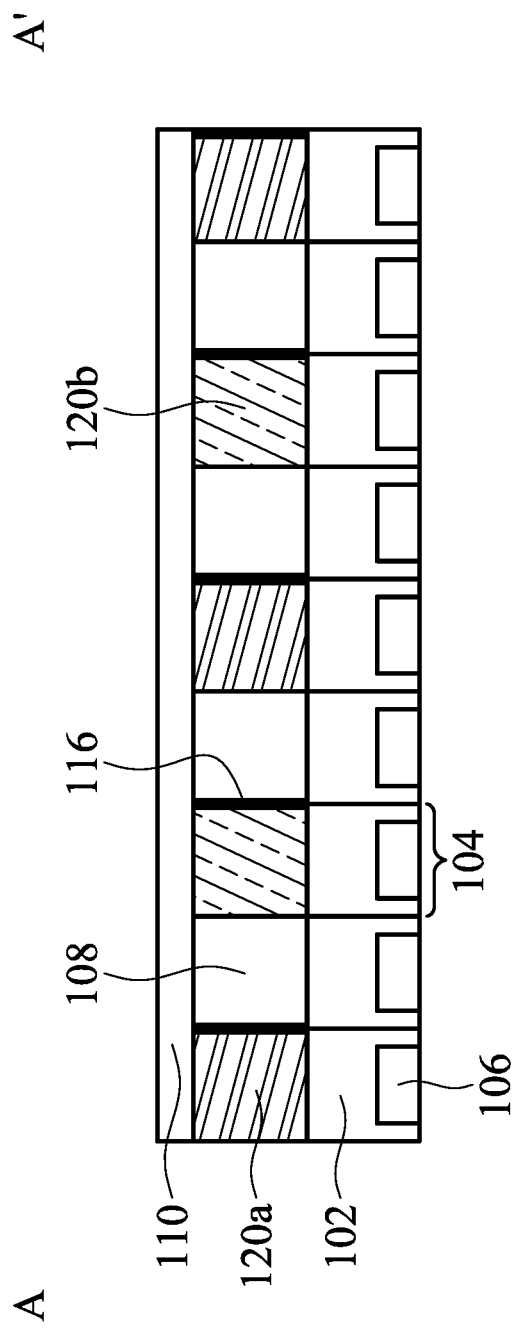
Figure 6F:
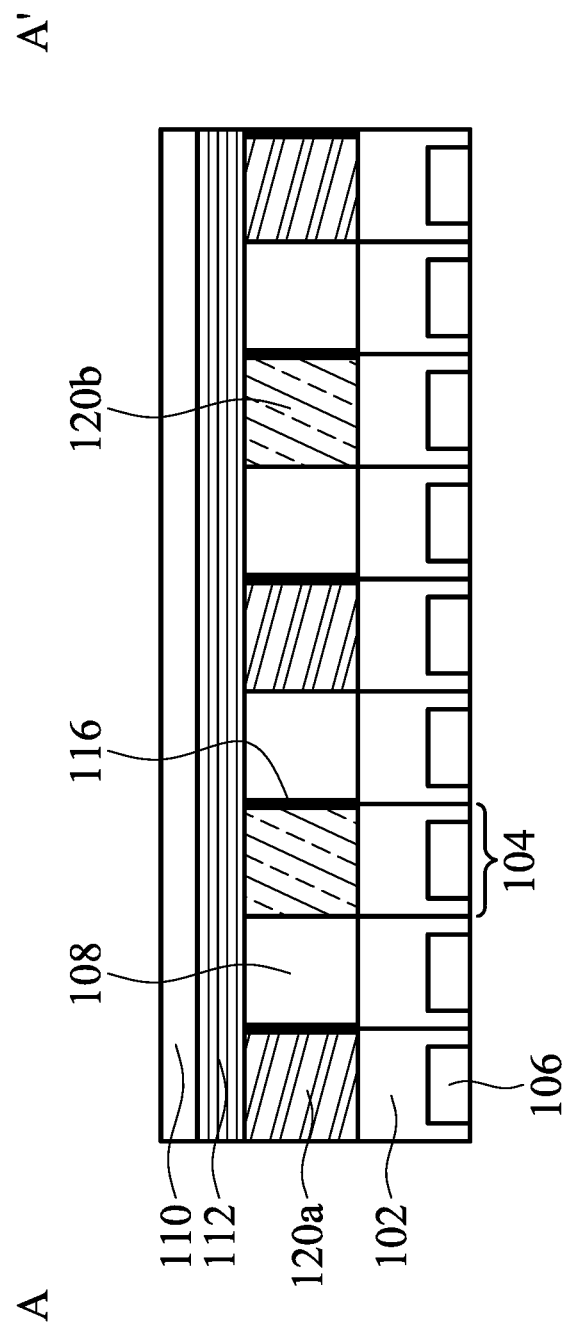

Referring to FIGS. 6C and 6D, one of the differences between FIGS. 6C-6D and FIGS. 4C-4D is that the second color filter 120b is disposed on the substrate 102. The opening of the aperture structure 114 corresponds to a pixel 104 that is covered by the angle-sensitive filter 108. Referring to FIGS. 6E and 6F, one of the differences between FIGS. 6E-6F and FIGS. 4E-4F is that the second color filter 120b is disposed on the substrate 102. The shielding layer 116 is disposed between a set of the angle-sensitive filter 108 and the first color filter 120a and a set of the angle-sensitive filter 108 and the second color filter 120b in the cross-sectional views.

Referring to FIGS. 6G and 6H, one of the differences between FIGS. 6G-6H and FIGS. 4G-4H is that the second color filter 120b is disposed on the substrate 102.

Figure 6I:
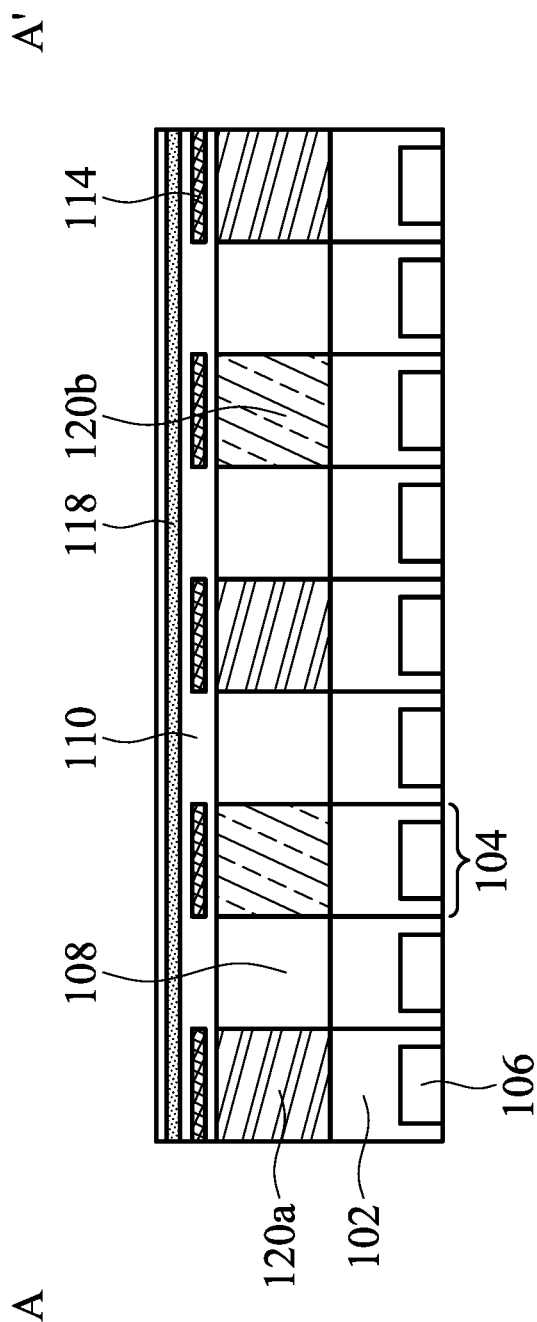
Figure 6J:
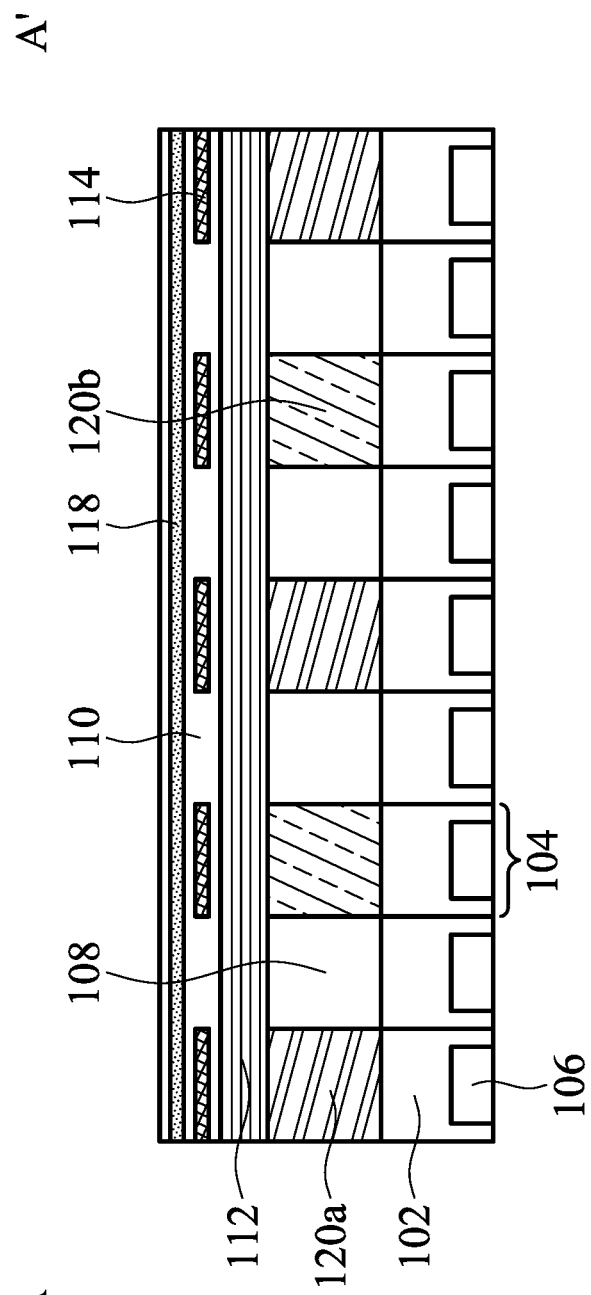

Referring to FIGS. 6I and 6J, one of the differences between FIGS. 6I-6J and FIGS. 4I-4J is that the second color filter 120b is disposed on the substrate 102.

Figure 6K:
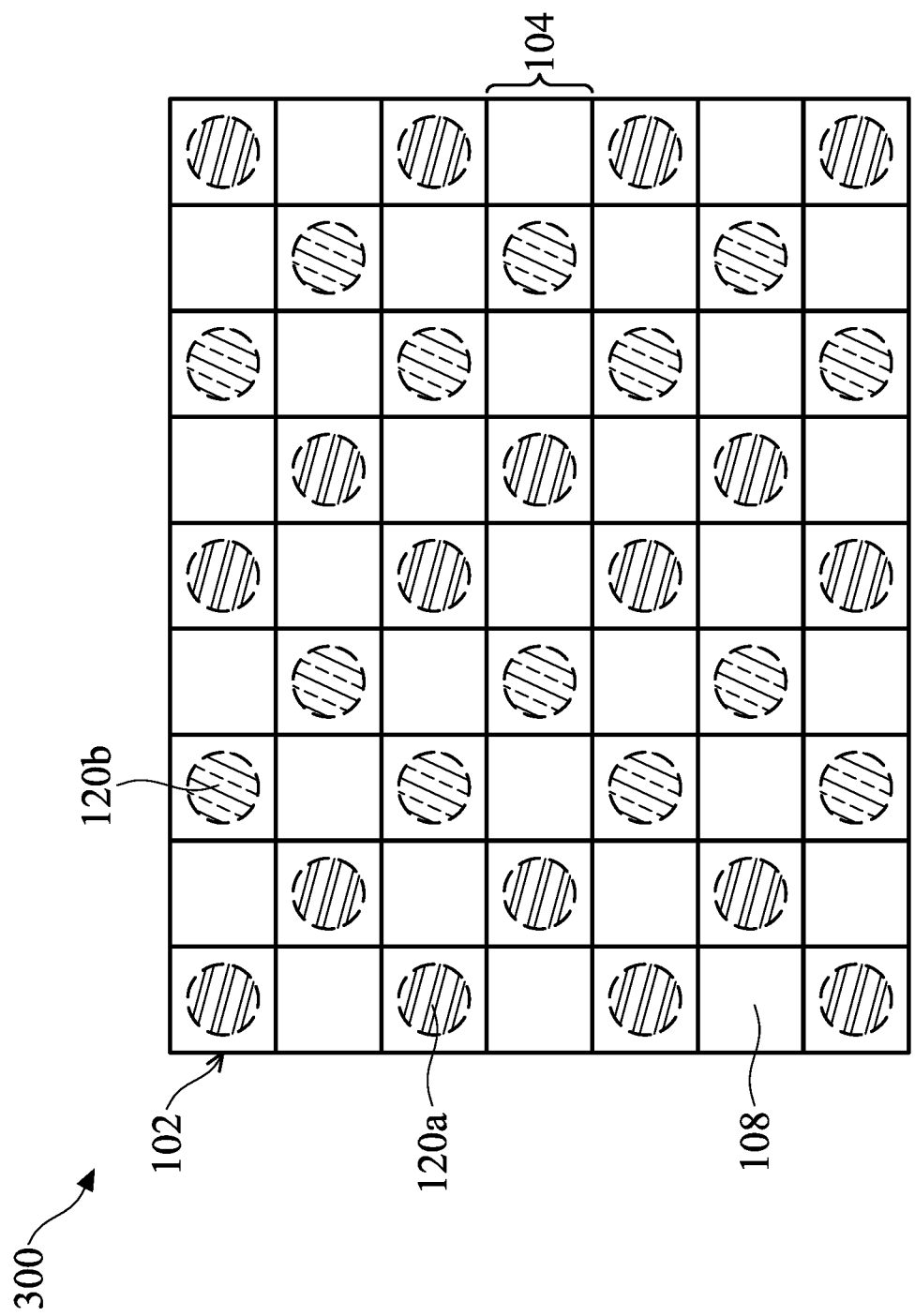
FIG. 6K illustrates a top view of a biosensor in accordance with some embodiments of the present disclosure.

Referring to FIG. 6K, in some embodiments, the first color filter 120a and the second color filter 120b may have areas equal to or smaller than that of one of the pixels 104. When the first and second color filters are smaller than the angle-sensitive filter, the organic filter material may be fully embedded in the surrounding angle-sensitive filter to provide a robust chemical and mechanical resistance. Moreover, the shrinked size of the organic filter may ensure that the emission light from a biosample can pass through the angle-sensitive filter to the diagonal photodiode without the discontinuity due to the first and second color filters.

According to the different compositions of the filter, the inventive concept is described in detail below.

Aspect 1

Figure 7A:
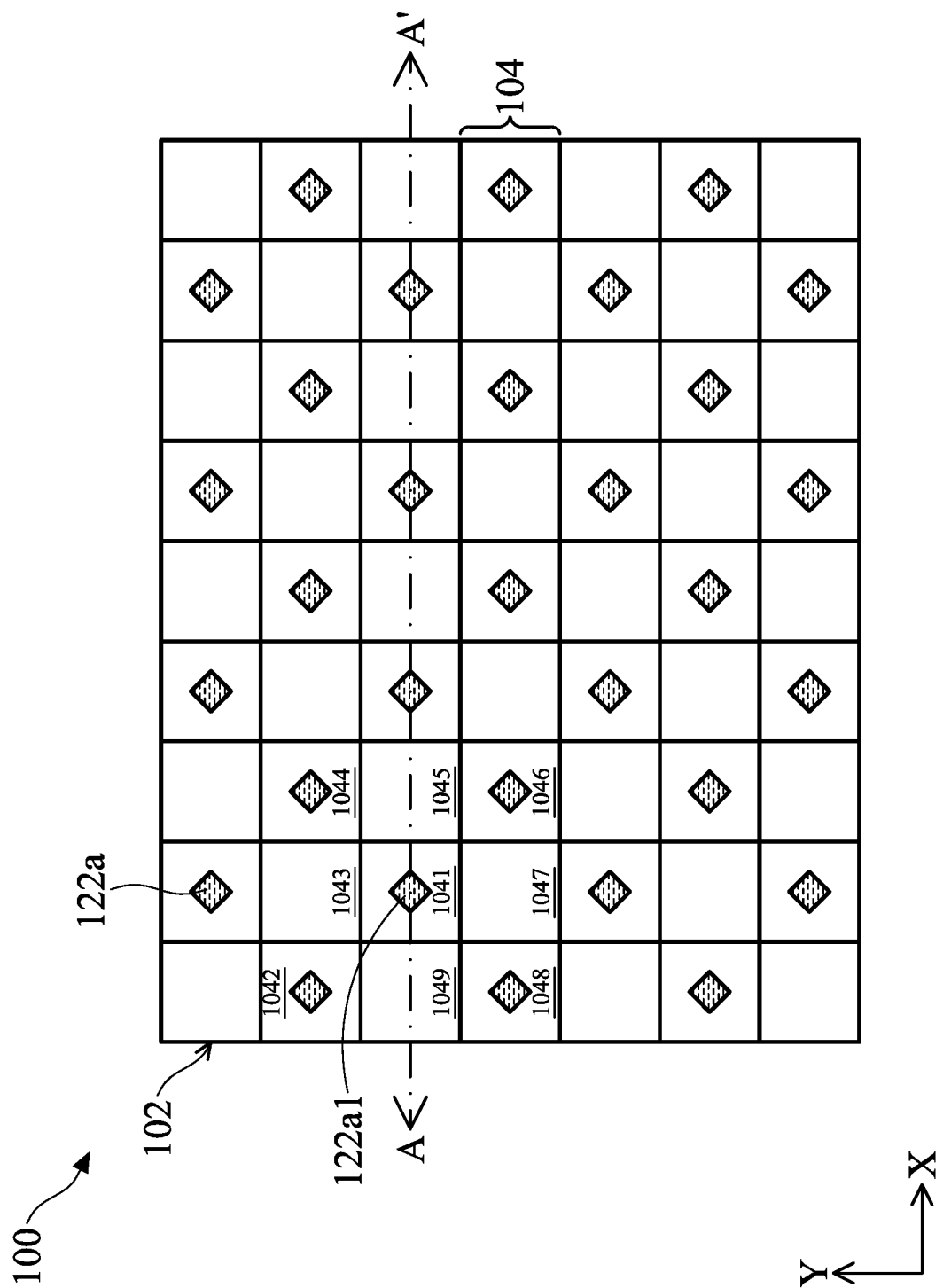
FIG. 7A illustrates a top view of a biosensor in accordance with some embodiments of the present disclosure.

In the aspect, the biosensor 100 includes the angle-sensitive filter 108. FIG. 7A illustrates an arrangement of analytes 122a on the biosensor 100. FIG. 7B illustrate a cross-sectional view of FIG. 7A along line A-A'. In the embodiment, it is assumed that the light emitted by one analyte can reach the pixels that are one pixel away from the pixel under the light. In other words, the closest eight pixels surround the pixel under the light. For example, as illustrated in FIG. 7A, the pixel 1041 is under the light emitted by the analyte 122a1, and the pixels 1042-1049 are the pixels that are only one pixel away from the pixel 1041. The light emitted by the analyte 122a1 can reach the pixels 1041-1049.

The analytes 122a are placed on the biosensor 100. One analyte 122a has an area equal to or smaller than that of one pixel 104.

In the case of fluorescence, an excitation light 124 irradiates the analytes 122a. The excitation light 124 may move from one side of the biosensor 100 to the opposite side so that the analyte 122a will be excited and emit a light L in order, but not simultaneously. For example, the excitation light 124 may move along a direction X. In the embodiment, the direction X is a direction from a left side to a right side of the biosensor 100 in top view, as shown in FIG. 7A.

Therefore, the analytes 122a may be placed on the biosensor 100 at one-pixel intervals to avoid cross-talk. In other words, any two adjacent analytes 122a are spaced apart from each other by one pixel 104.

Referring to FIG. 7B, the analytes 122a are excited by the excitation light 124 and emit a light L. The excitation light rejection filter 112 is disposed to block the excitation light 124 so that the excitation light 124 can be prevented from entering the substrate 102 and being absorbed by the photodiodes 106.

The term "incident angle" refers to an angle between the incident light and the normal line of the angle-sensitive filter. A first portion L1 of the light L enters the angle-sensitive filter 108 at a first incident angle $\theta 1$. A pixel that receives the first portion L1 of the light L is a first pixel 104a. The first incident angle $\theta 1$ is an angle from 0 degrees to the maximum incident angle of the light L that can be received in the first pixel 104a.

A second portion L2 of the light L enters the angle-sensitive filter 108 at a second incident angle $\theta 2$. A pixel that receives the second portion L2 of the light L is a second pixel 104b. The second incident angle $\theta 2$ is an angle from the maximum incident angle of the first incident angle $\theta 1$ to the maximum incident angle of the second portion L2 of the light L that can be received in the second pixel 104b. The first incident angle θ1 is smaller than the second incident angle θ2.

In some embodiments, the first incident angle θ1 is from 0 degrees to 40 degrees, and the second incident angle θ2 is from 20 degrees to 70 degrees. In some embodiments, the first incident angle θ1 is from 0 degrees to 30 degrees, and the second incident angle θ2 is from 20 to 60 degrees. Since the first incident angle θ1 is smaller than the second incident angle θ2, the second portion L2 will be spectrum-shifted more significantly than the first portion L1.

FIG. 7C illustrates a cross-sectional view of FIG. 7A in accordance with other embodiments of the present disclosure. The difference between the embodiments of FIG. 7C and FIG. 7B is that the analyte 122b has a greater area than that of one pixel 104. The analyte 122b may be a cell, a tissue, an organ and so on.

Although the analyte 122b has a greater area than that of one pixel 104, it should be understood that the same concept as recited in the embodiment of FIGS. 7A and 7B can also be applied to the embodiment of FIG. 7C after reading the following exemplary embodiments, which will not be repeated for the sake of brevity. Furthermore, the arrangement is merely an example. One of ordinary skill in the art can place the analytes to meet practical needs.

Figure 7D:
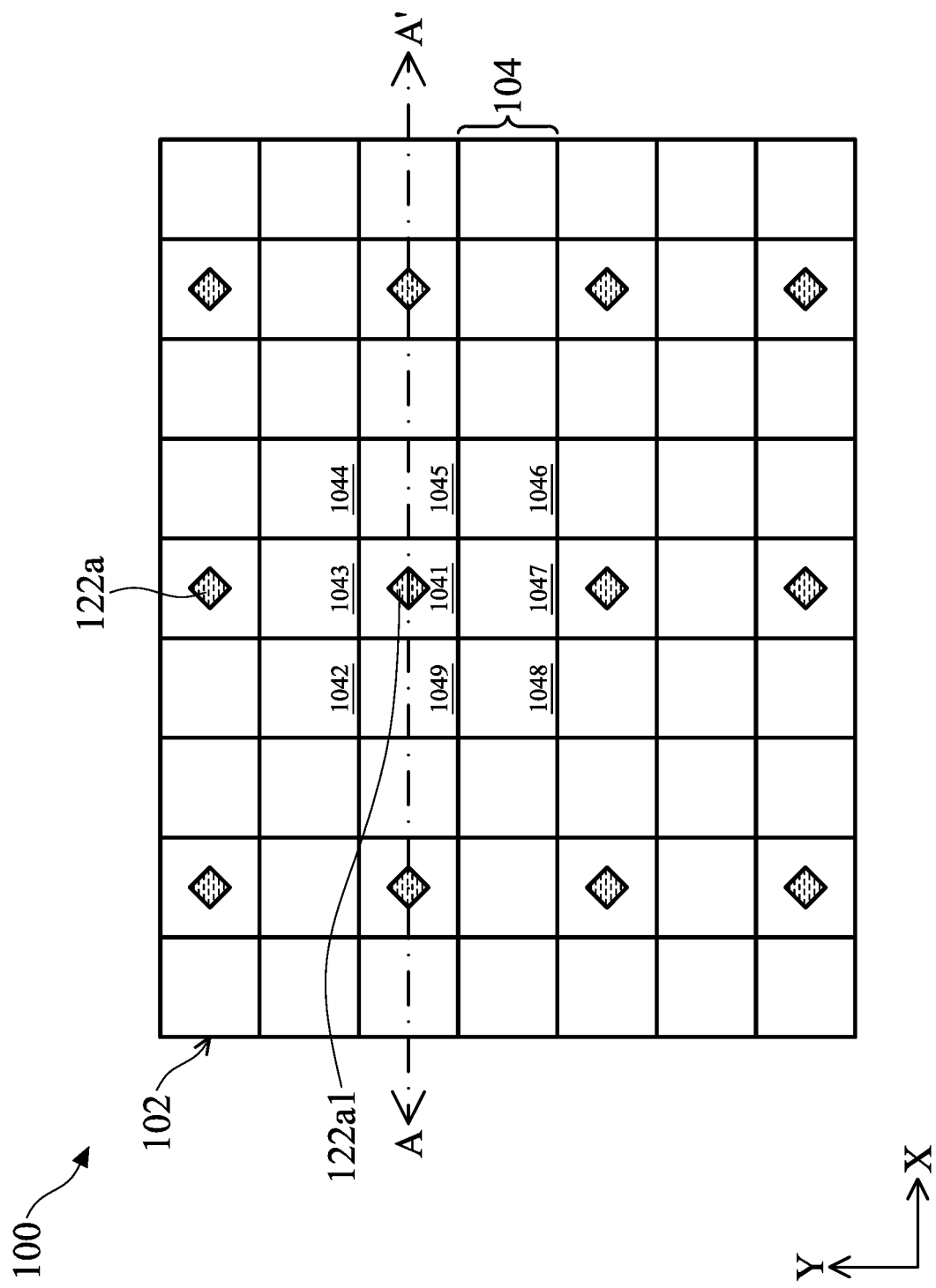
FIG. 7D illustrates a top view of a biosensor in accordance with some embodiments of the present disclosure.
Figure 7E:
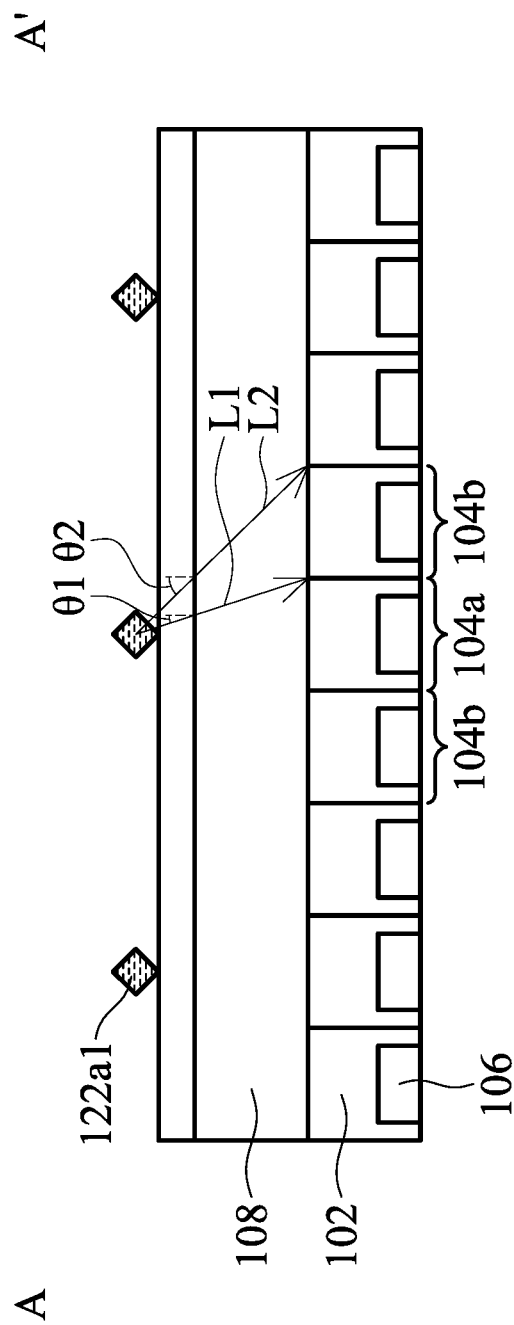
FIGS. 7E-7F illustrate cross-sectional views of the biosensor of FIG. 7D in accordance with some embodiments of the present disclosure.
Figure 7F:
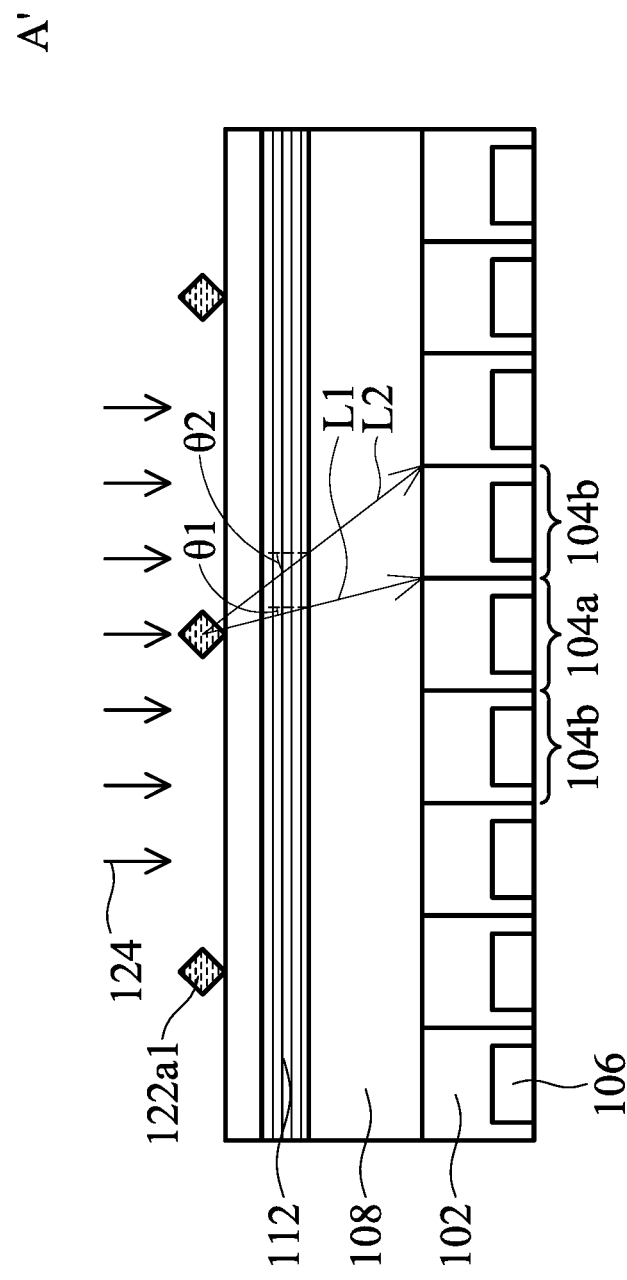

FIG. 7D illustrates a top view of an arrangement of analytes 122a on the biosensor 100 in accordance with some embodiments of the present disclosure. FIGS. 7E and 7F illustrate cross-sectional views of FIG. 7D along line A-A'. The difference between the embodiments of FIG. 7D and FIG. 7A is the arrangement of the analytes 122a.

In the case of bioluminescence, since the analytes 122a do not need to be excited by an excitation light, the excitation light rejection filter 112 can be omitted as shown in FIG. 7E. Since all the analytes 122a simultaneously emit the light L, the analytes 122a may be placed on the biosensor 100 at a lower density than that in the embodiment of FIG. 7A to avoid cross-talk. For example, as illustrated in FIG. 7D, the analytes 122a are arranged at two-pixel intervals along the direction X and at one-pixel intervals in a direction Y perpendicular to the direction X. The arrangement is merely an example. One of ordinary skill in the art can arrange the analytes to meet practical needs.

Although the analytes 122a are arranged at different intervals than those of FIGS. 7A and 7B and the light L is generated by bioluminescence, it should be understood that the same concept as recited in the embodiment of FIGS. 7A and 7B can also be applied to the embodiment of FIG. 7E after reading the following exemplary embodiments, which will not be repeated for the sake of brevity. Furthermore, the arrangement is merely an example. One of ordinary skill in the art can place the analytes to meet practical needs.

FIG. 7F illustrates a cross-sectional view of FIG. 7D in accordance with other embodiments of the present disclosure. The difference between the embodiments of FIG. 7F and FIG. 7E is that the analytes 122a generate the light L by fluorescence.

In the case of fluorescence, since an excitation light is needed to excite the analytes, the excitation light rejection filter 112 is disposed as shown in FIG. 7F. In the embodiment, since all the analyte 122a are excited simultaneously by the excitation light 124 and emit the light L simultaneously, the analytes 122a may be placed on the biosensor 100 as in FIG. 7D.

Although the analytes 122a are placed in a different arrangement than that of FIGS. 7A and 7B, it should be understood that the same concept as recited in the embodiment of FIGS. 7A and 7B can also be applied to the embodiment of FIG. 7F after reading the following exemplary embodiments, which will not be repeated for the sake of brevity. Furthermore, the arrangement is merely an example. One of ordinary skill in the art can place the analytes to meet practical needs.

Figure 7G:
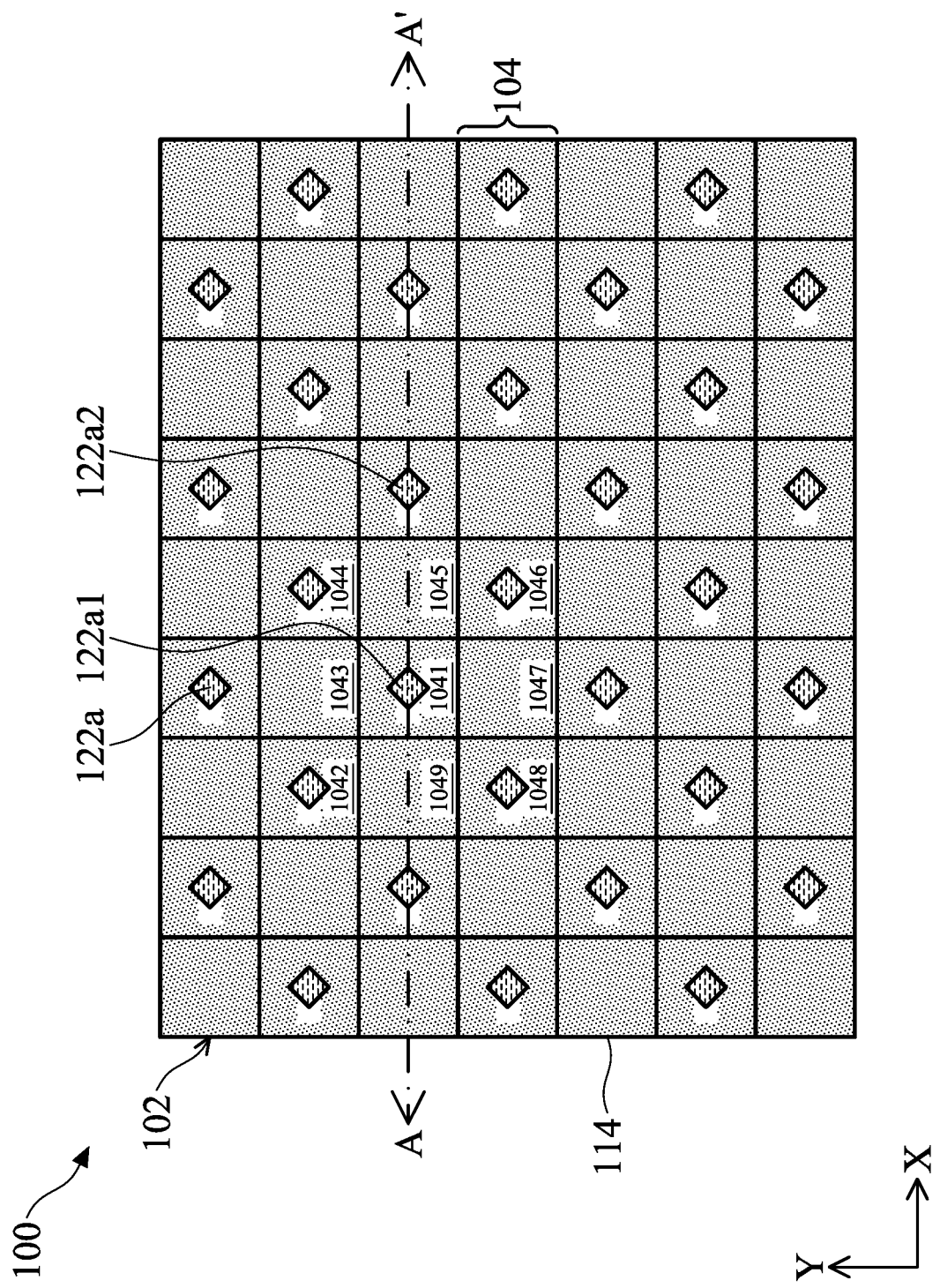
FIG. 7G illustrates a top view of a biosensor in accordance with some embodiments of the present disclosure.
Figure 7H:
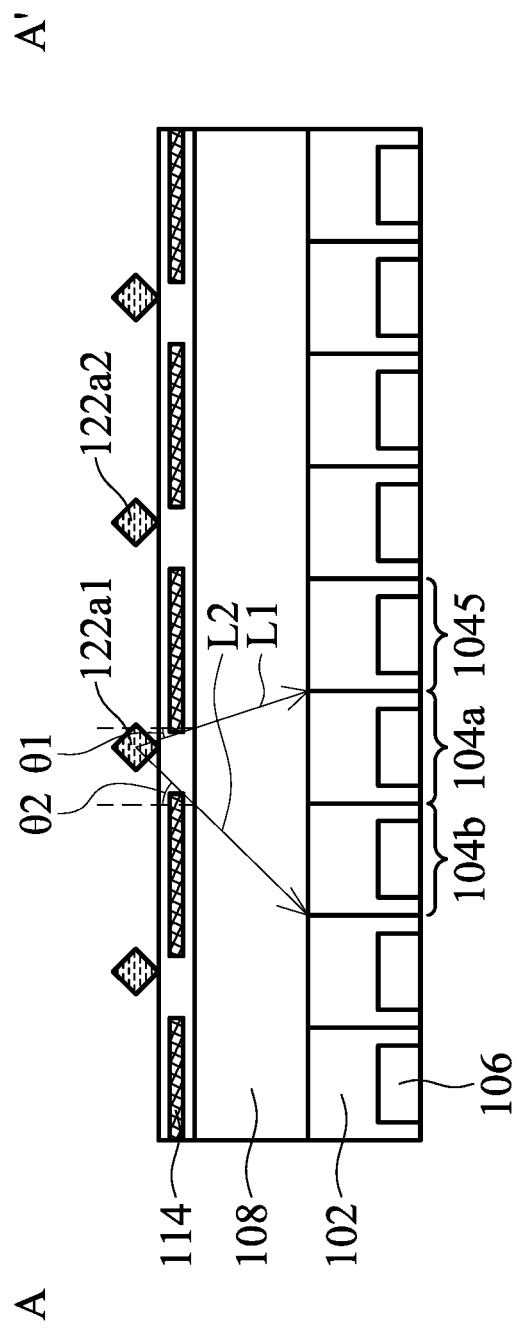
FIGS. 7H-7I illustrate cross-sectional views of the biosensor of FIG. 7G in accordance with some embodiments of the present disclosure.
Figure 7I:
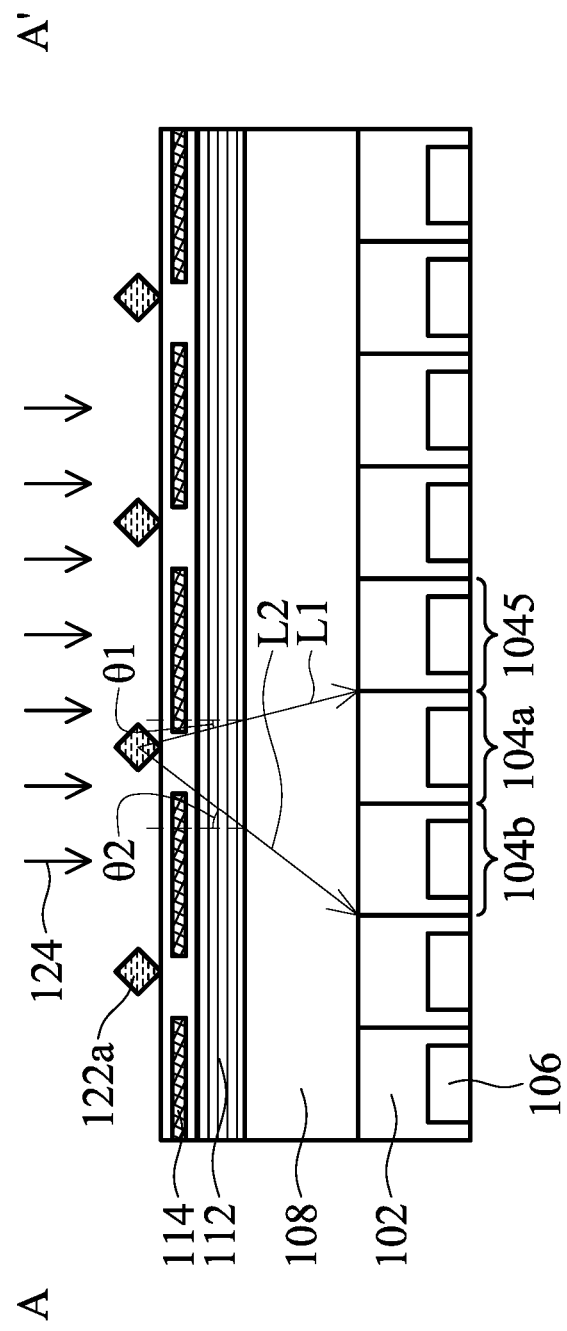

FIG. 7G illustrates a top view of an arrangement of analytes 122a on the biosensor 100 in accordance with some embodiments of the present disclosure. FIGS. 7H and 7I illustrate cross-sectional views of FIG. 7G along line A-A', wherein FIG. 7H represents an example of bioluminescence and FIG. 7I represents an example of fluorescence. The differences between the embodiments of FIG. 7G and FIG. 7A are that the biosensor 100 includes the aperture structure 114 and that the light L is emitted at the same time.

As illustrated in FIG. 7G, the aperture structure 114 includes openings that correspond to each analyte 122a, so that the light can be further controlled to irradiate only certain areas of the substrate 102.

To be specific, referring to FIG. 7H, the aperture structure 114 prevents the light L emitted by the analyte 122a1 from reaching the pixel 1045, and allows the light L emitted by the analyte 122a2 adjacent to the analyte 122a1 to reach the pixel 1045. Therefore, the photodiode 106 in the pixel 1045 only receives the light from analyte 122a2, thereby avoiding cross-talk. Therefore, the analytes 122a may be placed on the biosensor 100 at one-pixel intervals to avoid cross-talk. In other words, any two adjacent analytes 122a are spaced apart from each other by one pixel 104.

In some embodiments, from the top view of FIG. 7G, the shape of the openings may be rectangular, circular, or triangular, but it is not limited thereto.

Referring to FIG. 7I, the difference between the embodiments of FIGS. 7I and 7H is that the biosensor 100 of FIG. 7H further includes the excitation light rejection filter 112.

Although the biosensor 100 of FIGS. 7H and 7I includes the aperture structure 114, it should be understood that the same concept as recited in the embodiment of FIGS. 7A and 7B can also be applied to the embodiment of FIGS. 7H and 7I after reading the following exemplary embodiments, which will not be repeated for the sake of brevity. Furthermore, the arrangement is merely an example. One of ordinary skill in the art can place the analytes to meet practical needs.

Figure 7J:
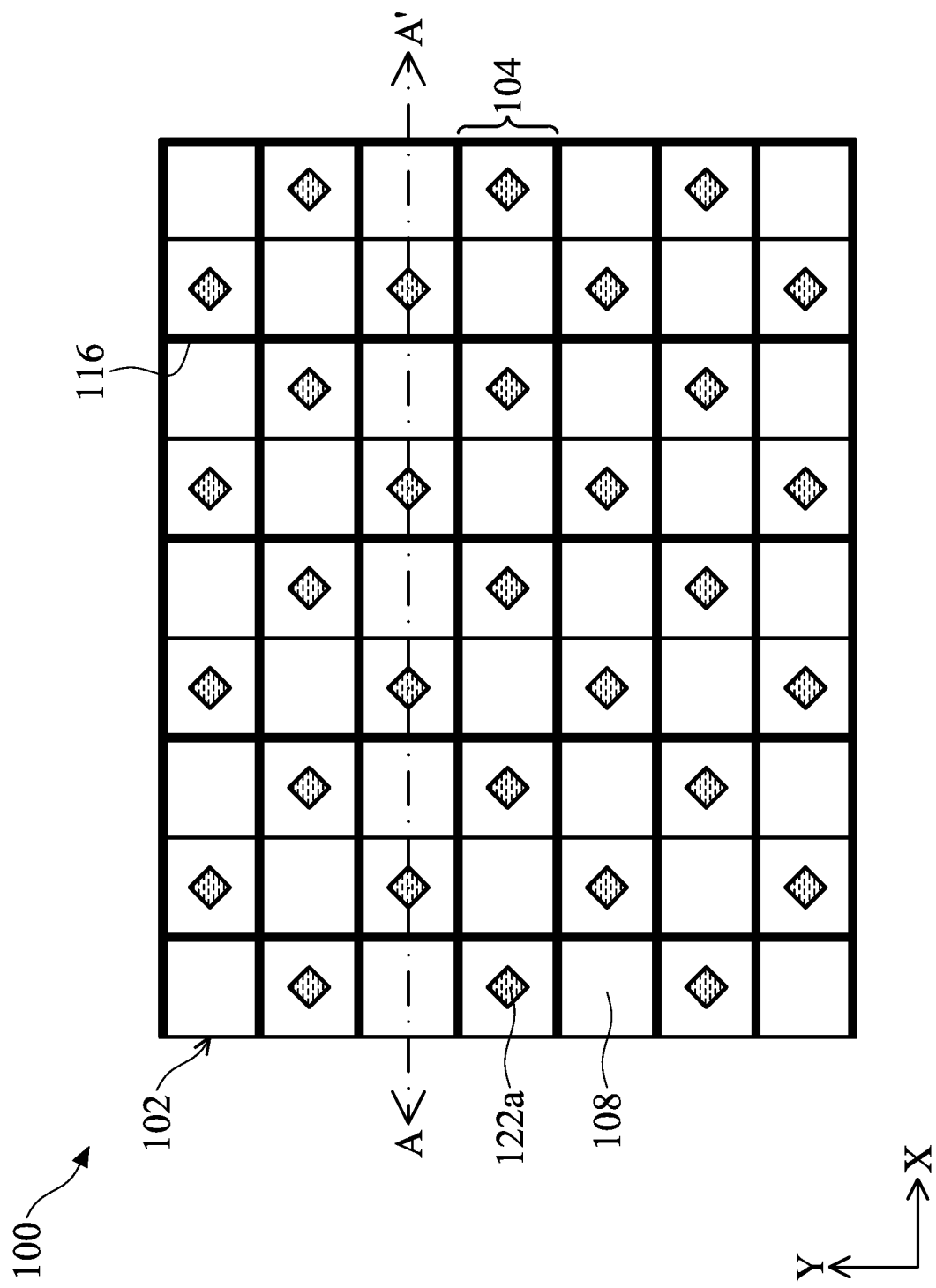
FIG. 7J illustrates a top view of a biosensor in accordance with some embodiments of the present disclosure.

FIG. 7J illustrates a top view of an arrangement of analytes 122a on the biosensor 100 in accordance with some embodiments of the present disclosure. FIGS. 7K and 7L illustrate cross-sectional views of FIG. 7J along line A-A', wherein FIG. 7K represents an example of bioluminescence and FIG. 7L represents an example of fluorescence. The differences between the embodiments of FIG. 7J and FIG. 7A are that the biosensor 100 includes the shielding layer 116 and that the light L is emitted at the same time.

Since the shielding layer 116 can reflect the light L, the first pixel 104a may receive the first portion L1' of the light L that enters the angle-sensitive filter 108 at a first incident angle θ1' greater than the first incident angle θ1 of the embodiments in FIGS. 7A-7I. The second pixel 104b may also receive the second portion L2' of the light L that enters the angle-sensitive filter 108 at a second incident angle θ2' greater than the second incident angle θ2 of the embodiments in FIGS. 7A-7I. For example, the first incident angle θ1' may be from 0 degrees to 60 degrees, and the second incident angle θ2' may be from 40 degrees to 85 degrees. However, it should be appreciated that the first incident angle θ1' and the second incident angle θ2' are determined according to the heights of the analyte, shielding layer and photodiode.

Although the biosensor 100 of FIGS. 7K and 7L includes the shielding layer 116, it should be understood that the same concept as recited in the embodiment of FIGS. 7A and 7B can also be applied to the embodiments of FIGS. 7K and 7L after reading the following exemplary embodiments, which will not be repeated for the sake of brevity. Furthermore, the arrangement is merely an example. One of ordinary skill in the art can place the analytes to meet practical needs.

Figure 8A:
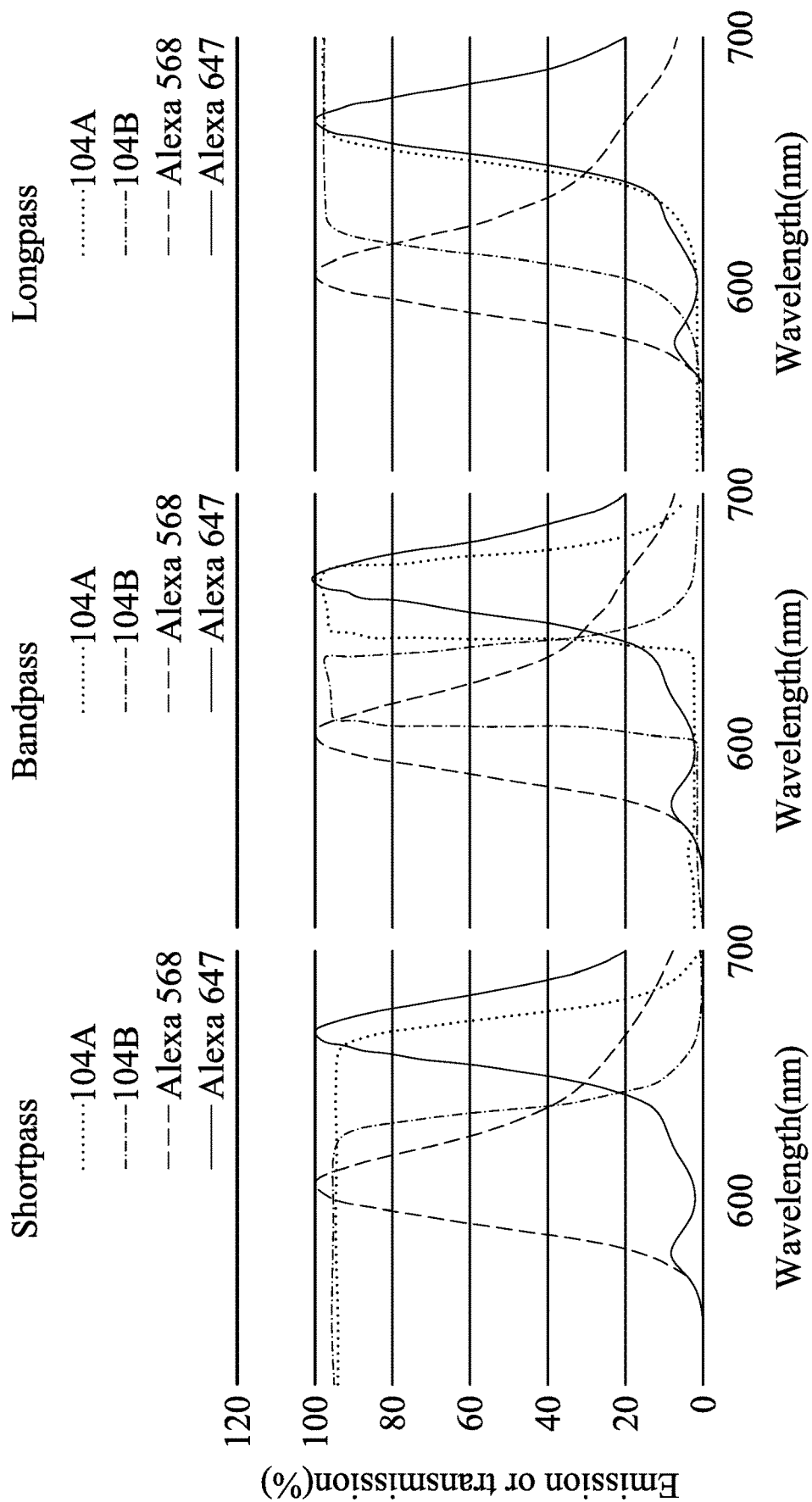
FIGS. 8A-8C are analytical graphs of emission or transmission versus wavelength in accordance with some embodiments of the present disclosure.

FIG. 8A is analytical graphs of emission or transmission versus wavelength in accordance with some embodiments of the present disclosure. 104A represents the wavelength of the light that enters the angle-sensitive filter 108 at the first incident angle θ1 or θ1' and is received by the first pixel 104a. 104B represents the wavelength of the light that enters the angle-sensitive filter 108 at the second incident angle θ2 or θ2' and is received by the second pixel 104b. Alexa 568 and Alexa 647 are two dyes that emit two different lights. A first signal intensity of the first portion L1 of the light L is obtained from the first pixel 104a. A second signal intensity of the second portion L2 of the light L is obtained from the second pixel 104b. The overlapping area between the area under curve (AUC) of 104A and the AUC of Alexa 568 represents the first signal intensity of Alexa 568 while the overlapping area between the AUC of 104B and the AUC of Alexa 568 represents the second signal intensity of Alexa 568.

For the same concept, the Alexa 647 has a first signal intensity and a second signal intensity. A first threshold can be set for the first signal intensities. A second threshold can be set for the second signal intensities. The first signal intensities are defined as Pass or No, depending on whether the first signal intensities are higher or lower than the first threshold, respectively. For example, when the first signal intensity of Alexa 568 is higher than the first threshold, the first signal intensity of Alexa 568 is defined as Pass. When the first signal intensity of Alexa 568 is lower than the first threshold, the first signal intensity of Alexa 568 is defined as No.

For the same concept, the second signal intensities can be defined as Pass or No depending on whether the second signal intensities are higher or lower than the second threshold, respectively.

The first threshold and the second threshold may be set according to actual situations. Table 1 below is made according to the concept described above and in FIG. 8A, in which the first signal intensity is denoted by 104a and the second signal intensity is denoted by 104b.

TABLE 1

| angle-sensitive filter | dye | 104a | 104b |
|---|---|---|---|
| shortpass | Alexa 568 | Pass | Pass |
|  | Alexa 647 | Pass | No |
| bandpass | Alexa 568 | No | Pass |
|  | Alexa 647 | Pass | No |
| longpass | Alexa 568 | No | Pass |
|  | Alexa 647 | Pass | Pass |

According to a combination of the definitions of the first signal intensity and the second signal intensity, the two dyes can be distinguished. For example, in the embodiment where the angle-sensitive filter is a shortpass filter, the first signal intensity of Alexa 568 is defined as Pass and the second signal intensity of Alexa 568 is defined as Pass, and the first signal intensity of Alexa 647 is defined as Pass and the second signal intensity of Alexa 647 is defined as No. When the combination of the first signal intensity and the second signal intensity is Pass and Pass (or Pass and No), it can be learned that the light is Alexa 568 (or Alexa 647).

In the embodiment where the angle-sensitive filter is a bandpass filter, for the same concept as described above, the light can be distinguished.

In the embodiment where the angle-sensitive filter is a longpass filter, for the same concept as described above, the light can be distinguished.

Alternatively, first signal intensity ratios of the second signal intensity to the first signal intensity (denoted by 104b/104a) can also be calculated to distinguish the two different dyes, namely two different lights. The first signal intensity ratios are defined as H or L depending on whether the first signal intensity ratio is higher or lower than a predetermined ratio. For example, when the first signal intensity ratio of 104b/104a of Alexa 568 is higher than the predetermined ratio, the first signal intensity ratio of 104b/104a of Alexa 568 is defined as H. When the first signal intensity ratio of 104b/104a of Alexa 568 is lower than the predetermined ratio, the first signal intensity ratio of 104b/104a of Alexa 568 is defined as L.

Table 2 below is made according to the concept described above and in FIG. 8A, in which the first signal intensity is denoted by 104a and the first signal intensity ratio is denoted by 104b/104a.

TABLE 2

| angle-sensitive filter | dye | 104a | 104b/104a |
|---|---|---|---|
| shortpass | Alexa 568 | 0.62 | 0.8 (H) |
|  | Alexa 647 | 0.81 | 0.15 (L) |
| bandpass | Alexa 568 | 0.2 | 2.5 (H) |
|  | Alexa 647 | 0.8 | 0.15 (L) |
| longpass | Alexa 568 | 0.2 | 2.7 (H) |
|  | Alexa 647 | 0.91 | 1 (L) |

According to the definitions of the first signal intensity ratio of 104b/104a, the two dyes can be distinguished. For example, in the embodiment where the angle-sensitive filter is a shortpass filter, the first signal intensity ratio of 104b/104a of Alexa 568 is higher than the predetermined ratio and the first signal intensity ratio of 104b/104a of Alexa 568 is defined as H. The first signal intensity ratio of 104b/104a of Alexa 647 is lower than the predetermined ratio and the first signal intensity ratio of 104b/104a of Alexa 647 is defined as L. As a result, if the definition of the first signal intensity ratio of 104b/104a is H, it can be learned that the light is emitted by Alexa 568. If the definition of the first signal intensity ratio of 104b/104a is L, it can be learned that the light is emitted by Alexa 647.

In the embodiment where the angle-sensitive filter is a bandpass filter, for the same concept as described above, the light can be distinguished.

In the embodiment where the angle-sensitive filter is a longpass filter, for the same concept as described above, the light can be distinguished.

Figure 8B:
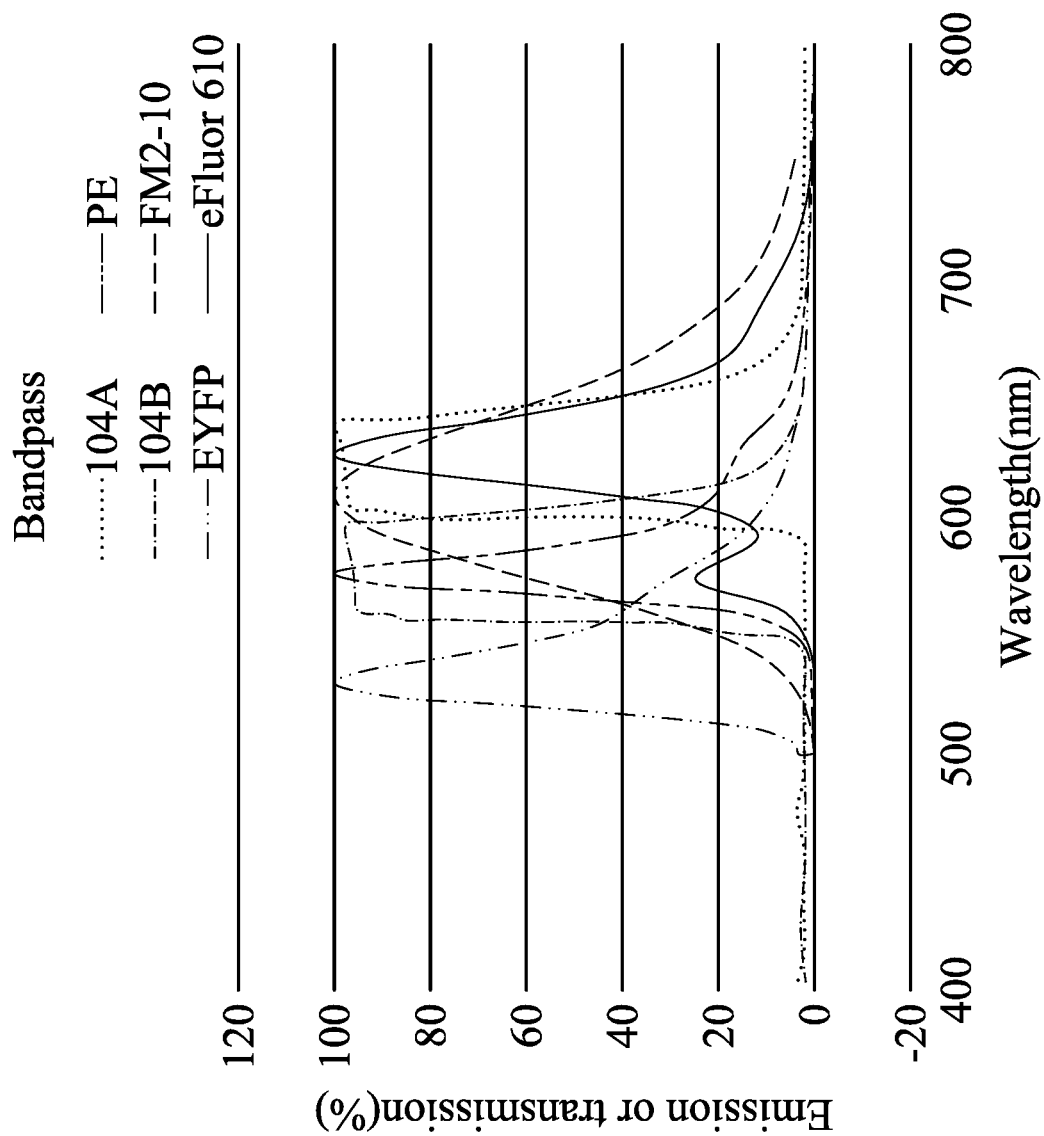

FIG. 8B is an analytical graph of emission or transmission versus wavelength in accordance with some embodiments of the present disclosure. 104A represents the wavelength of the light that enters the angle-sensitive filter 108 at the first incident angle θ1 or θ1' and is received by the first pixel 104a. 104B represents the wavelength of the light that enters the angle-sensitive filter 108 at the second incident angle θ2 or θ2' and is received by the second pixel 104b. EYFP, PE, FM2-10 and eFluor 610 are four dyes that emit four different lights.

Table 3 below is made according to the concept previously discussed and FIG. 8B, in which the first signal intensity is denoted by 104a and the second signal intensity is denoted by 104b.

TABLE 3

| angle-sensitive filter | dye | 104a | 104b |
|---|---|---|---|
| bandpass | EYFP | No | No |
| | PE | No | Pass |
| | FM2-10 | Pass | Pass |
| | eFluor 610 | Pass | No |

According to a combination of the definitions of the first intensity and the second intensity, the four dyes can be distinguished based on the same concept as described above.

Figure 8C:
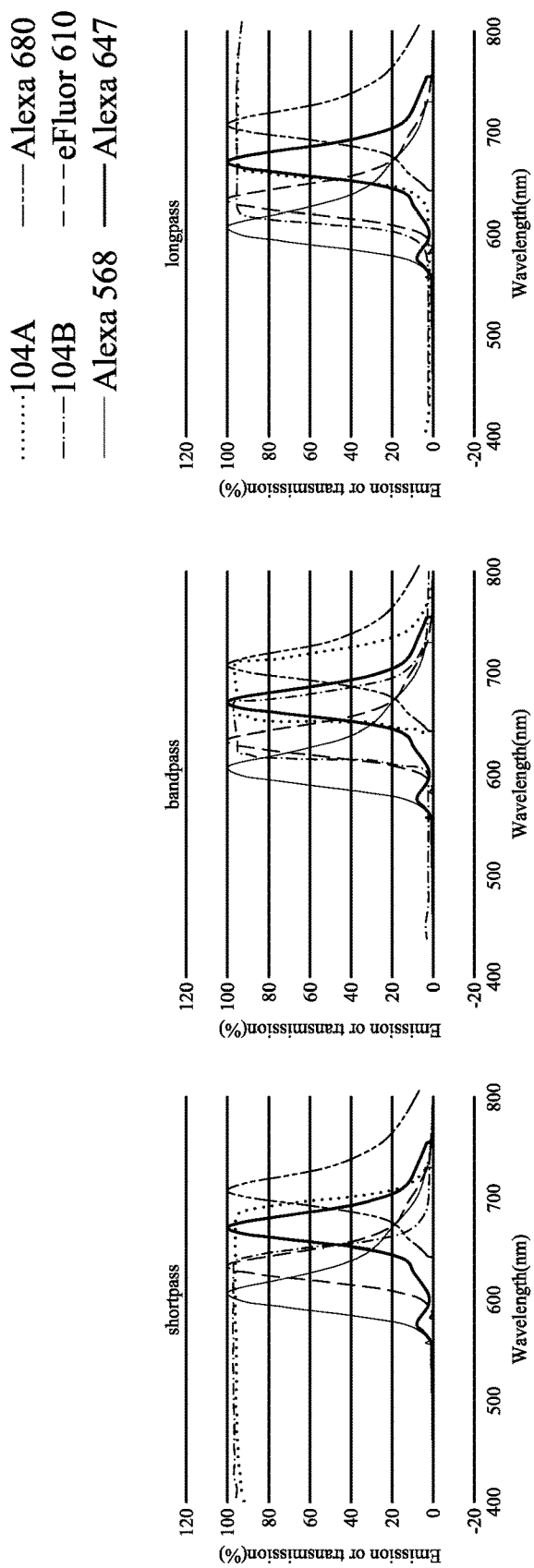

Alternatively, the first signal intensity ratios of the second signal intensity to the first signal intensity (denoted by 104b/104a) can also be calculated to distinguish the four different dyes, namely four different lights. FIG. 8C is analytical graphs of emission or transmission versus wavelength in accordance with some embodiments of the present disclosure. The leftmost graph is an embodiment where the angle-sensitive filter is a shortpass filter. The middle graph is an embodiment where the angle-sensitive filter is a bandpass filter. The rightmost graph is an embodiment where the angle-sensitive filter is a longpass filter. 104A represents the wavelength of the light that enters the angle-sensitive filter 108 at the first incident angle θ1 or θ1' and is received by the first pixel 104a. 104B represents the wavelength of the light that enters the angle-sensitive filter 108 at the second incident angle θ2 or θ2' and is received by the second pixel 104b. Alexa 568, eFluor 610, Alexa 647 and Alexa 680 are four dyes that emit four different lights. The first signal intensity ratios of 104b/104a are defined as H or L depending on whether the first signal intensity ratio is higher or lower than a predetermined ratio. Then in the groups which are defined as H, the first signal intensities are defined as H or L depending on whether the first signal intensity is higher or lower than a first threshold, or the second signal intensities are defined as H or L depending on whether the second signal intensity is higher or lower than a second threshold.

Table 4 below is made according to the concept described above and in FIG. 8C, in which the first signal intensity is denoted by 104a, the second signal intensity is denoted by 104b, and the first signal intensity ratio is denoted by 104b/104a.

According to the definition of the first signal intensity ratio of 104b/104a and the definition of the first signal intensity or the second signal intensity, the four dyes can be distinguished. For example, in the embodiment where the angle-sensitive filter is a shortpass filter, the first signal intensity ratio of 104b/104a of Alexa 568 and the first signal intensity ratio of eFluor 610 are higher than the predetermined ratio and the first signal intensity ratio of 104b/104a of Alexa 568 and the first signal intensity ratio of eFluor 610 are defined as H. The first signal intensity ratio of 104b/104a of Alexa 647 and the first signal intensity ratio of 104b/104a of Alexa 680 are lower than the predetermined ratio and the first signal intensity ratio of 104b/104a of Alexa 647 and the first signal intensity ratio of 104b/104a of Alexa 680 are defined as L. Then in Group H, the first signal intensity of Alexa 568 is higher than the first threshold and the first signal intensity of Alexa 568 is defined as H. The first signal intensity of eFluor 610 is lower than the first threshold and the first signal intensity of eFluor 610 is defined as L. In Group L, the first signal intensity of Alexa 647 is higher than the other first threshold and the first signal intensity of Alexa 647 is defined as H. The first signal intensity of Alexa 680 is lower than the other first threshold and the first signal intensity of Alexa 680 is defined as L. As a result, if the definition of the first signal intensity ratio of 104b/104a is H and the definition of the first signal intensity is H, it can be learned that the light is emitted by Alexa 568. Therefore, the light can be distinguished according to the same concept as described above.

In the embodiment where the angle-sensitive filter is a bandpass filter, for the same concept as described above, the light can be distinguished.

In the embodiment where the angle-sensitive filter is a longpass filter, for the same concept as described above, the light can be distinguished.

Therefore, one kind of a filter is sufficient to distinguish at most four different lights. On the contrary, the existing biosensor still required more than one kind of a filter to distinguish different lights.

Aspect 2

Figure 9A:
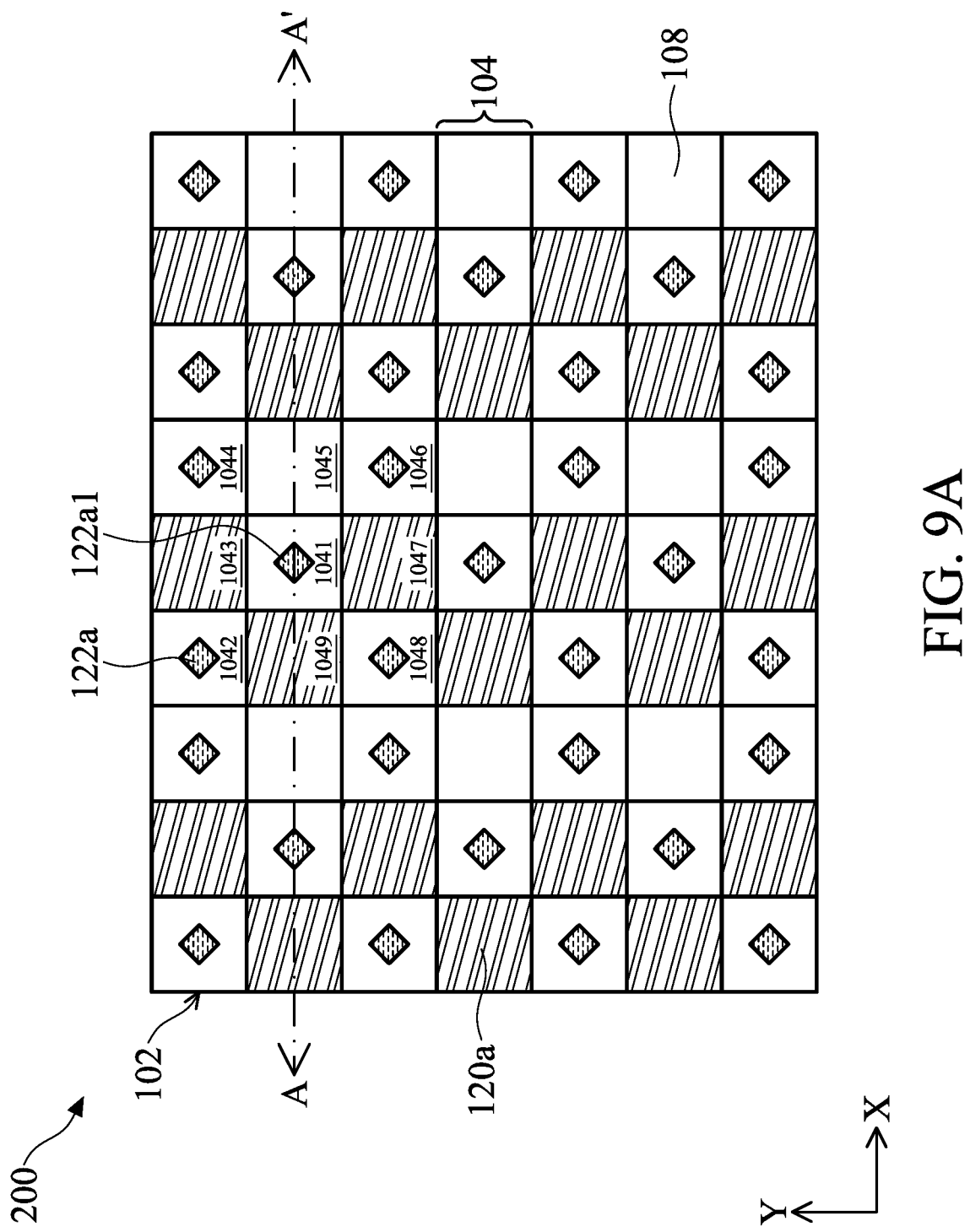
FIG. 9A illustrates a top view of a biosensor in accordance with some embodiments of the present disclosure.
Figure 9B:
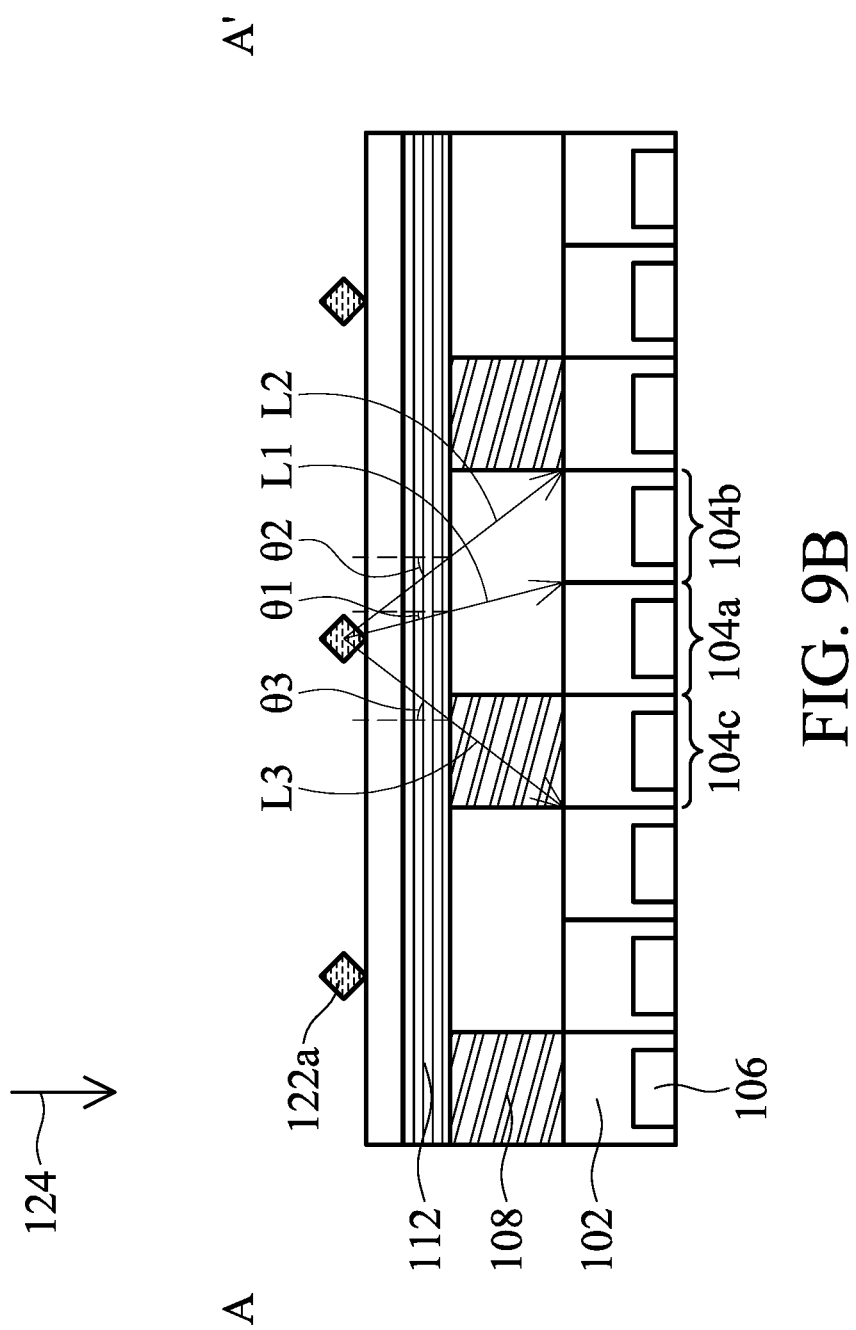
FIG. 9B illustrates a cross-sectional view of the biosensor of FIG. 9A in accordance with some embodiments of the present disclosure.

In the aspect, the biosensor 200 includes the angle-sensitive filter 108 and the first color filter 120a. FIG. 9A illustrates an arrangement of analytes 122a on the biosensor 200. FIG. 9B illustrate a cross-sectional view of FIG. 9A along line A-A'. In the embodiment, it is assumed that the light emitted by one analyte can reach the pixels that are one pixel away from the pixel under the light. In other words, the closest eight pixels surround the pixel under the light. For example, as illustrated in FIG. 9A, the pixel 1041 is under the light emitted by the analyte 122a1, and the pixels 1042-1049 are the pixels that are only one pixel away from the pixel 1041. The light emitted by the analyte 122a1 can reach the pixels 1041-1049.

TABLE 4

| | angle-sensitive filter | | | | | | | | |
|---|---|---|---|---|---|---|---|---|---|
| | shortpass | | | bandpass | | | longpass | | |
| dye | 104a | 104b | 104b/104a | 104a | 104b | 104b/104a | 104a | 104b | 104b/104a |
| Alexa 568 | 0.63(H) | 0.63 | 1 (H) | 0.08 | 0.4(H) | 5(H) | 0.08 | 0.4(H) | 5(H) |
| eFluor 610 | 0.25(L) | 0.25 | 1 (H) | 0.05 | 0.25(L) | 5(H) | 0.05 | 0.25(L) | 5(H) |
| Alexa 647 | 0.9(H) | 0.23 | 0.25 (L) | 0.9 | 0.9(H) | 1(L) | 0.9 | 0.9(H) | 1(L) |
| Alexa 680 | 0.2(L) | 0 | 0 (L) | 0.4 | 0(L) | 0(L) | 0.4 | 0.4(L) | 1(L) |

As shown in FIG. 9A, the first color filters 120a are separated by two pixels that are covered by the angle-sensitive filter 108 in a direction X, and the first color filters 120 are separated by one pixel that is covered by the angle-sensitive filter 108 in a direction Y perpendicular to the direction X.

The analytes 122a are placed on the biosensor 200. One analyte 122a has an area equal to or smaller than that of one pixel.

In the case of fluorescence, an excitation light 124 irradiates the analytes 122a or 122b (not shown). The excitation light 124 moves from one side of the biosensor 200 to the opposite side so that the analyte 122a will be excited and emit a light L in order, but not simultaneously. For example, the excitation light 124 may move along the direction X. In the embodiment, the direction X is a direction from a left side to a right side of the biosensor 200 in top view, as shown in FIG. 9A.

Referring to FIG. 9B, the analytes 122a are excited by the excitation light 124 and emit a light L. The excitation light rejection filter 112 is disposed to block the excitation light 124 so that the excitation light 124 can be prevented from entering the substrate 102 and being absorbed by the photodiodes 106. A first portion L1 of the light L enters the angle-sensitive filter 108 at a first incident angle $\theta 1$. A pixel that receives the first portion L1 of the light L is a first pixel 104a. The first incident angle $\theta 1$ is an angle from 0 degrees to the maximum incident angle of the first portion L1 of the light L that can be received in the first pixel 104a.

A second portion L2 of the light L enters the angle-sensitive filter 108 at a second incident angle $\theta 2$. A pixel that receives the second portion L2 of the light L is a second pixel 104b. The second incident angle $\theta 2$ is an angle from the maximum incident angle of the first portion L1 of the light L that can be received in the first pixel 104a to the maximum incident angle of the second portion L2 of the light L that can be received in the second pixel 104b. The first incident angle $\theta 1$ is smaller than the second incident angle $\theta 2$.

A third portion L3 of the light L enters the first color filter 120a at a third incident angle $\theta 3$. A pixel that receives the third portion L3 of the light L is a third pixel 104c. The third incident angle $\theta 3$ is angle from the maximum incident angle of the first portion L1 of the light L that can be received in the first pixel 104a to the maximum incident angle of the third portion L3 of the light L that can be received in the third pixel 104c.

In some embodiments, the first incident angle $\theta 1$ is from 0 degrees to 40 degrees, the second incident angle $\theta 2$ is from 20 degrees to 70 degrees, and the third incident angle $\theta 3$ is from 20 degrees to 70 degrees. In some embodiments, the first incident angle $\theta 1$ is from 0 to 30 degrees, the second incident angle $\theta 2$ is from 20 degrees to 60 degrees, and the third incident angle $\theta 3$ is from 20 degrees to 60 degrees. Since the first incident angle $\theta 1$ is smaller than the second incident angle $\theta 2$, the second portion L2 will be spectrum-shifted more significantly than the first portion L1.

Figure 9C:
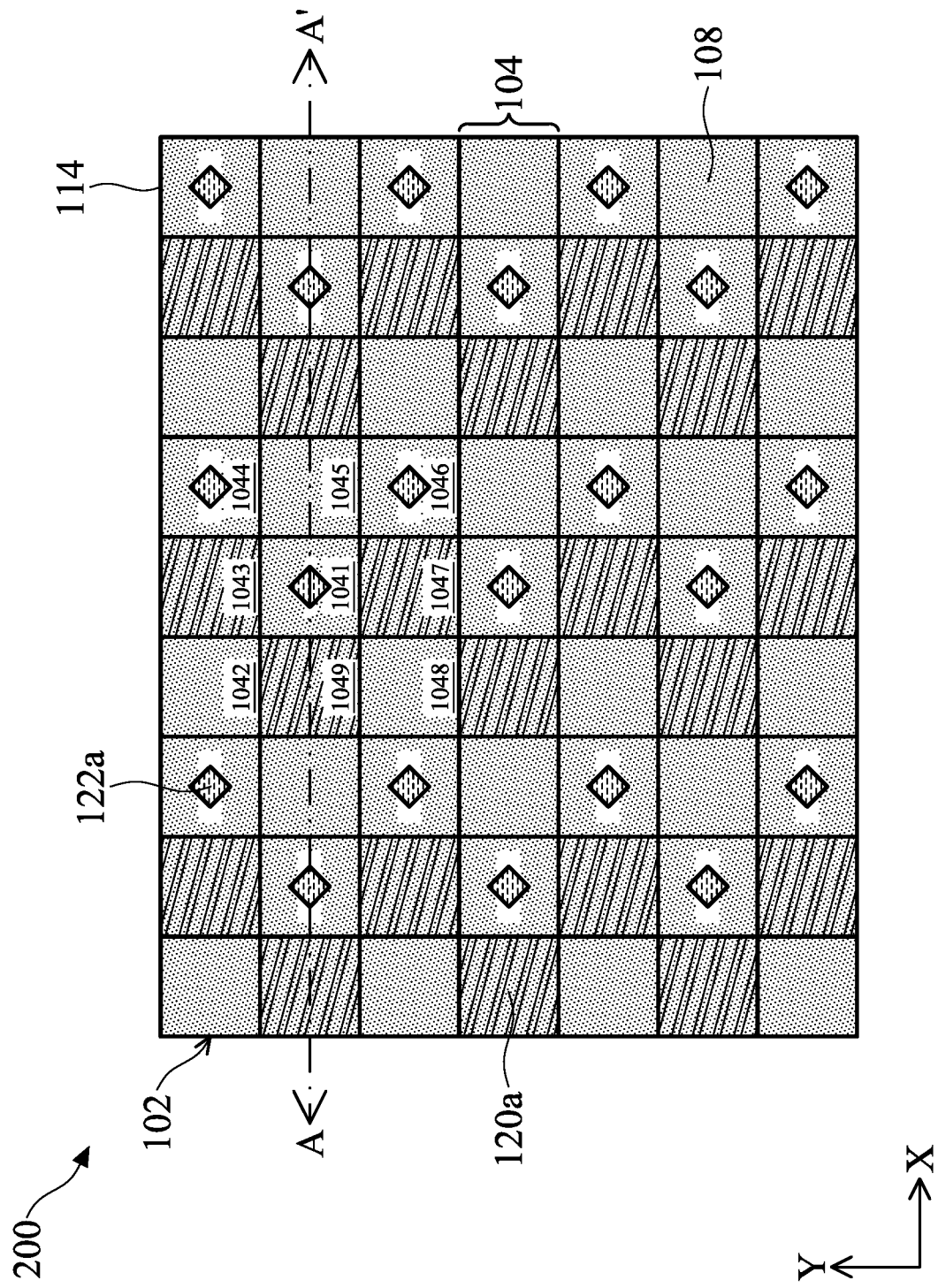
FIG. 9C illustrates a top view of a biosensor in accordance with some embodiments of the present disclosure.
Figure 9D:
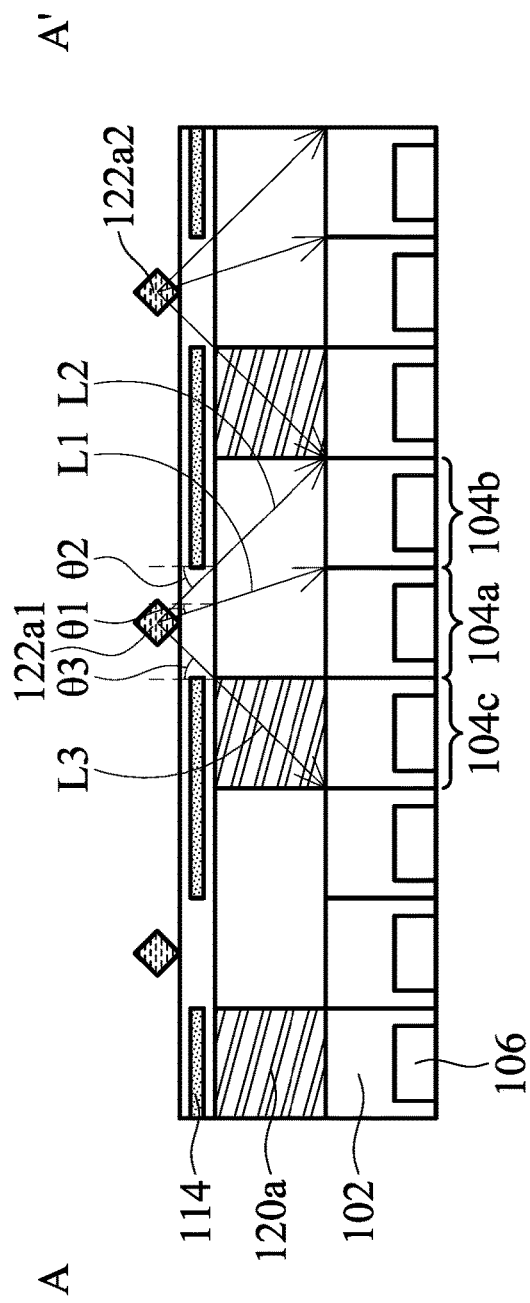
FIGS. 9D-9E illustrate cross-sectional views of the biosensor of FIG. 9C in accordance with some embodiments of the present disclosure.
Figure 9E:
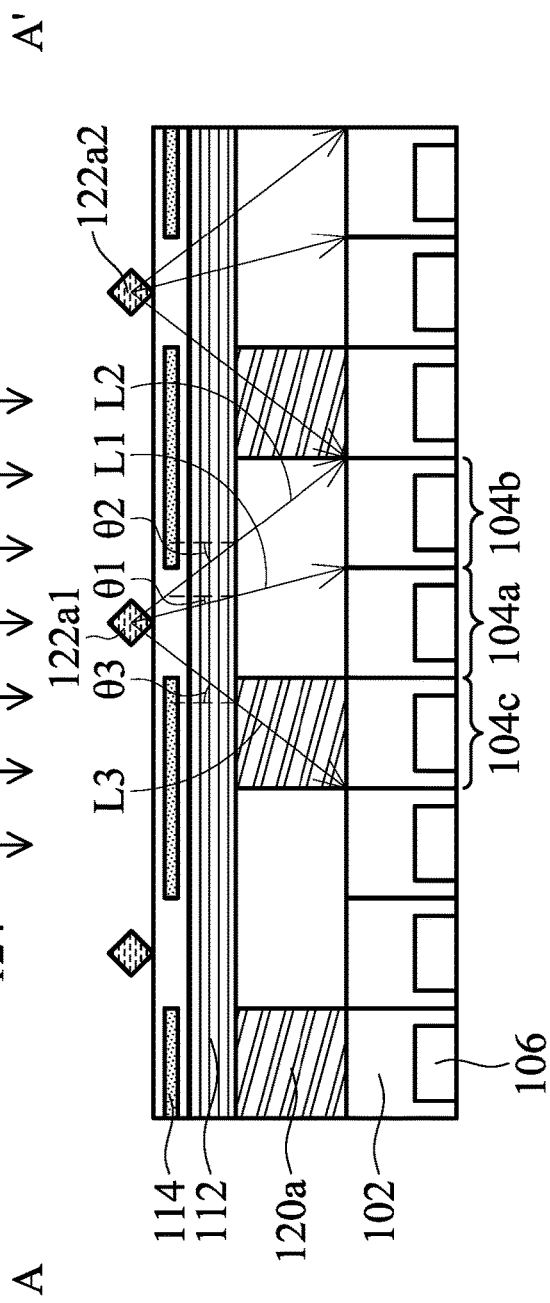

FIG. 9C illustrates a top view of an arrangement of analytes 122a on the biosensor 200 in accordance with some embodiments of the present disclosure. FIGS. 9D and 9E illustrate cross-sectional views of FIG. 9C along line A-A', wherein FIG. 9D represents an example of bioluminescence and FIG. 9E represents an example of fluorescence. Some of the differences between the embodiments of FIG. 9C and FIG. 9A are that the biosensor 200 includes the aperture structure 114 and that the analytes 122a emit the light L at the same time.

As illustrated in FIG. 9C, the aperture structure 114 includes openings that correspond to one analyte 122a, respectively, so that the light L can be further controlled to irradiate only certain areas of the substrate 102.

To be specific, referring to FIG. 9D, the aperture structure 114 prevents the light L emitted by the analyte 122a2 from reaching the pixel 104b, and allows the light L emitted by the analyte 122a1 adjacent to the analyte 122a2 to reach the pixel 104b. Therefore, the photodiode 106 in the pixel 104b only receives the light from analyte 122a1, thereby avoiding cross-talk. Therefore, the analytes 122a may be placed on the biosensor 200 at two-pixel intervals to avoid cross-talk in the X-direction. The aperture opening in the Y-direction may be smaller than that in the X-direction, and therefore the analytes 122a may be placed on the biosensor 200 at one-pixel intervals to avoid cross-talk in the Y-direction. In other words, any two adjacent analytes 122a are spaced apart from each other by one pixel 104 in the Y-direction and by two pixels 104 in the X-direction.

In some embodiments, from the top view of FIG. 9C, the shape of the openings may be a rectangle, a circle, or a triangle, but it is not limited thereto.

Referring to FIG. 9E, the difference between the embodiments of FIGS. 9E and 9D is that the biosensor 200 of FIG. 9E further includes the excitation light rejection filter 112.

Although the biosensors 200 of FIGS. 9D and 9E include the aperture structure 114, it should be understood that the same concept as recited in the embodiment of FIGS. 9A and 9B can also be applied to the embodiments of FIGS. 9D and 9E, which will not be repeated for the sake of brevity.

Figure 9F:
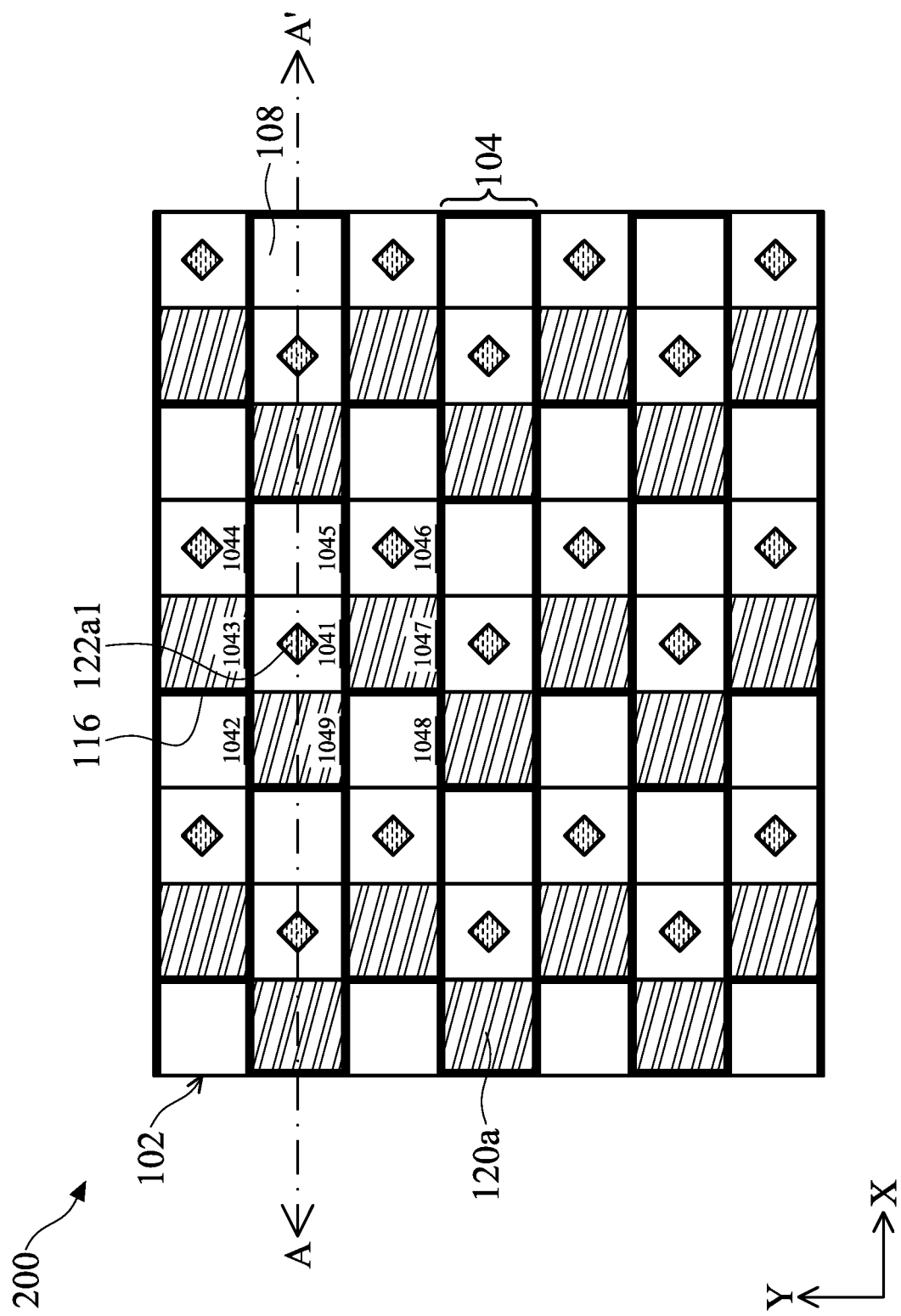
FIG. 9F illustrates a top view of a biosensor in accordance with some embodiments of the present disclosure.

FIG. 9F illustrates a top view of an arrangement of analytes 122a on the biosensor 200 in accordance with some embodiments of the present disclosure. FIGS. 9G and 9H illustrate cross-sectional views of FIG. 9F along line A-A', wherein FIG. 9G represents an example of bioluminescence and FIG. 9H represents an example of fluorescence. In the embodiment, it is assumed that the light emitted by the analytes can reach the pixels that are one pixel away from the pixel under the light. For example, as illustrated in FIG. 9F, the pixel 1041 is under the light L emitted by the analyte 122a1, and the pixels 1042-1049 are the pixels that are only one pixel away from the pixel 1041. Some of the differences between the embodiments of FIG. 9F and FIG. 9A are that the biosensor 200 includes the shielding layer 116 and that the analytes 122a emit the light L at the same time.

Since the shielding layer 116 can reflect the light L, the second pixel 104b may receive the second portion L2' of the light L that enters the angle-sensitive filter 108 at a second incident angle $\theta 2'$ greater than the second incident angle $\theta 2$ of the embodiments in FIGS. 9A-9E. The third pixel 104c may also receive the third portion L3' of the light L that enters the first color filter 120a at a third incident angle $\theta 3'$ greater than the third incident angle $\theta 3$ of the embodiments in FIGS. 9A-9E. For example, the first incident angle $\theta 1$ may be from 0 degrees to 60 degrees. The second incident angle $\theta 2'$ may be from 40 degrees to 85 degrees. The third incident angle $\theta 3'$ may be from 40 degrees to 85 degrees. However, it should be appreciated that the first incident angle $\theta 1'$, the second incident angle $\theta 2'$ and the third incident angle $\theta 3'$ are determined according to the heights of the analyte, shielding layer and photodiode.

Figure 10A:
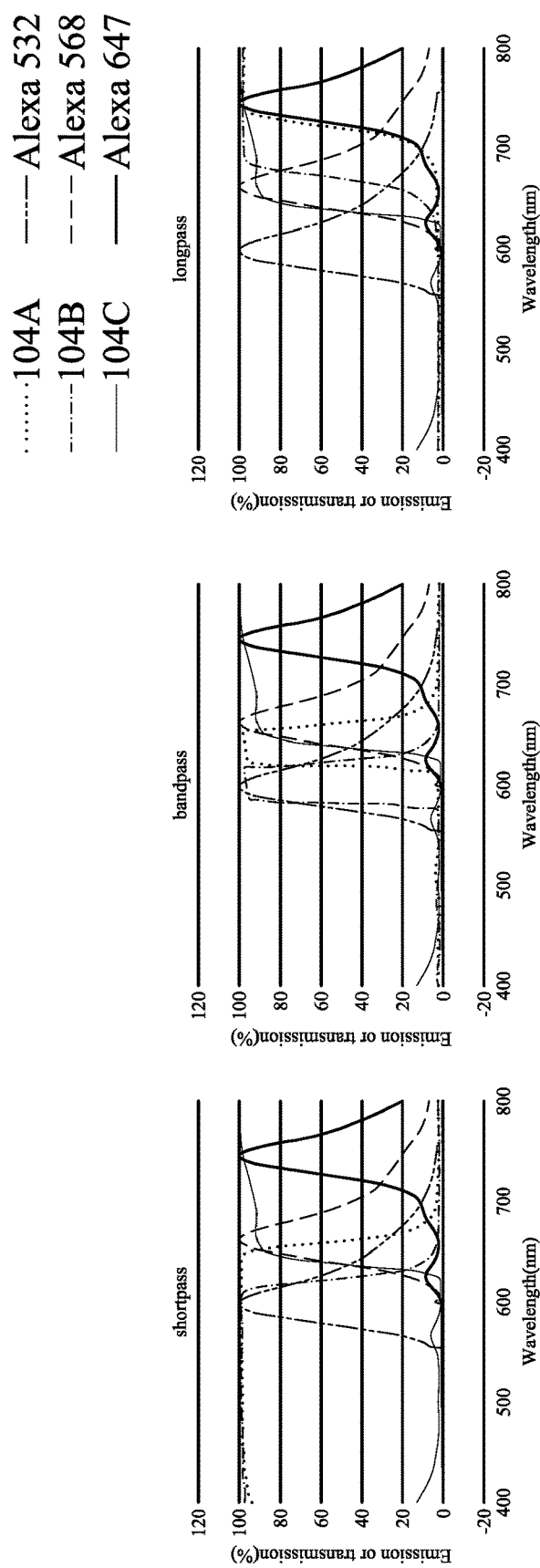
FIG. 10A are analytical graphs of emission or transmission versus wavelength in accordance with some embodiments of the present disclosure.

FIG. 10A is analytical graphs of emission or transmission versus wavelength in accordance with some embodiments of the present disclosure. 104A represents the wavelength of the light that enters the angle-sensitive filter 108 at the first incident angle $\theta 1$ or $\theta 1'$ and is received by the first pixel 104a. 104B represents the wavelength of the light that enters the angle-sensitive filter 108 at the second incident angle θ2 or θ2' and is received by the second pixel 104b. 104C represents the wavelength of the light that enters the first color filter at the third incident angle θ3 or θ3' and is received by the third pixel 104c. Alexa 532, Alexa 568 and Alexa 647 are three dyes that emit three different lights.

For the same concept as described previously, the signal intensities can be defined as Pass or No. The first threshold, the second threshold and the third threshold may be set according to actual situations. Table 5 below is made according to the concept described above and in FIG. 10A, in which the first signal intensity is denoted by 104a, the second signal intensity is denoted by 104b, and the third signal intensity is denoted by 104c.

TABLE 5

| angle-sensitive filter | dye | 104a | 104b | 104c |
|---|---|---|---|---|
| shortpass | Alexa 532 | Pass | Pass | Pass |
| | Alexa 568 | Pass | No | Pass |
| | Alexa 647 | No | No | Pass |
| bandpass | Alexa 532 | Pass | Pass | Pass |
| | Alexa 568 | Pass | No | Pass |
| | Alexa 647 | No | No | Pass |
| longpass | Alexa 532 | No | No | Pass |
| | Alexa 568 | No | Pass | Pass |
| | Alexa 647 | Pass | Pass | Pass |

According to a combination of the definitions of the first signal intensity, the second signal intensity and the third signal intensity, the three dyes can be distinguished as previously described.

Although there are only three dyes in the embodiments, since there are eight combinations of definitions of the first signal intensity, the second signal intensity and the third signal intensity, it should be understood that at most eight dyes can be distinguished.

Alternatively, first signal intensity ratios of the first signal intensity to the third signal intensity (denoted by 104a/104c), and second signal intensity ratios of the second signal intensity to the third signal intensity (denoted by 104b/104c) can also be calculated to distinguish the three different dyes, namely three different lights. A graph is plotted according to the first signal intensity ratio and the second signal intensity ratio. To be specific, a cluster distribution graph of the first signal intensity ratio vs. the second signal intensity ratio is plotted.

Figure 10B:
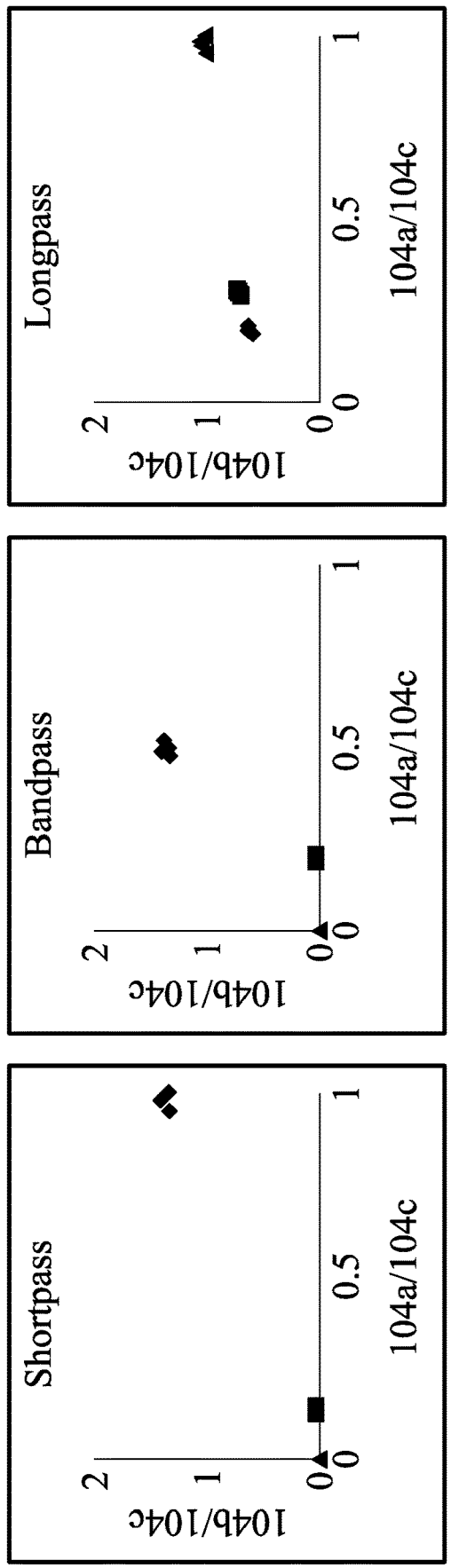
FIG. 10B is an analytical graph of a ratio versus another ratio in accordance with some embodiments of the present disclosure.

For example, FIG. 10B is analytical graphs of the first signal intensity ratio vs. the second signal intensity ratio plotted in accordance with some embodiments of the present disclosure. The X-axis represents the first signal intensity ratio. The Y-axis represents the second signal intensity ratio. Alexa 532 is represented by diamond. Alexa 568 is represented by square. Alexa 647 is represented by triangle.

In the embodiment where the angle-sensitive filter is a shortpass filter, the data points of Alexa 532, Alexa 568 and Alexa 647 are clustered at different positions in the graph, respectively. As a result, if a dye is located at the position where the data points of Alexa 532 are clustered, it can be learned that the light is emitted by Alexa 532. If a dye is located at the position where the data points of Alexa 568 are clustered, it can be learned that the light is emitted by Alexa 568. If a dye is located at the position where the data points of Alexa 647 are clustered, it can be learned that the light is emitted by Alexa 647.

In the embodiment where the angle-sensitive filter is a bandpass filter, the data points of Alexa 532, Alexa 568 and Alexa 647 are clustered at different positions at the graph, respectively. As a result, for the same concept as described above, a dye can be distinguished depending on where the dye is located in the cluster distribution plot.

In the embodiment where the angle-sensitive filter is a longpass filter, the data points of Alexa 532, Alexa 568 and Alexa 647 are clustered at different positions at the graph, respectively. As a result, for the same concept as described above, a dye can be distinguished depending on where the dye is located in the cluster distribution plot.

Although there are only three dyes in the embodiments, it should be understood that more than three dyes can be distinguished.

Aspect 3

Figure 11A:
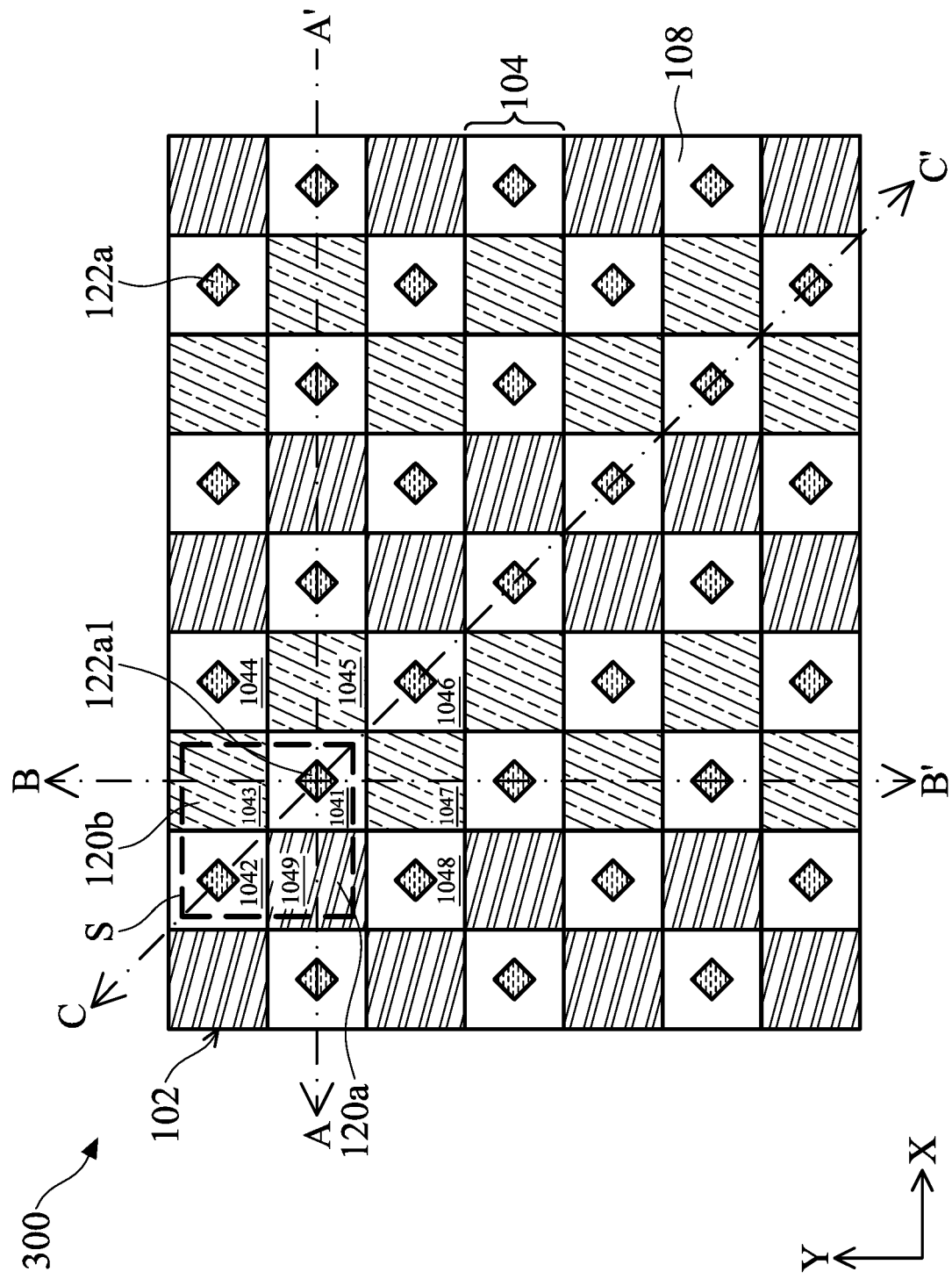
FIG. 11A illustrates a top view of a biosensor in accordance with some embodiments of the present disclosure.
Figure 11B:
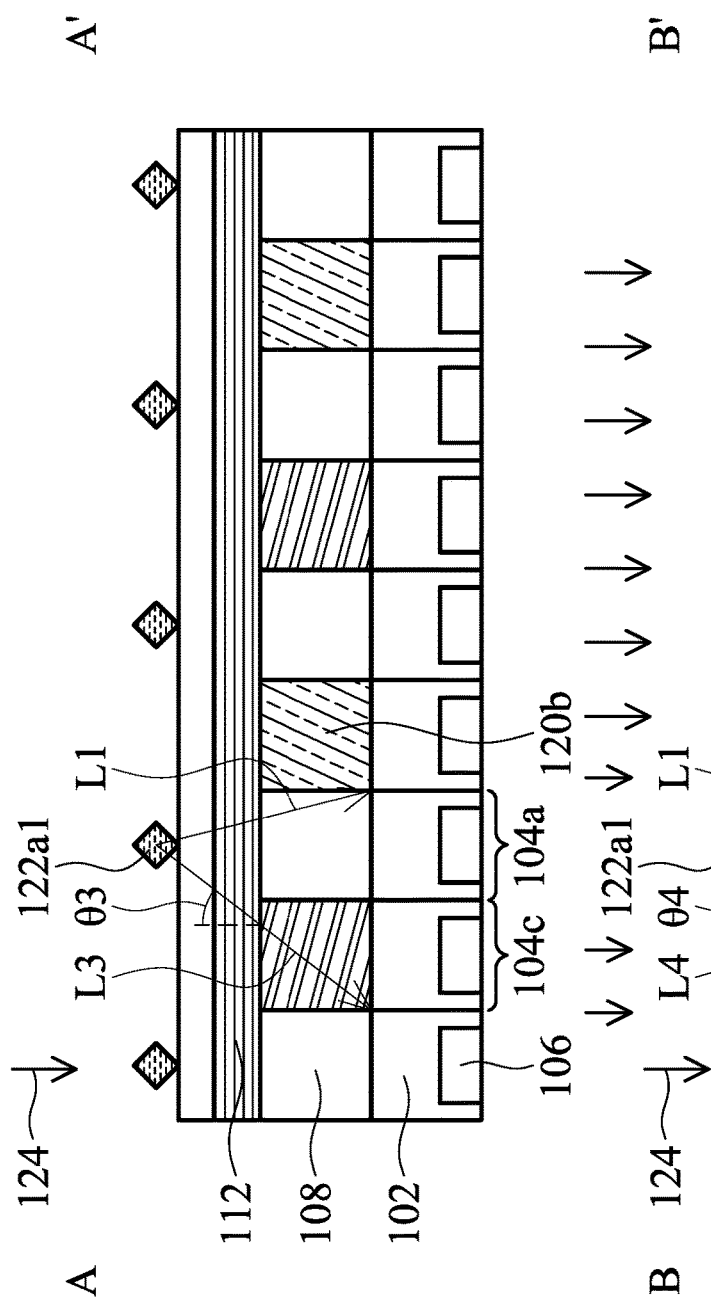
FIGS. 11B-11D illustrate cross-sectional views of the biosensor of FIG. 11A in accordance with some embodiments of the present disclosure.
Figure 11C:
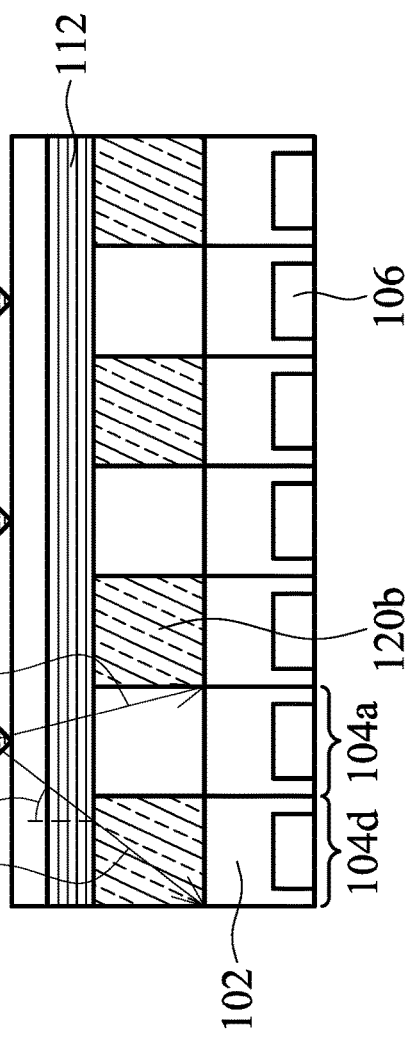
Figure 11D:
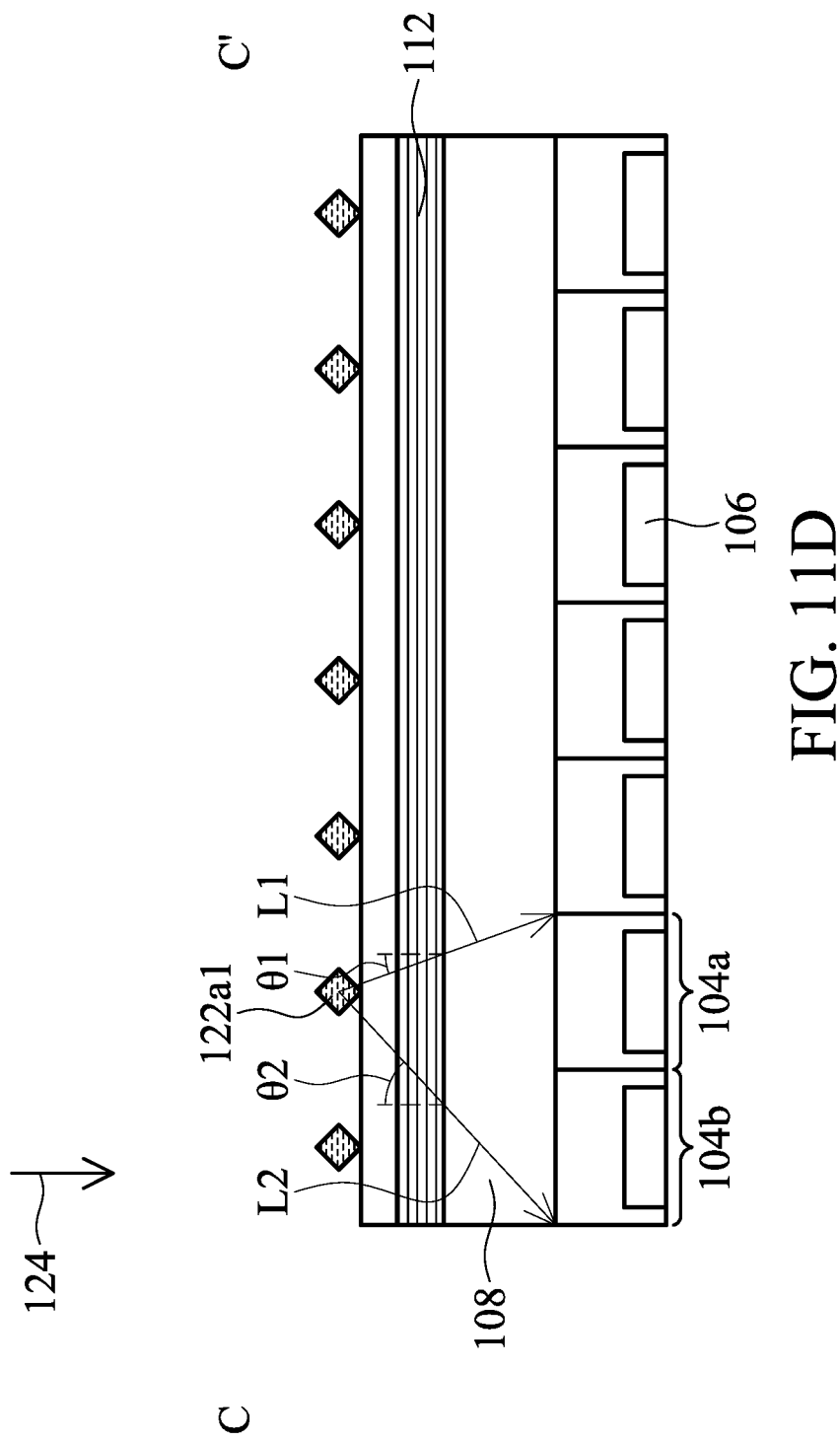

In the aspect, the biosensor 300 includes the angle-sensitive filter 108, the first color filter 120a and the second color filter 120b. FIG. 11A illustrates an arrangement of analytes 122a on the biosensor 300. FIG. 11B illustrates a cross-sectional view of FIG. 11A along line A-A'. FIG. 11C illustrates a cross-sectional view of FIG. 11A along line B-B'. FIG. 11D illustrates a cross-sectional view of FIG. 11A along line C-C'. In the embodiment, it is assumed that the light emitted by one analyte can reach the pixels that are one pixel away from the pixel under the light. In other words, the closest eight pixels surround the pixel under the light. For example, as illustrated in FIG. 11A, the pixel 1041 is under the light emitted by the analyte 122a1, and the pixels 1042-1049 are the pixels that are only one pixel away from the pixel 1041. The light emitted by the analyte 122a1 can reach the pixels 1041-1049.

As shown in FIG. 11A, the first color filters 120a, the angle-sensitive filter 108, the second color filters 120b are disposed on the substrate 102 in an order of first color filter/angle-sensitive filter/second color filter/angle-sensitive filter in a direction X. The first color filters 120a are separated by one pixel that is covered by the angle-sensitive filter 108 in a direction Y perpendicular to the direction X. The second color filters 120b are separated by one pixel that is covered by the angle-sensitive filter 108. In other words, the first color filters 120a are disposed on the substrate 102 in an order of first color filter/angle-sensitive filter in the direction Y, and the second color filters 120b are disposed on the substrate 102 in an order of second color filter/angle-sensitive filter in the direction Y. A set of pixels S that includes one pixel that is covered by the first color filter 120a, one pixel that is covered by the second color filter 120b, and two pixels that are covered by the angle-sensitive filter 108. The two pixels that are covered by the angle-sensitive filter are not separated by the first color filter 120a or the second color filter 120b.

The analytes 122a are placed on the biosensor 300. One analyte 122a has an area equal to or smaller than that of one pixel.

In the case of fluorescence, an excitation light 124 irradiates the analytes 122a or 122b (not shown). The excitation light 124 moves from one side of the biosensor 300 to the opposite side so that the analyte 122a will be excited and emit a light L in order, but not simultaneously. For example, the excitation light 124 may move along the direction X. In the embodiment, the direction X is a direction from a left side to a right side of the biosensor 300 in top view, as shown in FIG. 11A.

Referring to FIGS. 11B-11D, the analytes 122a are excited by the excitation light 124 and emit a light L. The excitation light rejection filter 112 is disposed to block the excitation light 124 so that the excitation light 124 can be prevented from entering the substrate 102 and being absorbed by the photodiodes 106. A first portion L1 of the light L enters the angle-sensitive filter 108 at a first incident angle θ1, as shown in FIG. 11D.

A pixel that receives the first portion L1 of the light L is a first pixel 104a. The first incident angle θ1 is an angle from 0 degrees to the maximum incident angle of the first portion L1 of the light L that can be received in the first pixel 104a.

A second portion L2 of the light L enters the angle-sensitive filter 108 at a second incident angle θ2. A pixel that receives the second portion L2 of the light L is a second pixel 104b. The second incident angle θ2 is an angle from the maximum incident angle of the first portion L1 of the light L that can be received in the first pixel 104a to the maximum incident angle of the second portion L2 of the light L that can be received in the second pixel 104b. The first incident angle θ1 is smaller than the second incident angle θ2.

A third portion L3 of the light L enters the first color filter 120a at a third incident angle θ3. A pixel that receives the third portion L3 of the light L is a third pixel 104c. The third incident angle θ3 is angle from the maximum incident angle of the first portion L1 of the light L that can be received in the first pixel 104a to the maximum incident angle of the third portion L3 of the light L that can be received in the third pixel 104c.

A fourth portion L4 of the light L enters the second color filter 120b at a fourth incident angle θ4, as shown in FIG. 11C. A pixel that receives the fourth portion L4 of the light L is a fourth pixel 104d. The fourth incident angle θ4 is an angle from the maximum incident angle of the first portion L1 of the light L that can be received in the first pixel 104a to the maximum incident angle of the fourth portion L4 of the light L that can be received in the fourth pixel 104d.

In some embodiments, the first incident angle θ1 is from 0 degrees to 40 degrees, the second incident angle θ2 is from 20 degrees to 70 degrees, the third incident angle θ3 is from 20 degrees to 70 degrees, and the fourth incident angle θ4 is from 20 degrees to 70 degrees. In some embodiments, the first incident angle θ1 is from 0 to 30 degrees, the second incident angle θ2 is from 20 degrees to 60 degrees, the third incident angle θ3 is from 20 degrees to 60 degrees, and the fourth incident angle θ4 is from 20 degrees to 60 degrees. Since the first incident angle θ1 is smaller than the second incident angle θ2, the second portion L2 will be spectrum-shifted more significantly than the first portion L1.

Figure 11E:
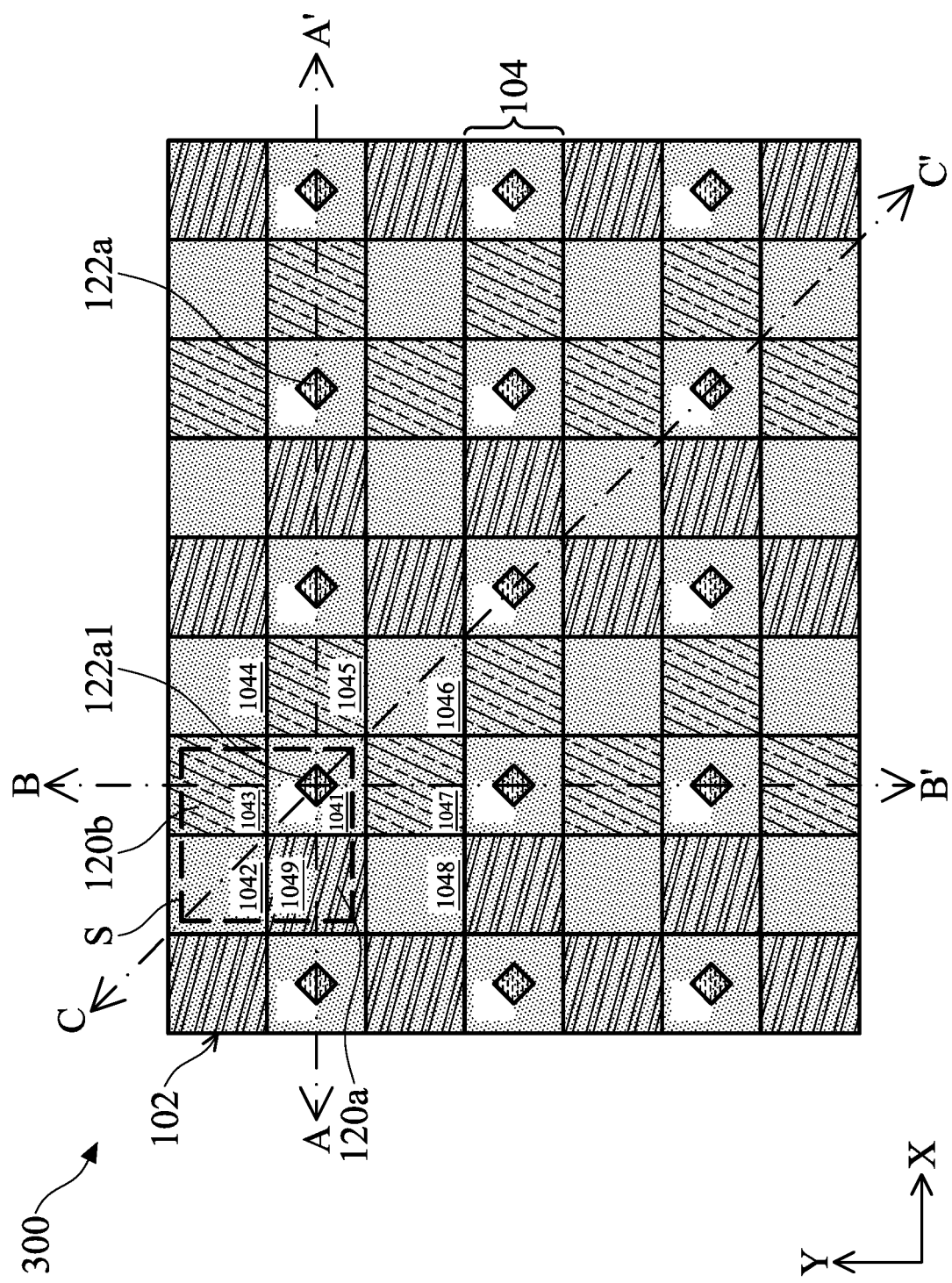
FIG. 11E illustrates a top view of a biosensor in accordance with some embodiments of the present disclosure.
Figure 11F:
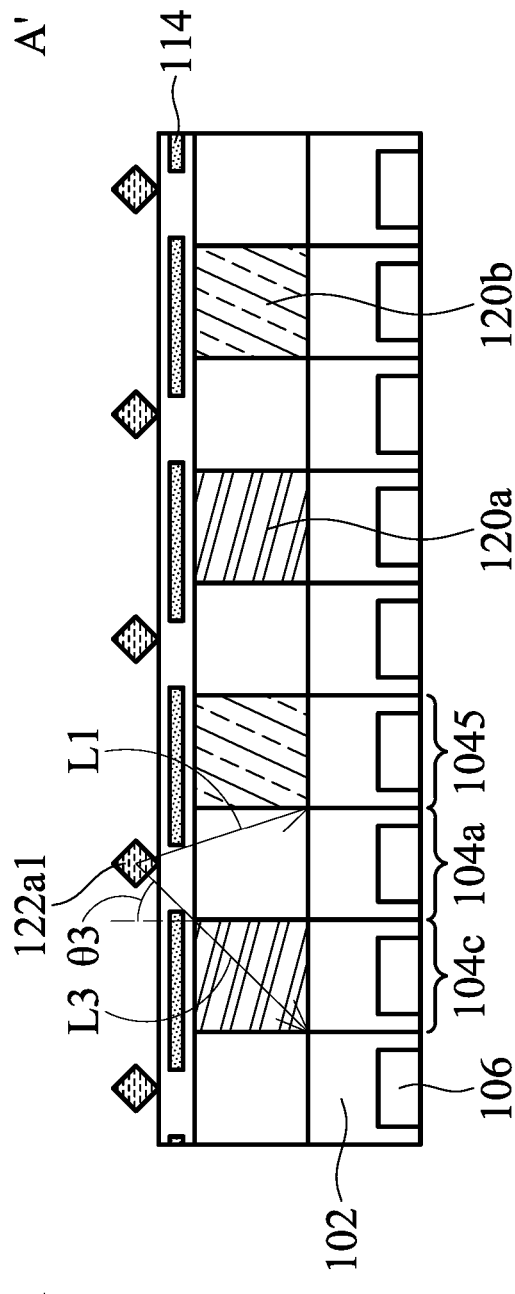
FIGS. 11F-11H illustrate cross-sectional views of the biosensor of FIG. 11E in accordance with some embodiments of the present disclosure.
Figure 11G:
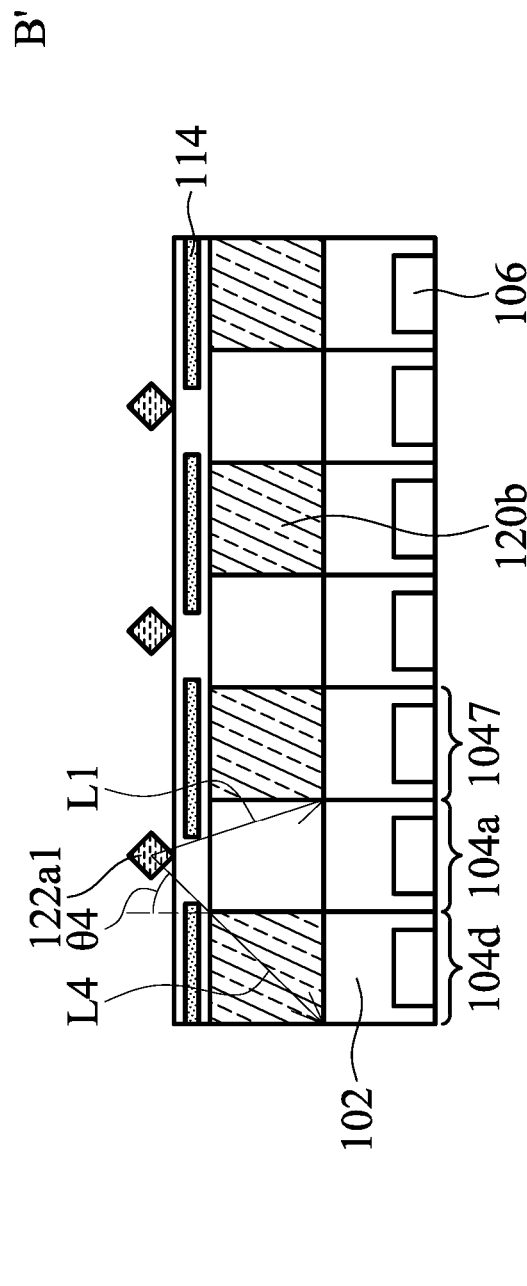
Figure 11H:
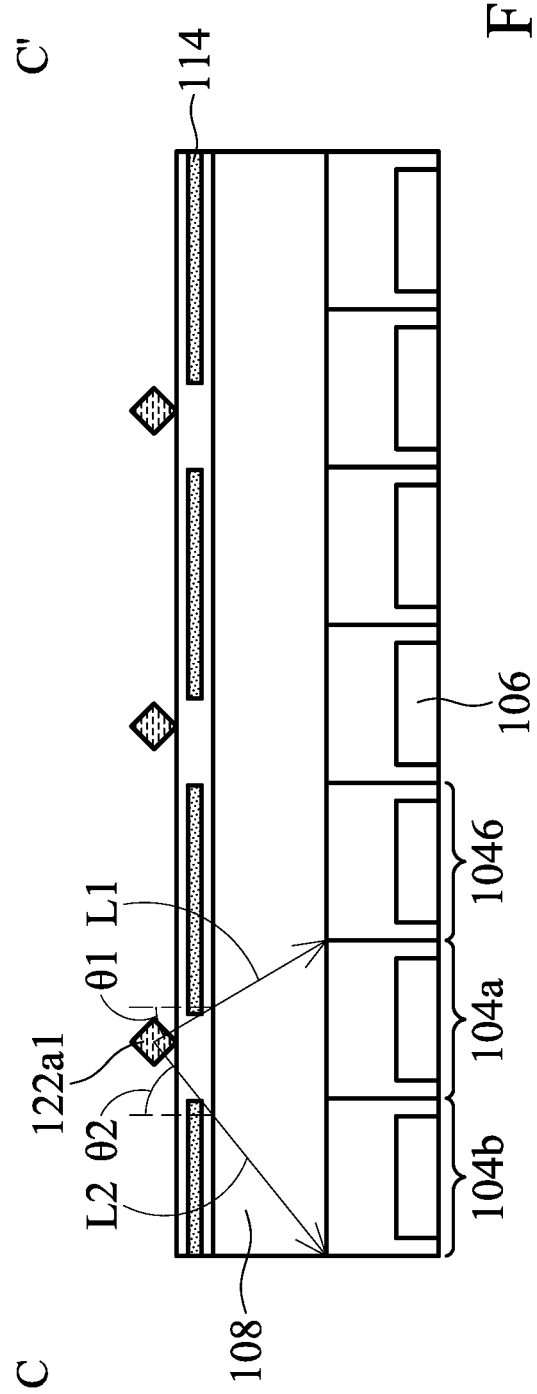
Figure 11K:
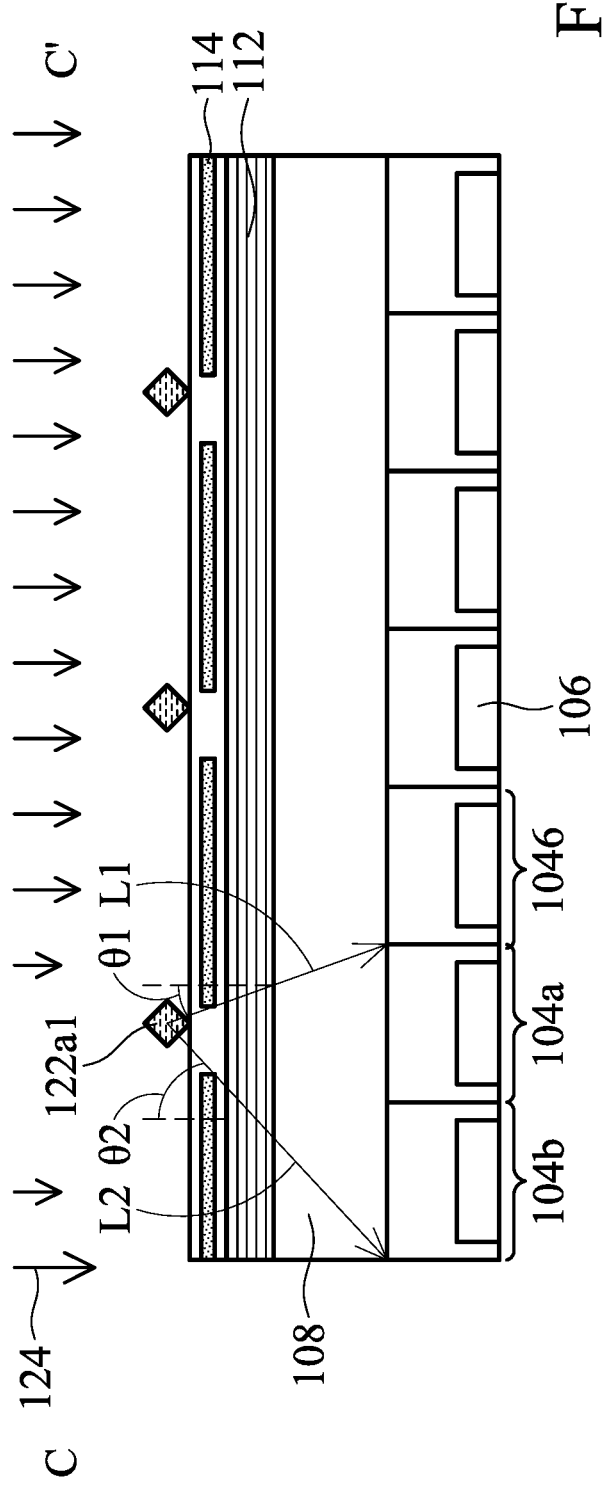

FIG. 11E illustrates a top view of an arrangement of analytes 122a on the biosensor 300 in accordance with some embodiments of the present disclosure. FIGS. 11F and 11I illustrate cross-sectional views of FIG. 11E along line A-A'. FIGS. 11G and 11J illustrate cross-sectional view of FIG. 11E along line B-B'. FIGS. 11H and 11K illustrate cross-sectional views of FIG. 11E along line C-C'. FIGS. 11F-11H represent an example of bioluminescence and FIGS. 11I-11K represent an example of fluorescence. Some of the differences between the embodiments of FIG. 11E and FIG. 11A are that the biosensor 300 includes the aperture structure 114 and that the analytes 122a emit the light L at the same time.

As illustrated in FIG. 11E, the aperture structure 114 includes openings that correspond to one analyte 122a, so that the light L can be further controlled to irradiate only certain areas of the substrate 102.

To be specific, referring to FIG. 11F, the aperture structure 114 prevents the light L emitted by the analyte 122a1 from reaching the pixel 1045. Referring to FIG. 11G, the aperture structure 114 prevents the light L emitted by the analyte 122a1 from reaching the pixel 1047. Referring to FIG. 11H, the aperture structure 114 prevents the light L emitted by the analyte 122a1 from reaching the pixel 1046. Therefore, cross-talk can be avoided. Therefore, the analytes 122a may be placed on the biosensor 300 at one-pixel intervals to avoid cross-talk. In other words, any two adjacent analytes 122a are spaced apart from each other by one pixel 104.

In some embodiments, from the top view of FIG. 11E, the openings may be shapes like a rectangle, a circle, or a triangle, but they are not limited thereto.

Referring to FIGS. 11I-11K, the difference between the embodiments of FIGS. 11I-11K and 11F-11H is that the biosensor 300 further includes the excitation light rejection filter 112.

Although the biosensors 300 of FIGS. 11F-11H and FIGS. 11I-11K include the aperture structure 114, it should be understood that the same concept as recited in the embodiment of FIGS. 11A-11D can also be applied to the embodiments of FIGS. 11F-11H and FIGS. 11I-11K, which will not be repeated for the sake of brevity.

Figure 11L:
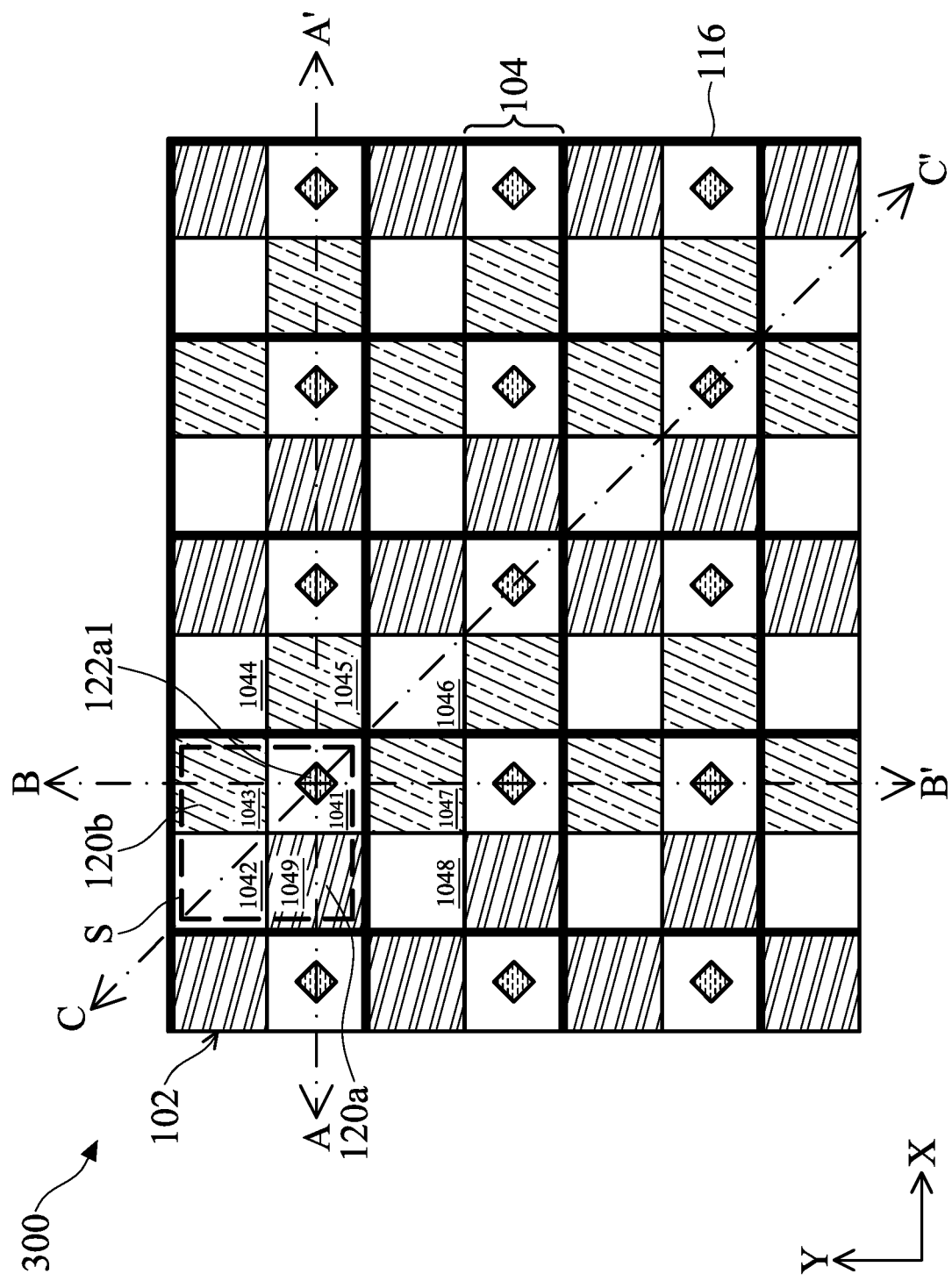
FIG. 11L illustrates a top view of a biosensor in accordance with some embodiments of the present disclosure.
Figure 11M:
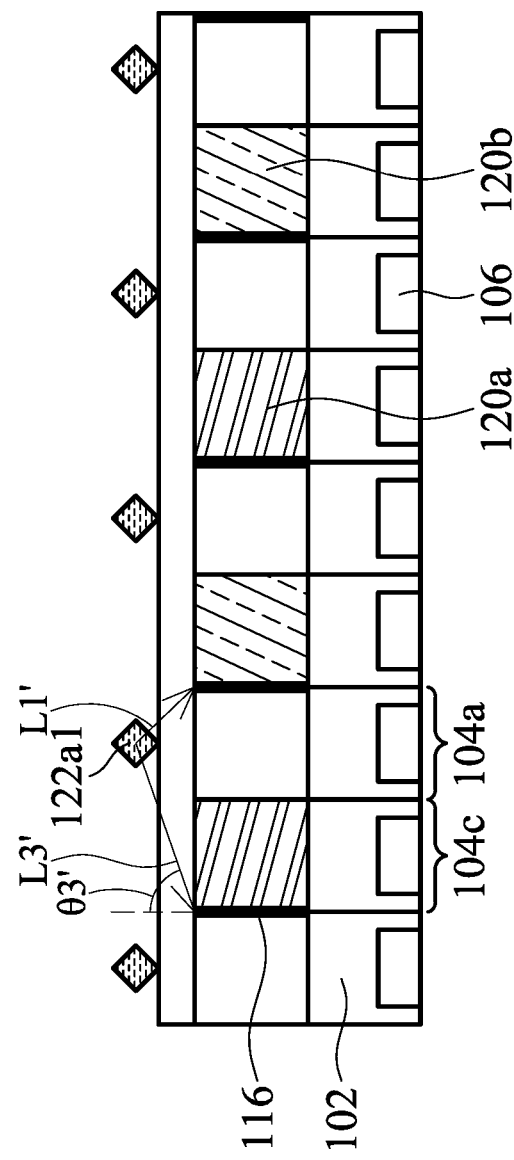
FIGS. 11M-11O illustrate cross-sectional views of the biosensor of FIG. 11L in accordance with some embodiments of the present disclosure.
Figure 11N:
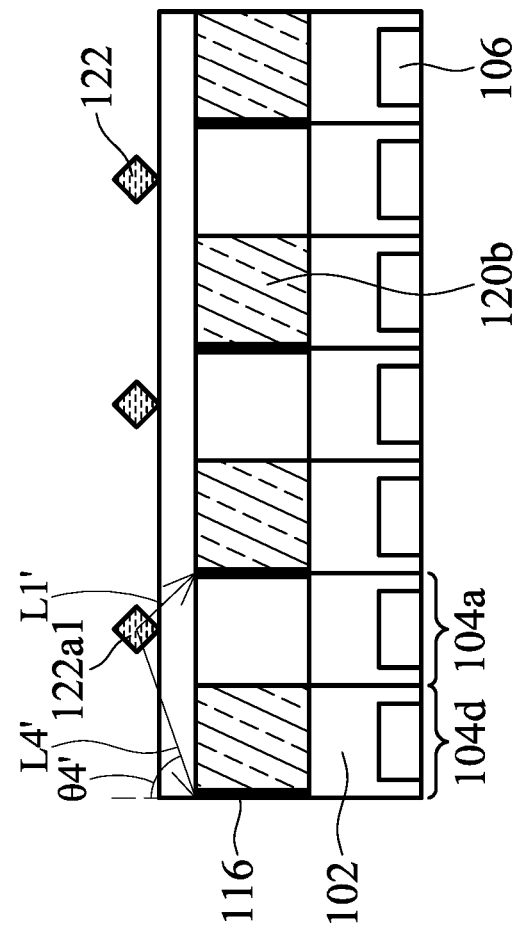
Figure 11O:
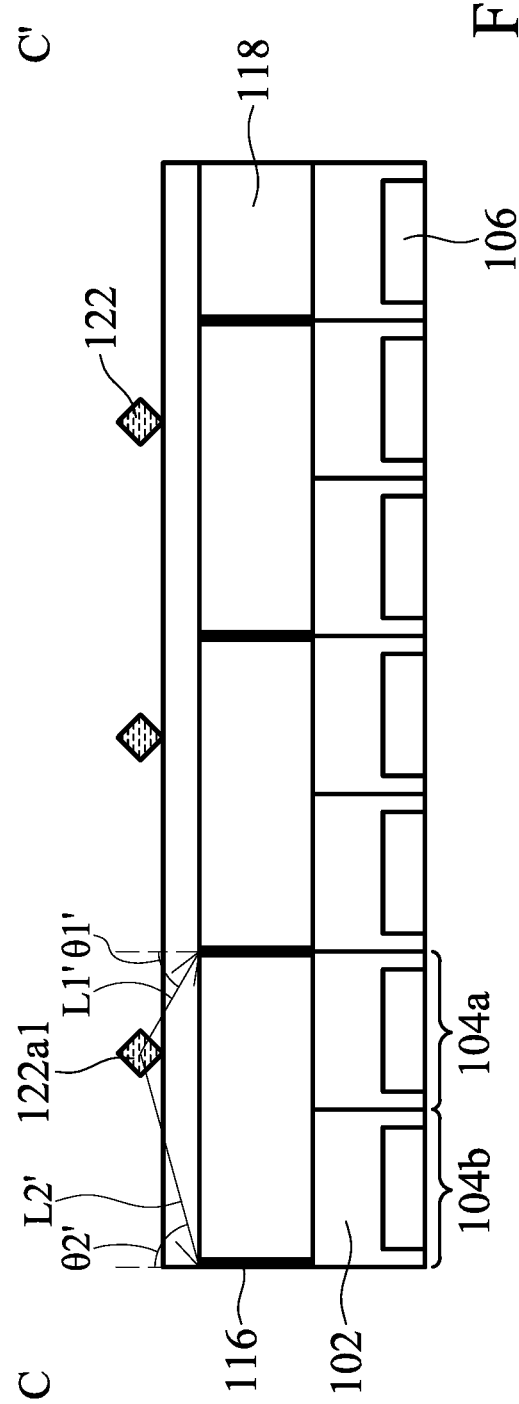
Figure 11P:
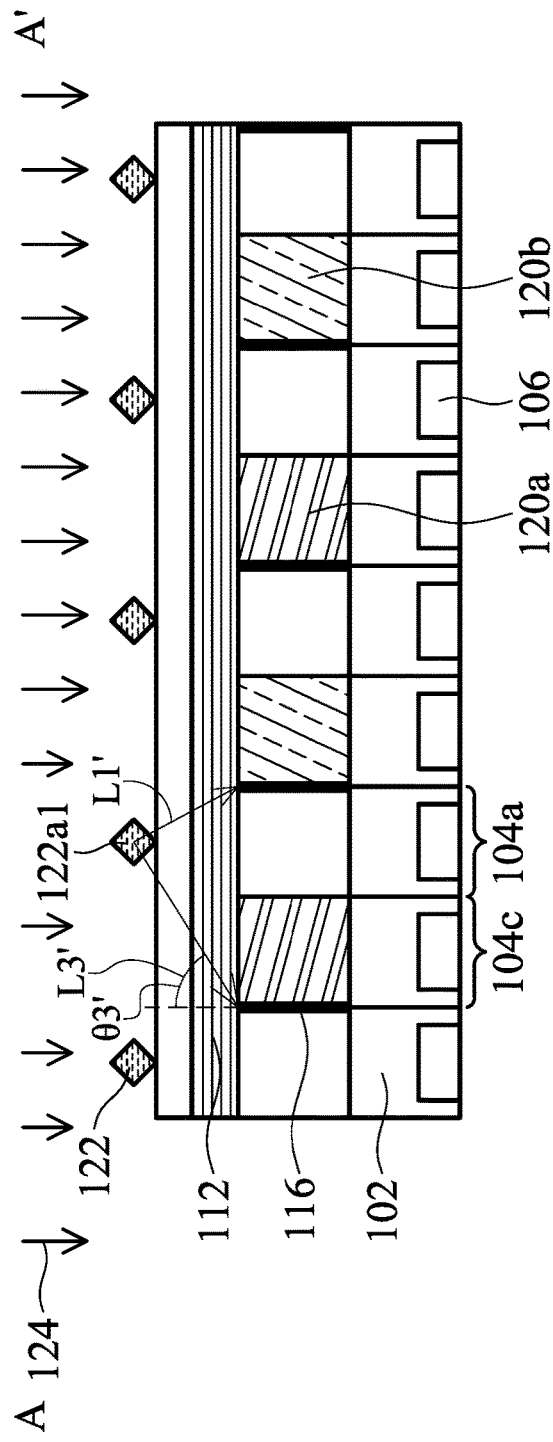
FIGS. 11P-11R illustrate cross-sectional views of the biosensor of FIG. 11L in accordance with other embodiments of the present disclosure.
Figure 11Q:
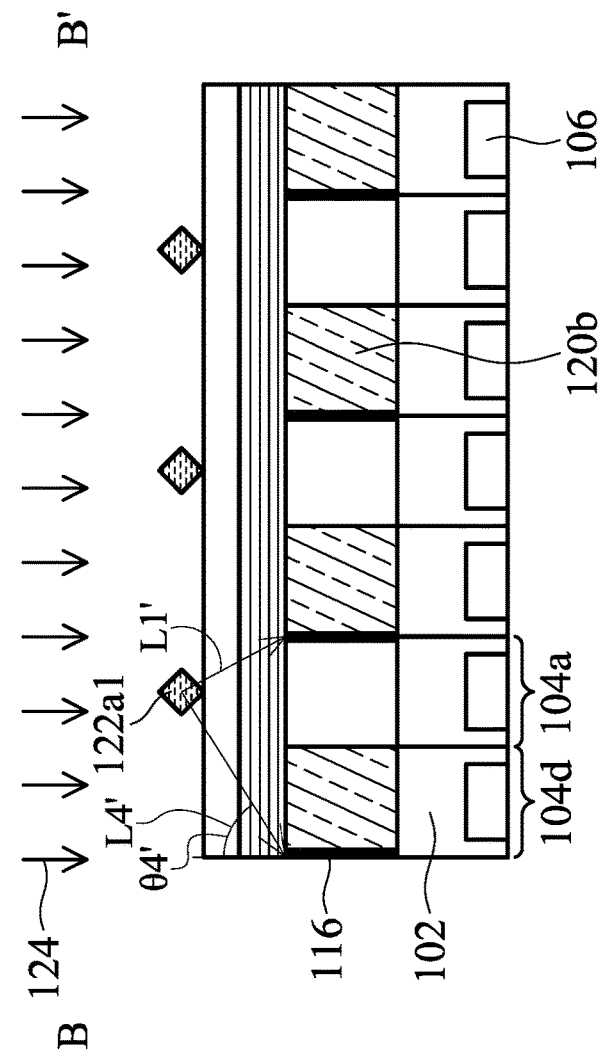
Figure 11R:
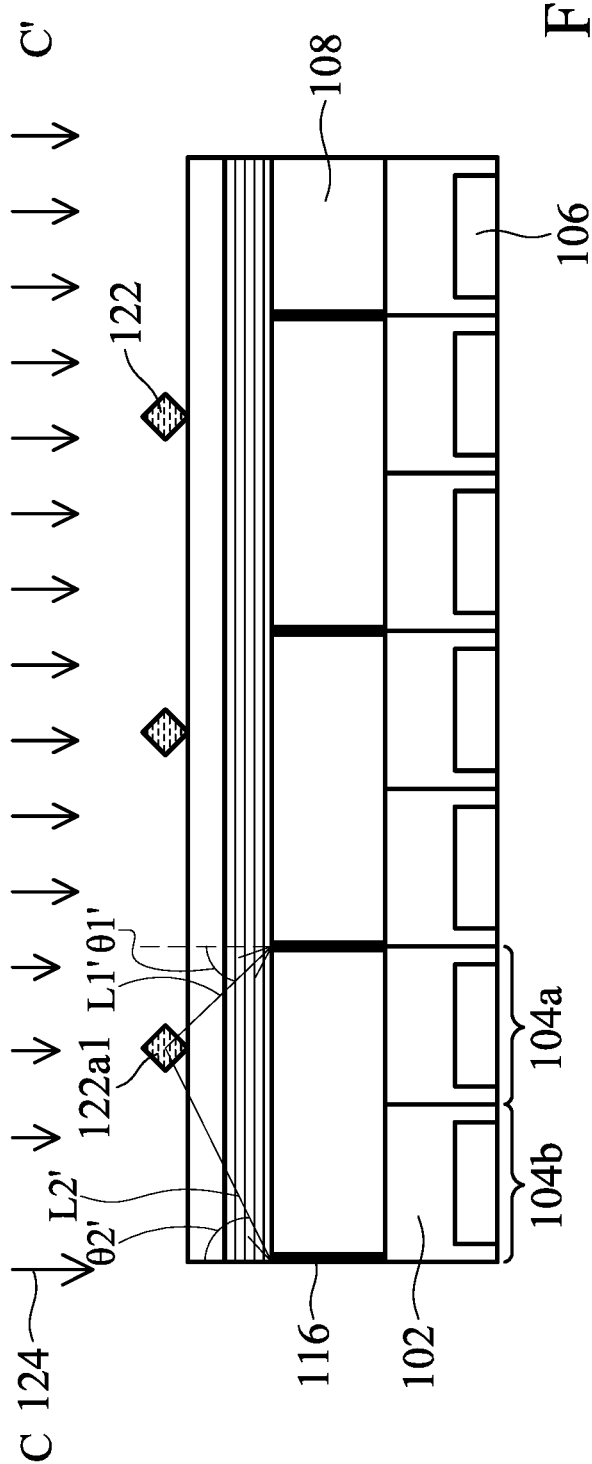

FIG. 11L illustrates a top view of an arrangement of analytes 122a on the biosensor 300 in accordance with some embodiments of the present disclosure. FIGS. 11M and 11P illustrate cross-sectional views of FIG. 11L along line A-A'. FIGS. 11N and 11Q illustrate cross-sectional view of FIG. 11L along line B-B'. FIGS. 11O and 11R illustrate cross-sectional views of FIG. 11L along line C-C'. FIGS. 11M-11O represent an example of bioluminescence and FIGS. 11P-11R represent an example of fluorescence. Some of the differences between the embodiments of FIG. 11L and FIG. 11A are that the biosensor 300 includes the shielding layer 116 and that the analytes 122a emit the light L at the same time.

Since the shielding layer 116 can reflect the light L, the first pixel 104a may receive the first portion L1' of the light L that enters the angle-sensitive filter 108 at a first incident angle θ1' (as shown in FIGS. 11O and 11R) greater than the first incident angle θ1 of the embodiments in FIGS. 11A-11K. The second pixel 104b may also receive the second portion L2' of the light L that enters the angle-sensitive filter 108 at a second incident angle θ2' (as shown in FIGS. 11O and 11R) greater than the second incident angle θ2 of the embodiments in FIGS. 11A-11K. The third pixel 104c may also receive the third portion L3' of the light L that enters the first color filter 120a at a third incident angle θ3' (as shown in FIGS. 11M and 11P) greater than the third incident angle θ3 of the embodiments in FIGS. 11A-11K. The fourth pixel 104d may also receive the fourth portion L4' of the light L that enters the second color filter 120d at a fourth incident angle θ4' (as shown in FIGS. 11N and 11Q) greater than the third incident angle θ4 of the embodiments in FIGS. 11A-11K. For example, the first incident angle θ1' may be from 0 degrees to 60 degrees. The second incident angle θ2' may be from 40 degrees to 85 degrees. The third incident angle θ3' may be from 40 degrees to 85 degrees. The fourth incident angle θ4' may be from 40 degrees to 85 degrees. However, it should be appreciated that the first incident angle θ1', the second incident angle θ2', the third incident angle θ3' and the fourth incident angle θ4' are determined according to the heights of the analyte, shielding layer and photodiode.

Figure 12A:
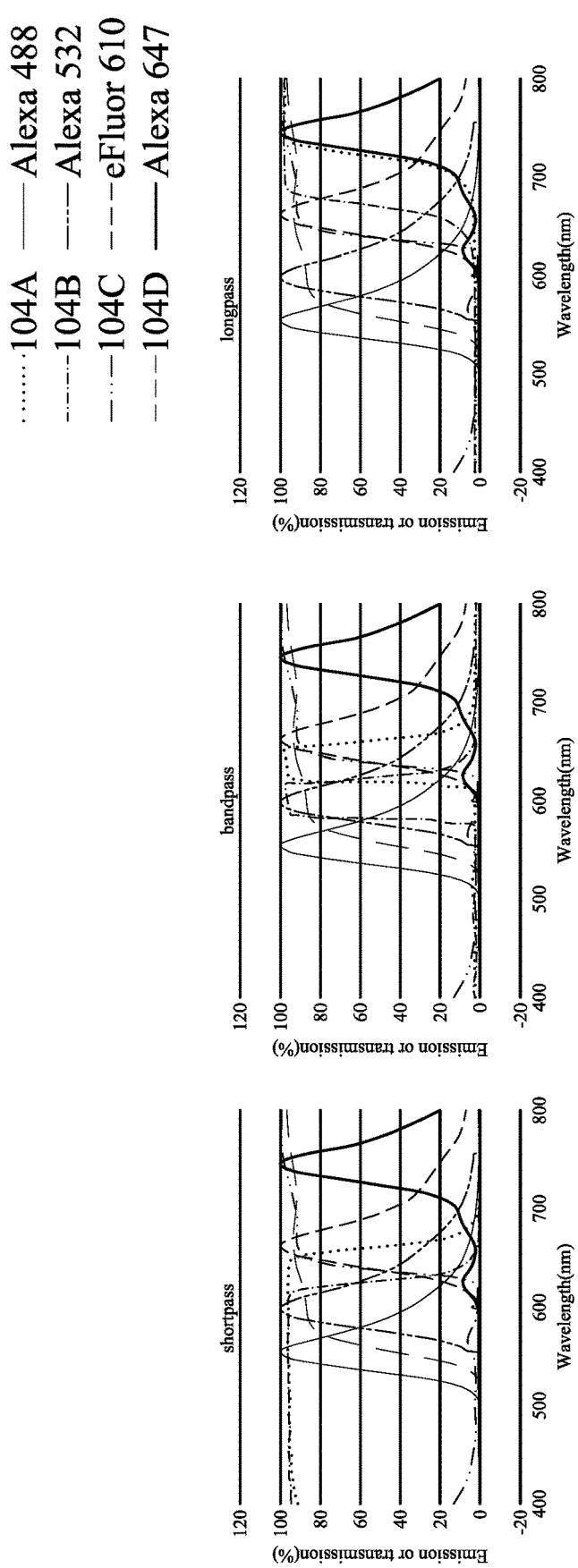
FIG. 12A are analytical graphs of emission or transmission versus wavelength in accordance with some embodiments of the present disclosure.

FIG. 12A is analytical graphs of emission or transmission versus wavelength in accordance with some embodiments of the present disclosure. 104A represents the wavelength of the light that enters the angle-sensitive filter 108 at the first incident angle θ1 or θ1' and is received by the first pixel

104a. 104B represents the wavelength of the light that enters the angle-sensitive filter 108 at the second incident angle θ2 or θ2' and is received by the second pixel 104b. 104C represents the wavelength of the light that enters the first color filter at the third incident angle θ3 or θ3' and is received by the third pixel 104c. 104D represents the wavelength of the light that enters the second color filter at the fourth incident angle θ4 or θ4'. Alexa 488, Alexa 532, eFluor 610 and Alexa 647 are four dyes that emit four different lights. A first signal intensity of the first portion L1 or L1' of the light L is obtained from the first pixel 104a. A second signal intensity of the second portion L2 or L2' of the light L is obtained from the second pixel 104b. A third signal intensity of the third portion L3 or L3' of the light L is obtained from the third pixel 104c. A fourth signal intensity of the fourth portion L4 or L4' of the light L is obtained from the fourth pixel 104d. The overlapping area between the area under curve (AUC) of 104A and the AUC of Alexa 488 represents the first signal intensity of Alexa 488, the overlapping area between the AUC of 104B and the AUC of Alexa 488 represents the second signal intensity of Alexa 488, the overlapping area between the AUC of 104C and the AUC of Alexa 488 represents the third signal intensity of Alexa 488 and the overlapping area between the AUC of 104D and the AUC of Alexa 488 represents the fourth signal intensity of Alexa 488. For the same concept, Alexa 532, eFluor 610 and Alexa 647 have first signal intensities, second signal intensities, third signal intensities and fourth signal intensity.

For the same concept as described previously, the signal intensities can be defined as Pass or No. Table 6 below is made according to the concept described above and in FIG. 12A, in which the first signal intensity is denoted by 104a, the second signal intensity is denoted by 104b, the third signal intensity is denoted by 104c, and the fourth signal intensity is denoted by 104d.

TABLE 6

| angle-sensitive filter | dye | 104a | 104b | 104c | 104d |
|---|---|---|---|---|---|
| shortpass | Alexa 488 | Pass | Pass | No | Pass |
|  | Alexa 532 | Pass | Pass | Pass | Pass |
|  | eFluor 610 | Pass | No | Pass | Pass |
|  | Alexa 647 | No | No | Pass | Pass |
| bandpass | Alexa 488 | No | Pass | No | Pass |
|  | Alexa 532 | Pass | Pass | Pass | Pass |
|  | eFluor 610 | Pass | No | Pass | Pass |
|  | Alexa 647 | No | No | Pass | Pass |
| longpass | Alexa 488 | No | No | No | Pass |
|  | Alexa 532 | No | No | Pass | Pass |
|  | eFluor 610 | No | Pass | Pass | Pass |
|  | Alexa 647 | Pass | Pass | Pass | Pass |

According to a combination of the definitions of the first signal intensity, the second signal intensity, the third signal intensity and the fourth signal intensity, the four dyes can be distinguished as previously described.

Although there are only four dyes in the embodiments, since there are sixteen combinations of definitions of the first signal intensity, the second signal intensity, the third signal intensity and the fourth signal intensity, it should be understood that at most sixteen dyes can be distinguished.

Alternatively, first signal intensity ratios of the first signal intensity to the fourth signal intensity (denoted by 104a/104d), second signal intensity ratios of the second signal intensity to the fourth signal intensity (denoted by 104b/104d) and third signal intensity ratios of the third signal intensity to the fourth signal intensity (denoted by 104c/104d) can also be calculated to distinguish the four different dyes, namely four different lights. A cluster distribution graph is plotted according to the first signal intensity ratio, the second signal intensity ratio and the third signal intensity ratio. To be specific, a cluster distribution graph of the first signal intensity ratio vs. the second signal intensity ratio vs. the third signal intensity ratio is plotted.

Figure 12B:
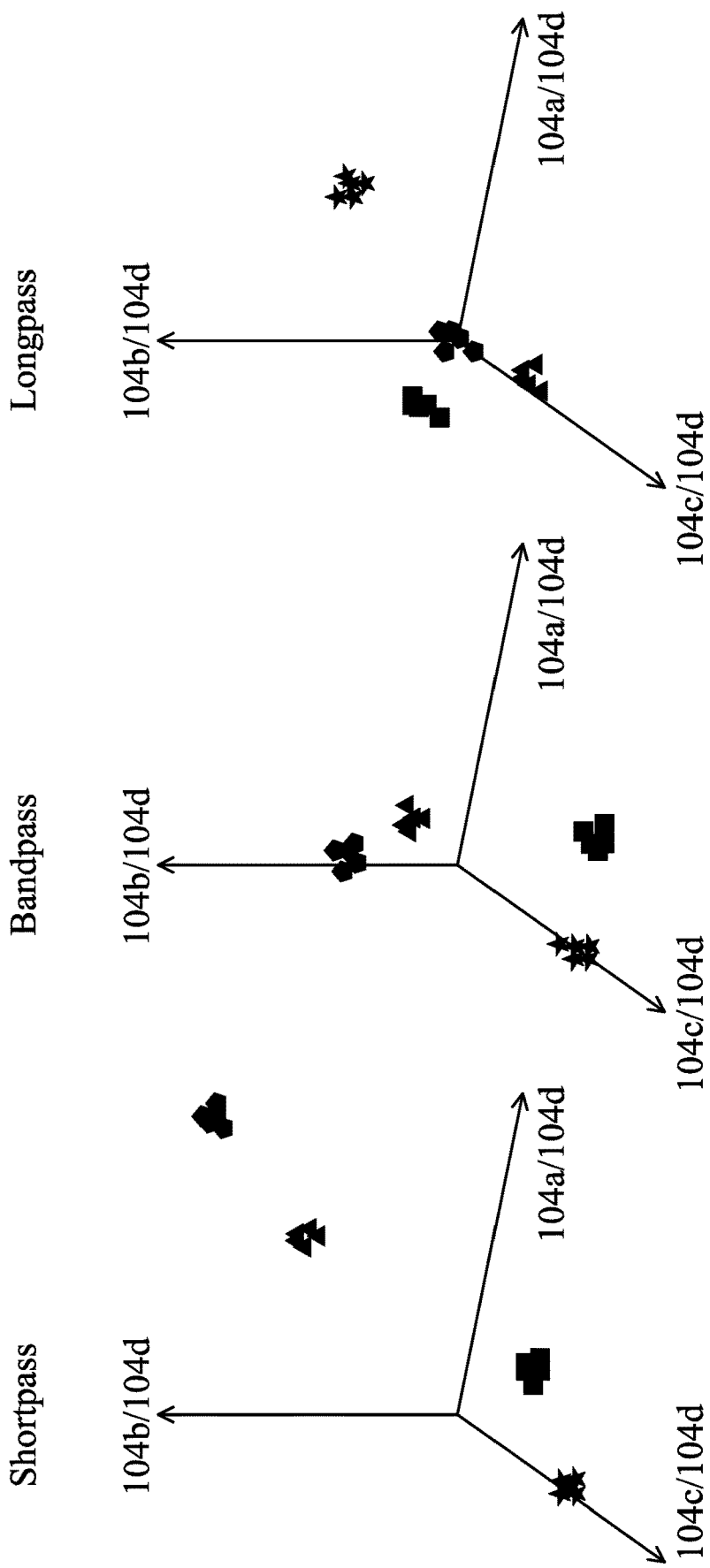
FIG. 12B is an analytical graph of three ratios versus one another in accordance with some embodiments of the present disclosure.

For example, FIG. 12B is analytical graphs of the first signal intensity ratio vs. the second signal intensity ratio vs. the third signal intensity ratio plotted in accordance with some embodiments of the present disclosure. The X-axis represents the first signal intensity ratio. The Y-axis represents the third signal intensity ratio. The Z-axis represents the second signal intensity ratio. Alexa 488 is represented by a pentagon. Alexa 532 is represented by triangle. eFluor 610 is represented by square. Alexa 647 is represented by a star.

In the embodiment where the angle-sensitive filter is a shortpass filter, the data points of Alexa 488, Alexa 532, eFluor 610 and Alexa 647 are clustered at different positions in the graph, respectively. As a result, a dye can be distinguished depending on where the dye is located in the cluster distribution plot.

In the embodiment where the angle-sensitive filter is a bandpass filter, the data points of Alexa 488, Alexa 532, eFluor 610 and Alexa 647 are clustered at different positions in the graph, respectively. As a result, a dye can be distinguished depending on where the dye is located in the cluster distribution plot.

In the embodiment where the angle-sensitive filter is a longpass filter, the data points of Alexa 488, Alexa 532, eFluor 610 and Alexa 647 are clustered at different positions in the graph, respectively. As a result, a dye can be distinguished depending on where the dye is located in the cluster distribution plot.

Although there are only four dyes in the embodiments, it should be understood that more than four dyes can be distinguished.

Although the embodiments of the analyte 122b are not illustrated in the drawings, it can be appreciated that the analyte 122b can also be placed on the biosensor provided by the embodiments of the present application.

To sum up, the advantages of the biosensors and the methods of distinguishing a light which are provided by the embodiments of the present disclosure at least include:

(1) The property of spectrum shift caused by the angle-sensitive filter, which is considered a drawback in prior art, is utilized in the present biosensor to distinguish different lights.

(2) By disposing the waveguide, the aperture structure or the shielding layer, cross-talk can be better avoided.

(3) Since the first color filter and the second color filter may have areas equal to or smaller than that of one pixel, the organic filter material may be fully embedded in the surrounding angle-sensitive filter to provide a robust chemical and mechanical resistance. Moreover, the shrinked size of the organic filter may ensure the emission light from a biosample passing through the angle-sensitive filter to the diagonal photodiode without the discontinuity due to the first and second color filters.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and operations described in the specification. As one of ordinary skill in the art will readily appreciate from the disclosure of the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A biosensor, comprising:
   a substrate;
   a first photodiode and a second photodiode disposed in the substrate and defining a first pixel and a second pixel, respectively, wherein the first pixel and the second pixel receive a light emitted from an analyte that is immobilized above and corresponds to the first pixel;
   an angle-sensitive filter disposed on the substrate and configured to cause spectrum shift in the light, wherein the biosensor is configured to distinguish different portions of the light emitted from the analyte by a property of the spectrum shift caused by the angle-sensitive filter;
   an excitation light rejection filter disposed on the angle-sensitive filter; and
   an immobilization layer disposed on the excitation light rejection filter and configured to receive the analyte,
   wherein the excitation light rejection filter is a dielectric interference filter with a metal layer, and a thickness of the excitation light rejection filter is 0.1 µm to 2 µm.

2. The biosensor as claimed in claim 1, wherein the first pixel receives a first portion of the light and the second pixel receives a second portion of the light, wherein the first portion enters the angle-sensitive filter at a first incident angle, the second portion enters the angle-sensitive filter at a second incident angle, and the first incident angle is smaller than the second incident angle, and wherein the first incident angle and the second incident angle are angles between incident directions of the first portion and the second portion of the light and a normal line of the angle sensitive filter, respectively.

3. The biosensor as claimed in claim 2, wherein the first incident angle is from 0 degrees to 60 degrees, and the second incident angle is equal to or smaller than 85 degrees.

4. The biosensor as claimed in claim 1, further comprising a waveguide embedded in the immobilization layer.

5. The biosensor as claimed in claim 1, further comprising an aperture structure embedded in the immobilization layer and configured to confine an optical path of the light.

6. The biosensor as claimed in claim 5, further comprising a waveguide on the aperture structure.

7. The biosensor as claimed in claim 1, wherein the angle-sensitive filter is a dielectric interference filter with alternating deposition of high and low refractive indices dielectric materials, a plasmonic filter, or a dielectric metasurface structure.

8. The biosensor as claimed in claim 2, further comprising:
   a third photodiode disposed in the substrate and defining a third pixel; and
   a first color filter disposed adjacent to the angle-sensitive filter and corresponding to the third pixel.

9. The biosensor as claimed in claim 8, further comprising:
   a fourth photodiode disposed in the substrate and defining a fourth pixel; and
   a second color filter disposed adjacent to the angle-sensitive filter and corresponding to the fourth pixel.

10. The biosensor as claimed in claim 2, further comprising a shielding layer surrounding the angle-sensitive filter.

11. The biosensor as claimed in claim 10, wherein the shielding layer comprises a material with high reflective index.

12. The biosensor as claimed in claim 1, wherein the angle-sensitive filter is a shortpass filter, a bandpass filter, a longpass filter, or a multiple bandpass filter.

13. A method of distinguishing a light, comprising:
    placing the analyte on the biosensor according to claim 2;
    making the analyte emit the light;
    obtaining a first signal intensity of the first portion of the light and a second signal intensity of the second portion of the light; and
    distinguishing the light according to the first signal intensity and the second signal intensity.

14. The method as claimed in claim 13, wherein the step of distinguishing the light according to the first signal intensity and the second signal intensity comprises:
    defining the first signal intensity as Pass or No Pass depending on whether the first signal intensity is higher or lower than a first threshold;
    defining the second signal intensity as Pass or No Pass depending on whether the second signal intensity is higher or lower than a second threshold; and
    distinguishing the light according to a combination of the definitions of the first signal intensity and the second signal intensity.

15. The method as claimed in claim 13, wherein the step of distinguishing the light according to the first signal intensity and the second signal intensity comprises:
    calculating a first signal intensity ratio of the second signal intensity to the first signal intensity;
    defining the first signal intensity ratio as H or L depending on whether the ratio is higher than a predetermined ratio or lower than the predetermined ratio; and
    distinguishing the light according to the definition of the first signal intensity ratio.

16. A method of distinguishing a light, comprising:
    placing the analyte on the biosensor according to claim 8, wherein the first color filter is irradiated by a third portion of the light, wherein the third pixel receives the third portion of the light, and the third portion of the light enters the first color filter at a third incident angle that is different from the first incident angle, and wherein the third incident angle is an angle between an incident direction of the third portion of the light and the normal line of the first color filter;
    making the analyte emit the light;
    obtaining a first signal intensity of the first portion of the light, a second signal intensity of the second portion of the light, and a third signal intensity of the third portion of the light; and distinguishing the light according to the first signal intensity, the second signal intensity and the third signal intensity.

17. The method as claimed in claim 16, wherein the step of distinguishing the light according to the first signal intensity, the second signal intensity and the third signal intensity comprises:
   defining the signal intensities as Pass or No Pass depending on whether the signal intensities are higher or lower than thresholds;
   distinguishing the light according to a combination of the definitions of the first signal intensity, the second signal intensity and the third signal intensity.

18. The method as claimed in claim 16, wherein the step of distinguishing the light according to the first signal intensity, the second signal intensity and the third signal intensity comprises:
   calculating a first signal intensity ratio of the first signal intensity to the third signal intensity and a second signal intensity ratio of the second signal intensity to the third signal intensity;
   plotting a cluster distribution graph of the first signal intensity ratio and the second signal intensity ratio; and
   distinguishing the light according to the cluster distribution graph.

\* \* \* \* \*